US010903369B2

(12) United States Patent
Xie et al.

(10) Patent No.: US 10,903,369 B2
(45) Date of Patent: Jan. 26, 2021

(54) TRANSISTOR CHANNEL HAVING VERTICALLY STACKED NANOSHEETS COUPLED BY FIN-SHAPED BRIDGE REGIONS

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Chanro Park, Clifton Park, NY (US); Edward Nowak, Essex Junction, VT (US); Yi Qi, Niskayuna, NY (US); Kangguo Cheng, Schenectady, NY (US); Nicolas Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/286,733

(22) Filed: Feb. 27, 2019

(65) Prior Publication Data

US 2020/0274000 A1    Aug. 27, 2020

(51) Int. Cl.
*H01L 29/786* (2006.01)
*H01L 29/66* (2006.01)
(Continued)

(52) U.S. Cl.
CPC .... *H01L 29/78696* (2013.01); *H01L 21/2251* (2013.01); *H01L 21/3003* (2013.01);
(Continued)

(58) Field of Classification Search
CPC ......... H01L 29/78696; H01L 29/42392; H01L 29/6656; H01L 29/66742; H01L 21/2251; H01L 21/3003; H01L 21/76224
See application file for complete search history.

(56) References Cited

U.S. PATENT DOCUMENTS 5,444,275 A    8/1995   Kugishima et al.
6,060,362 A    5/2000   Rhee
(Continued)

FOREIGN PATENT DOCUMENTS

CN    108369948 A    8/2018
CN    108695230 A    10/2018

OTHER PUBLICATIONS

International Search Report; International Application No. PCT/IB2020/051529; International Filing Date: Feb. 24, 2020; dated May 28, 2020; 9 pages.
(Continued)

*Primary Examiner* — Mark W Tornow
(74) *Attorney, Agent, or Firm* — Cantor Colburn LLP; Joseph Petrokaitis

(57) ABSTRACT

Embodiments of the present invention are directed to techniques for providing an novel field effect transistor (FET) architecture that includes a center fin region and one or more vertically stacked nanosheets. In a non-limiting embodiment of the invention, a non-planar channel region is formed having a first semiconductor layer, a second semiconductor layer, and a fin-shaped bridge layer between the first semiconductor layer and the second semiconductor layer. Forming the non-planar channel region can include forming a nanosheet stack over a substrate, forming a trench by removing a portion of the nanosheet stack, and forming a third semiconductor layer in the trench. Outer surfaces of the first semiconductor layer, the second semiconductor layer,
(Continued)

and the fin-shaped bridge region define an effective channel width of the non-planar channel region.

4 Claims, 42 Drawing Sheets

(51) Int. Cl.
    *H01L 21/30*     (2006.01)
    *H01L 29/423*    (2006.01)
    *H01L 21/225*    (2006.01)
    *H01L 21/762*    (2006.01)

(52) U.S. Cl.
    CPC .. *H01L 21/76224* (2013.01); *H01L 29/42392* (2013.01); *H01L 29/6656* (2013.01); *H01L 29/66742* (2013.01)

(56) References Cited

U.S. PATENT DOCUMENTS

| | | | |
|---|---|---|---|
| 6,846,565 | B2 | 1/2005 | Korgel |
| 6,918,946 | B2 | 7/2005 | Korgel |
| 8,722,472 | B2 | 5/2014 | Chang et al. |
| 8,778,768 | B1 | 7/2014 | Chang et al. |
| 9,287,357 | B2 | 3/2016 | Rodder et al. |
| 9,502,518 | B2 | 11/2016 | Liu et al. |
| 2009/0200613 | A1 | 8/2009 | Uemura et al. |
| 2010/0065887 | A1 | 3/2010 | Goebel et al. |
| 2012/0001171 | A1 | 1/2012 | Atanackovic |
| 2014/0285980 | A1 | 9/2014 | Cappellani et al. |
| 2016/0020305 | A1* | 1/2016 | Obradovic .......... H01L 29/7391 257/39 |
| 2017/0076990 | A1* | 3/2017 | Basker ................ H01L 29/0673 |
| 2017/0207313 | A1 | 7/2017 | Song et al. |
| 2017/0221992 | A1* | 8/2017 | Chang ................ H01L 29/0673 |
| 2017/0263705 | A1* | 9/2017 | Cheng ............... H01L 29/42392 |
| 2017/0330934 | A1* | 11/2017 | Zhang ............... H01L 29/66795 |
| 2017/0365661 | A1 | 12/2017 | Doris et al. |
| 2018/0090624 | A1 | 3/2018 | Cheng et al. |
| 2018/0096899 | A1 | 4/2018 | Beasor et al. |
| 2018/0212035 | A1 | 7/2018 | Cheng et al. |
| 2018/0233572 | A1 | 8/2018 | Cheng et al. |
| 2018/0261670 | A1 | 9/2018 | Yeung et al. |
| 2018/0294331 | A1* | 10/2018 | Cho ..................... H01L 29/0669 |
| 2018/0331232 | A1 | 11/2018 | Frougier et al. |
| 2018/0374761 | A1 | 12/2018 | Guillorn et al. |
| 2018/0374930 | A1 | 12/2018 | Bergendahl et al. |
| 2019/0058052 | A1* | 2/2019 | Frougier ................ B82Y 10/00 |

OTHER PUBLICATIONS

International Search Report and Written Opinion, issued in International Application No. PCT/IB2020/051528 dated Jun. 11, 2020; 9 pages.

\* cited by examiner

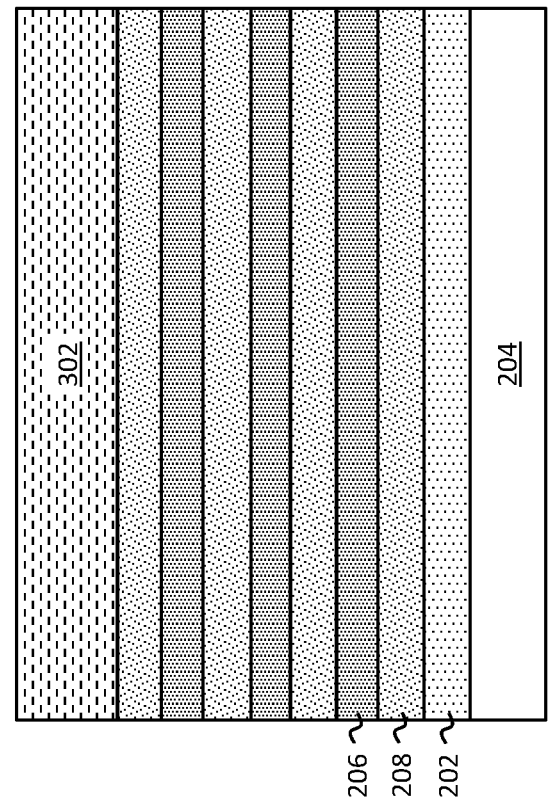
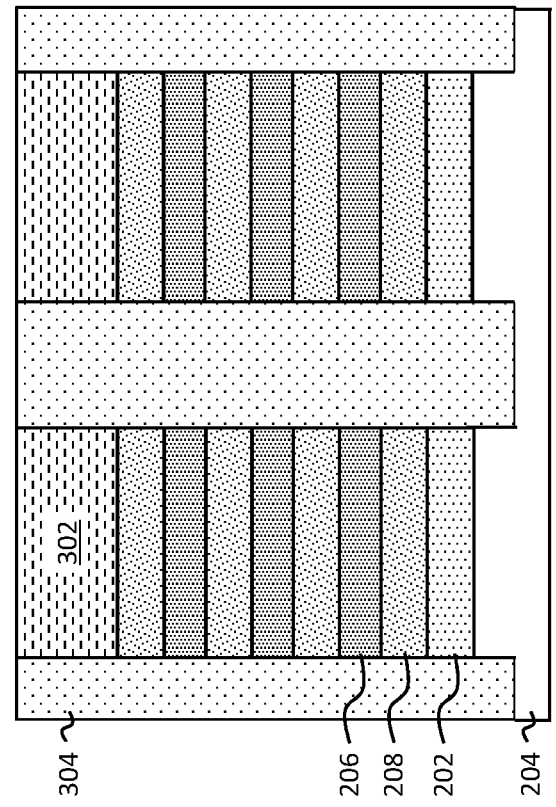

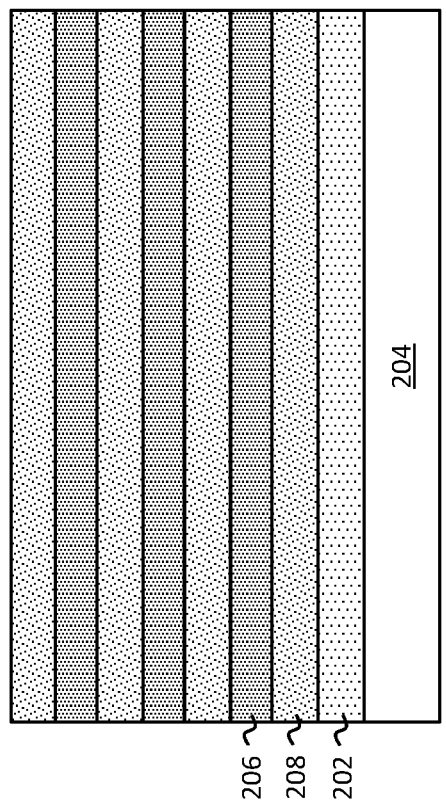
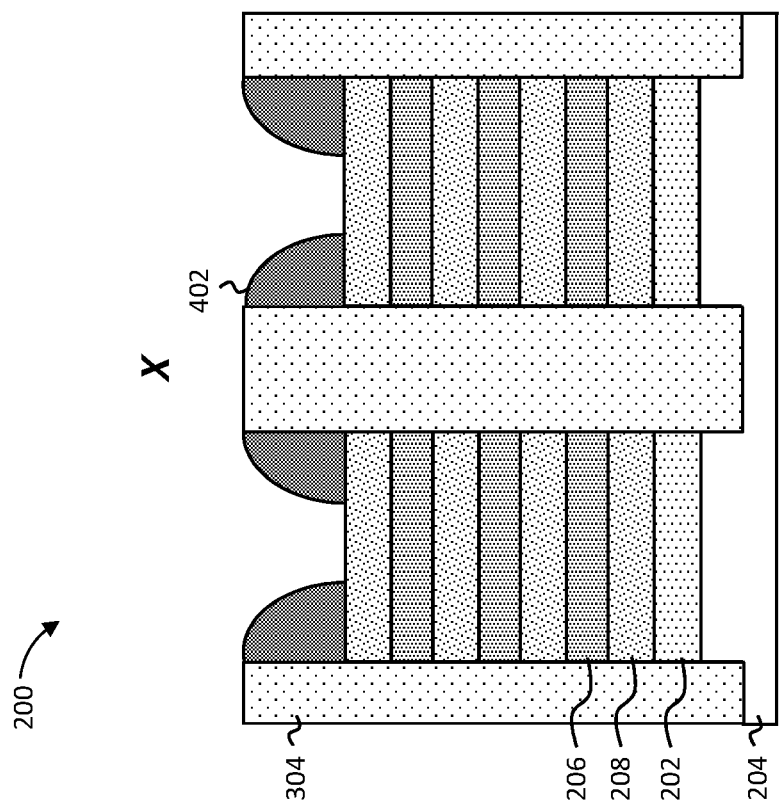
Fig. 4B
Fig. 4A

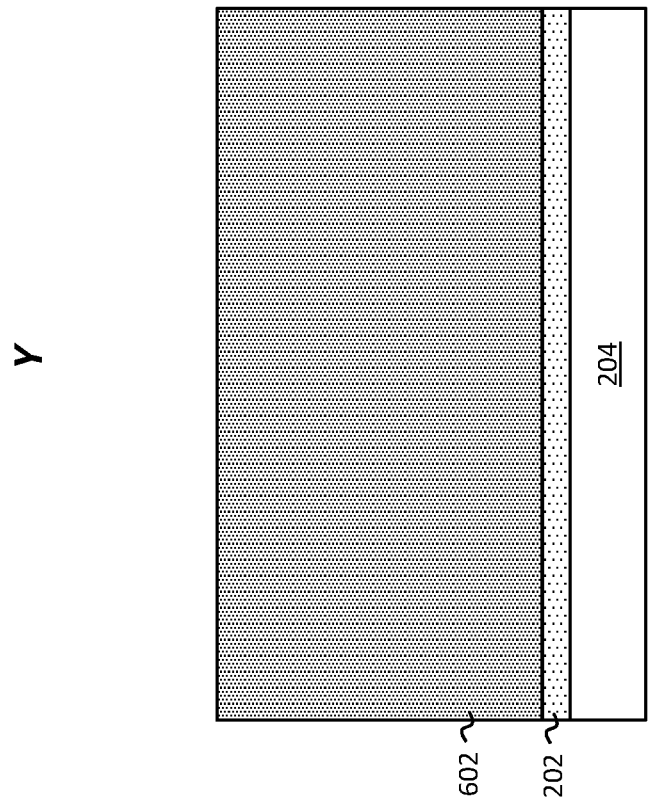
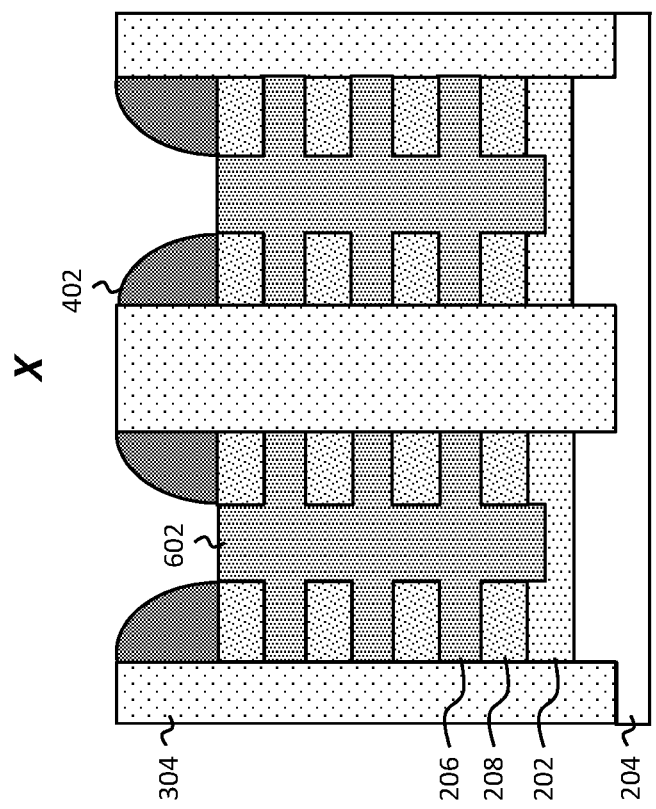

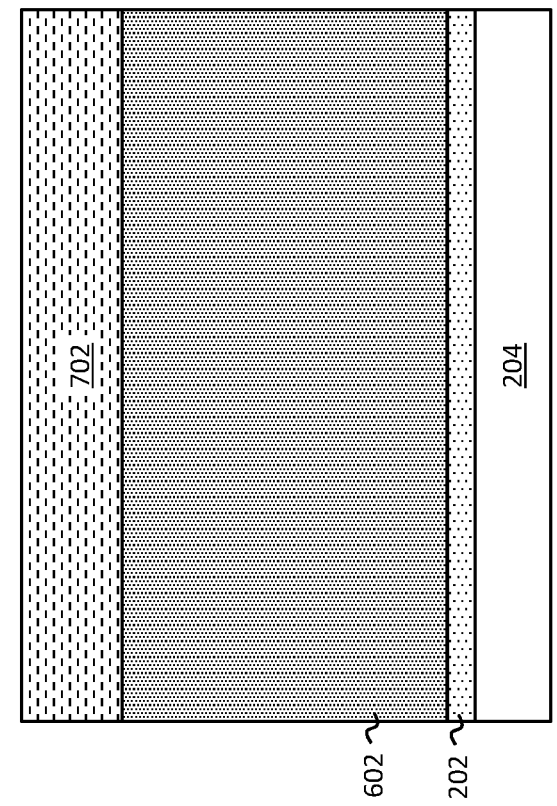
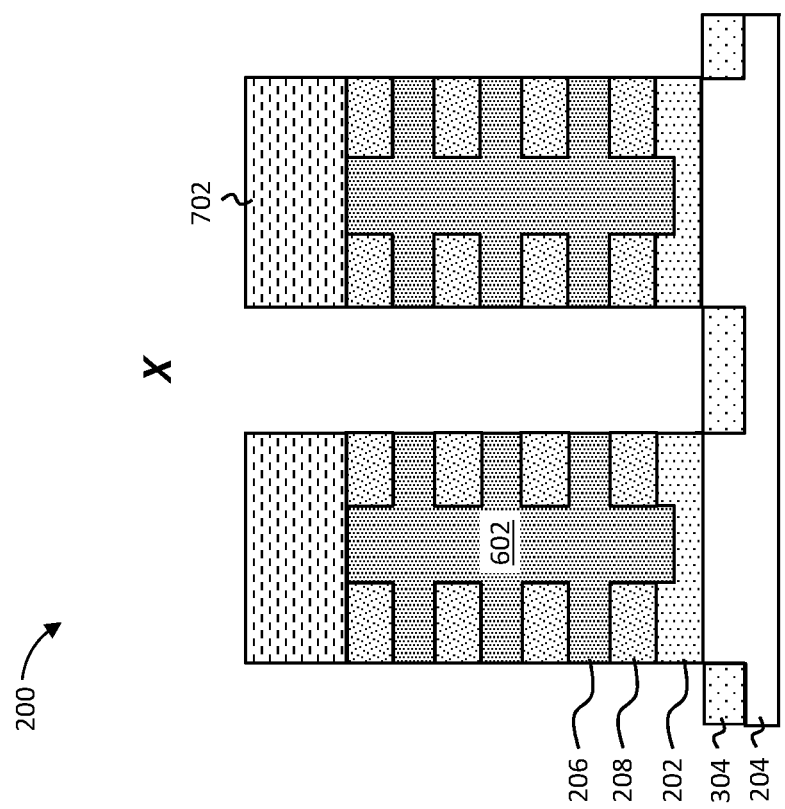

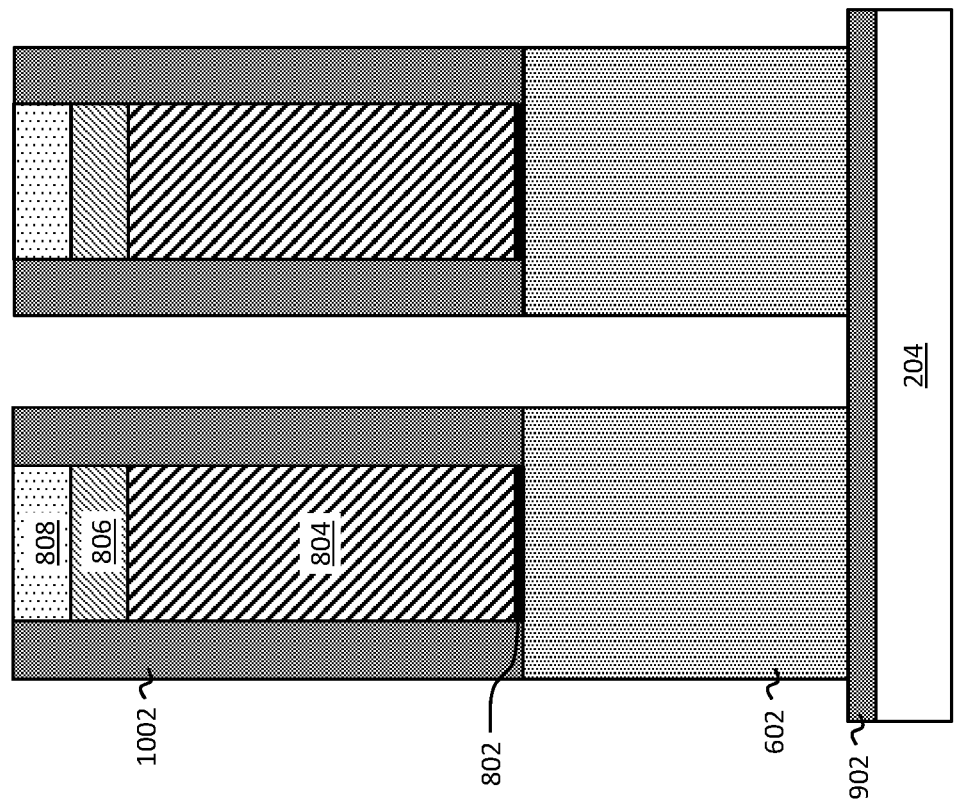
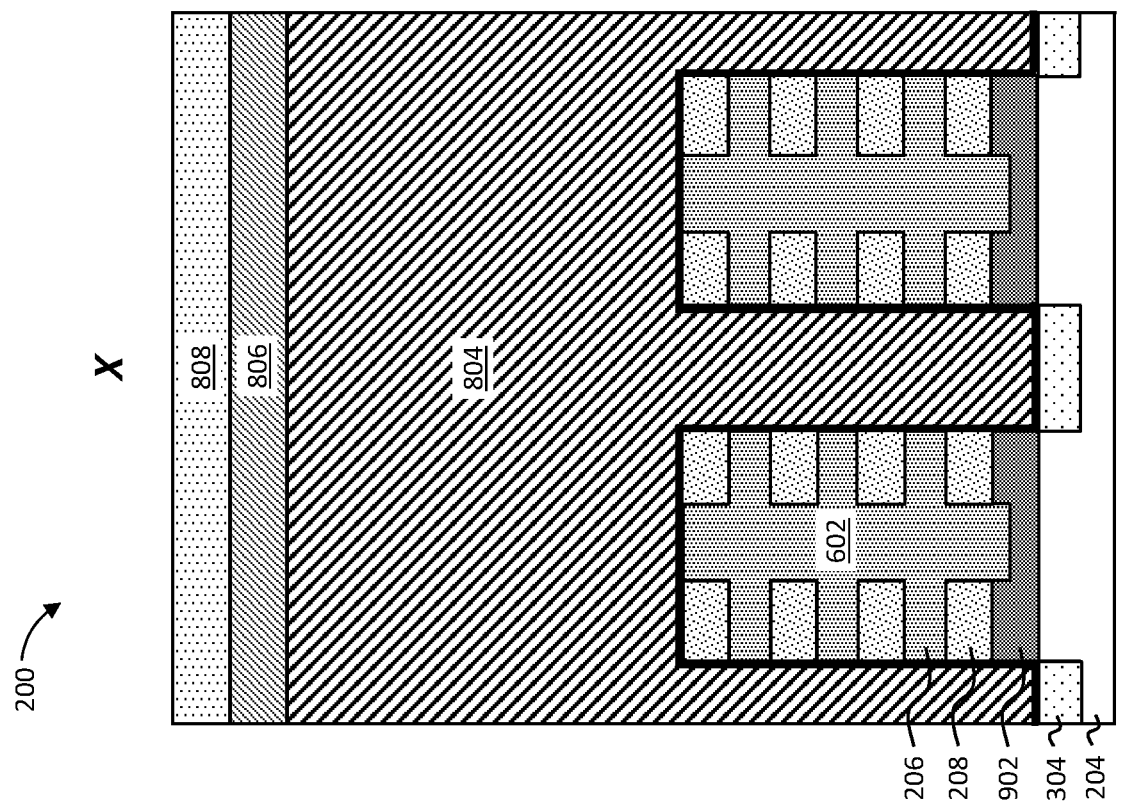
Fig. 10B
Fig. 10A

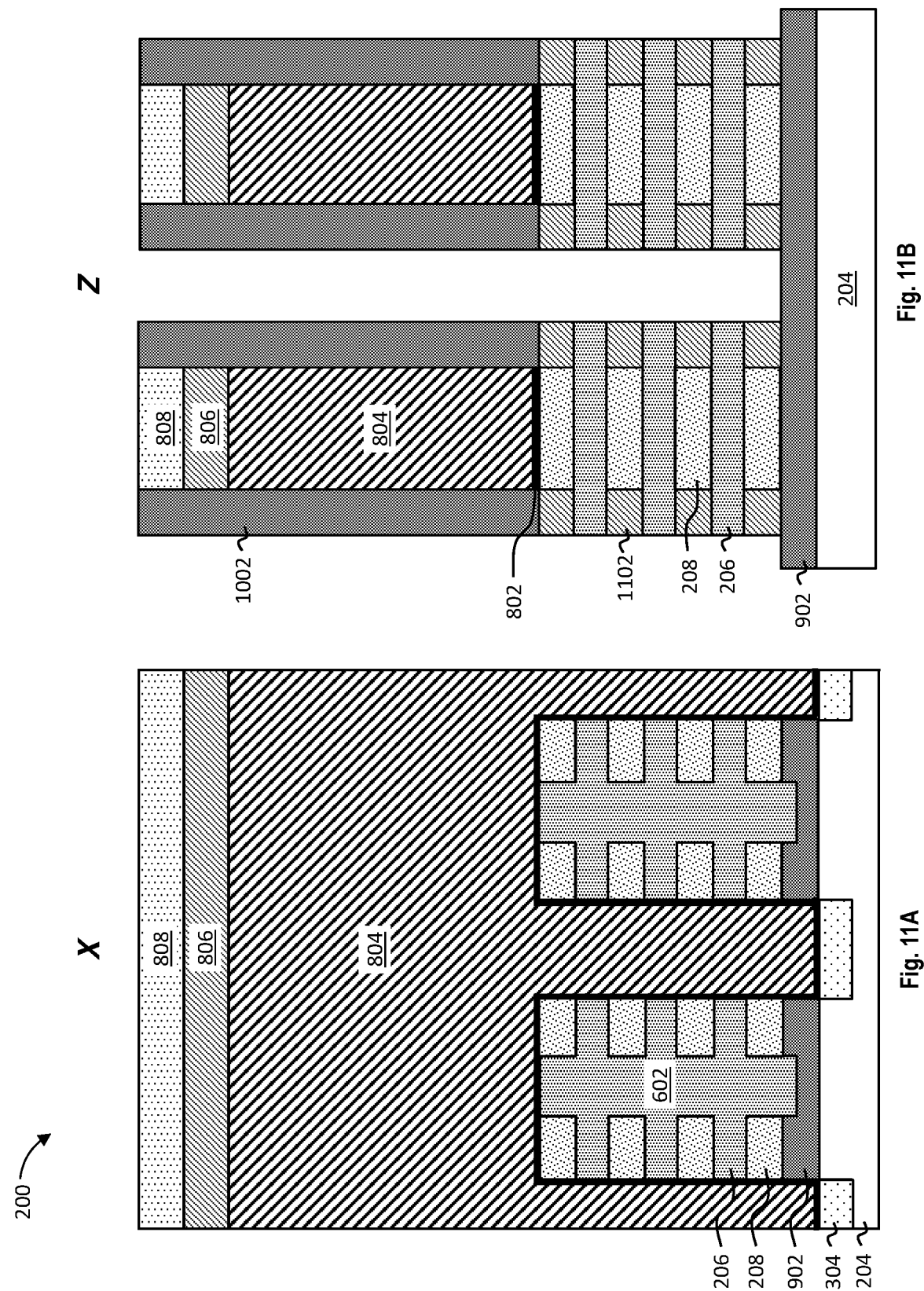

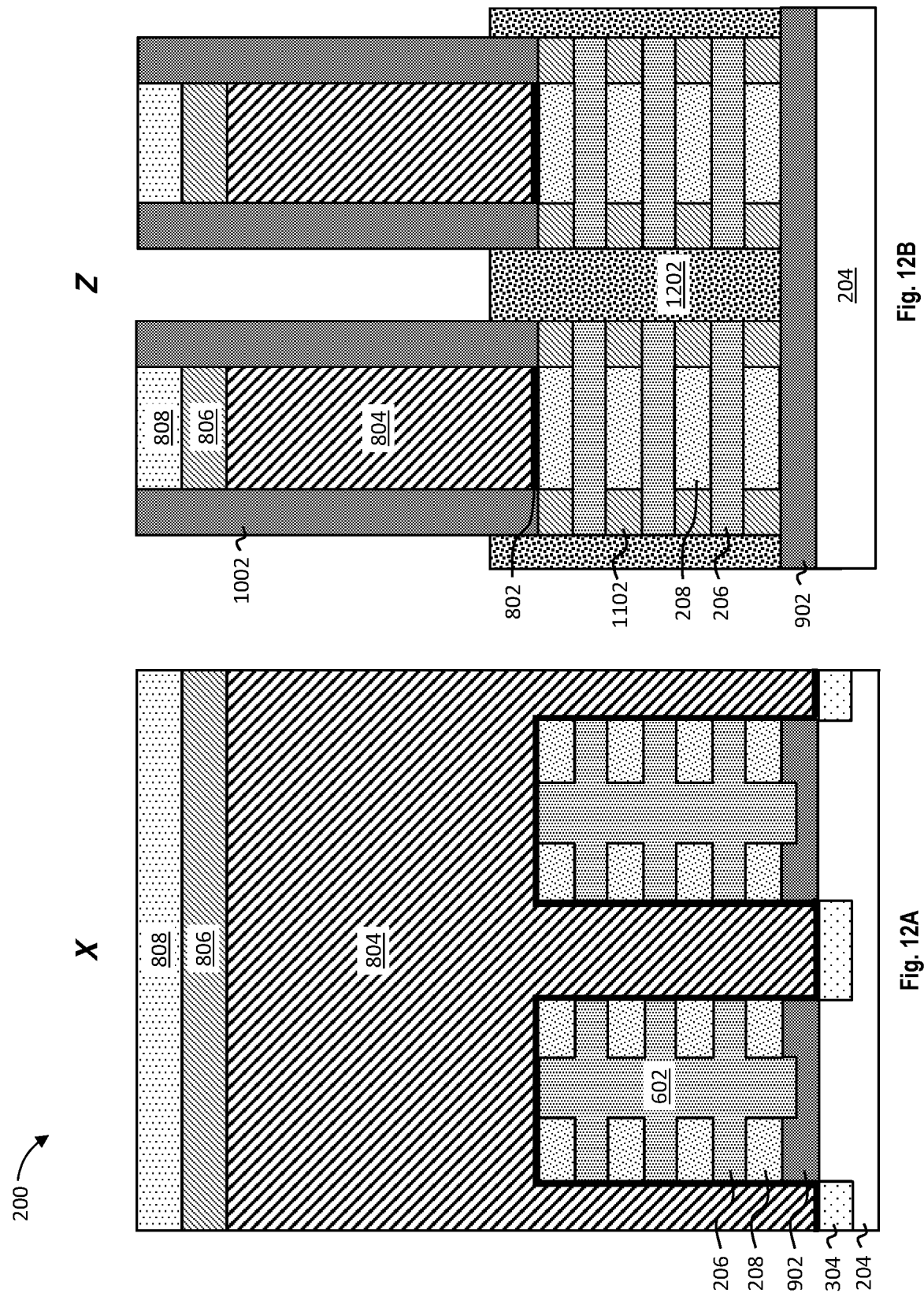

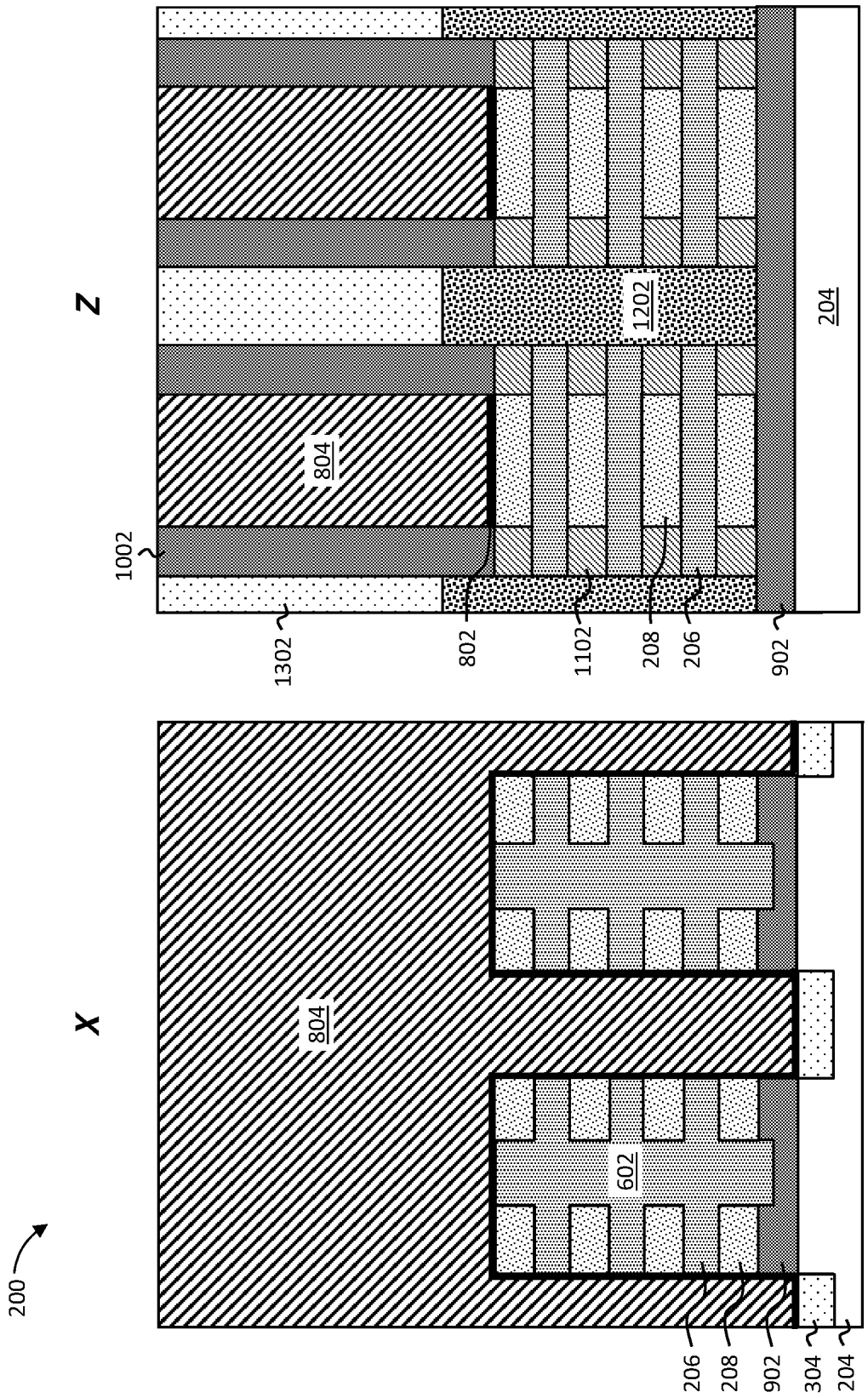

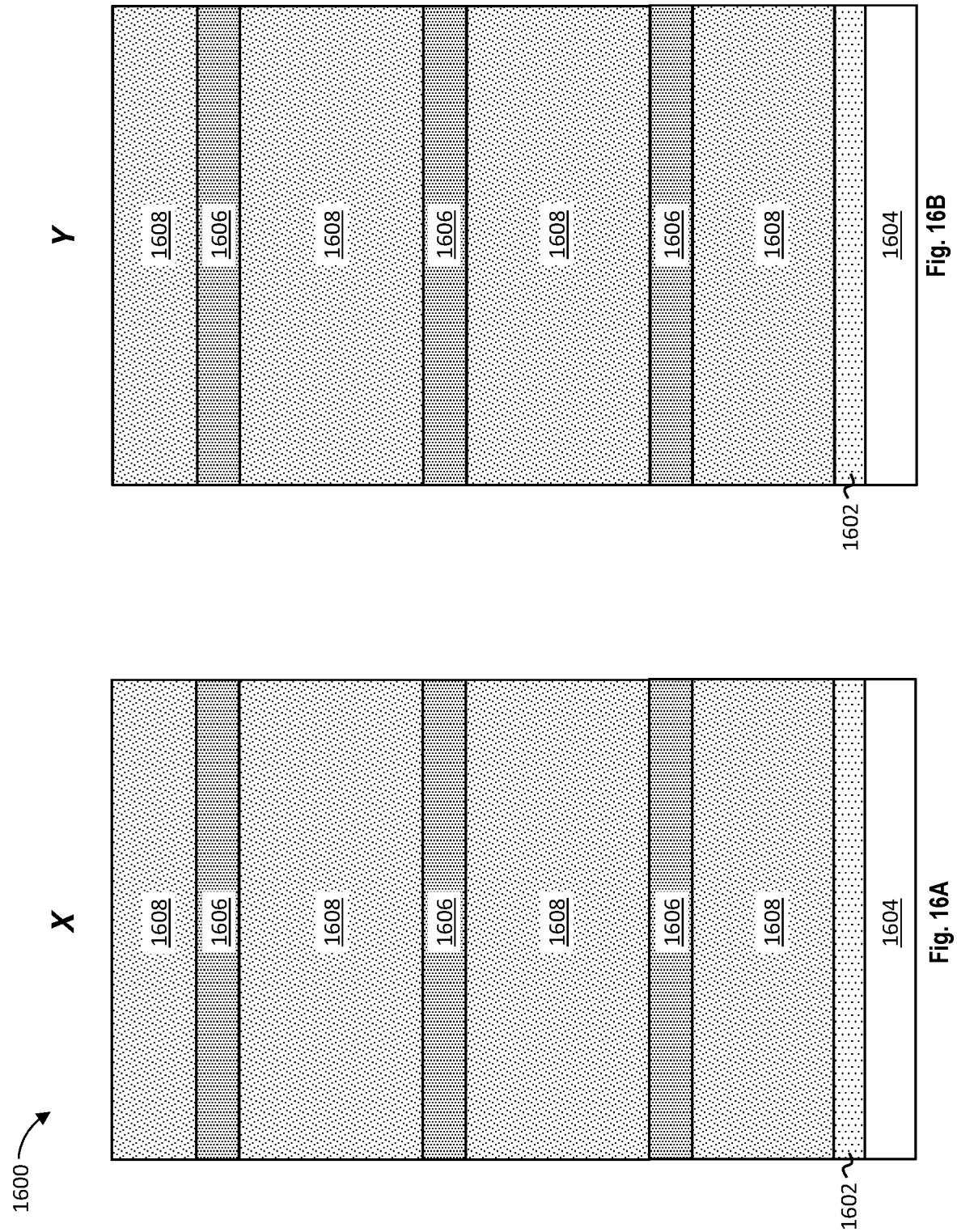

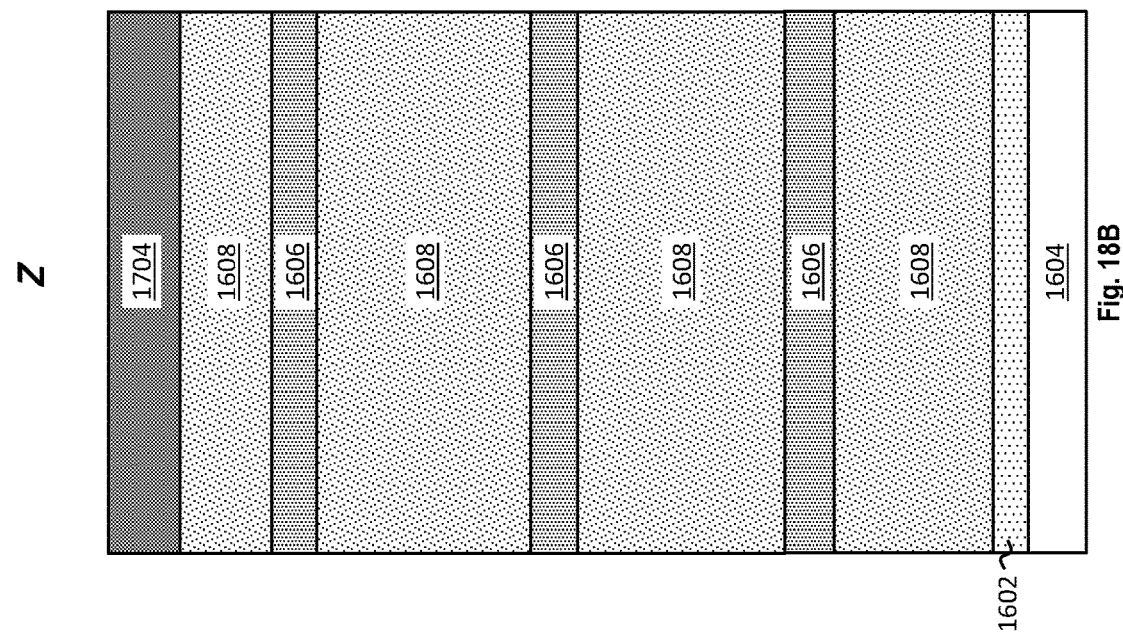
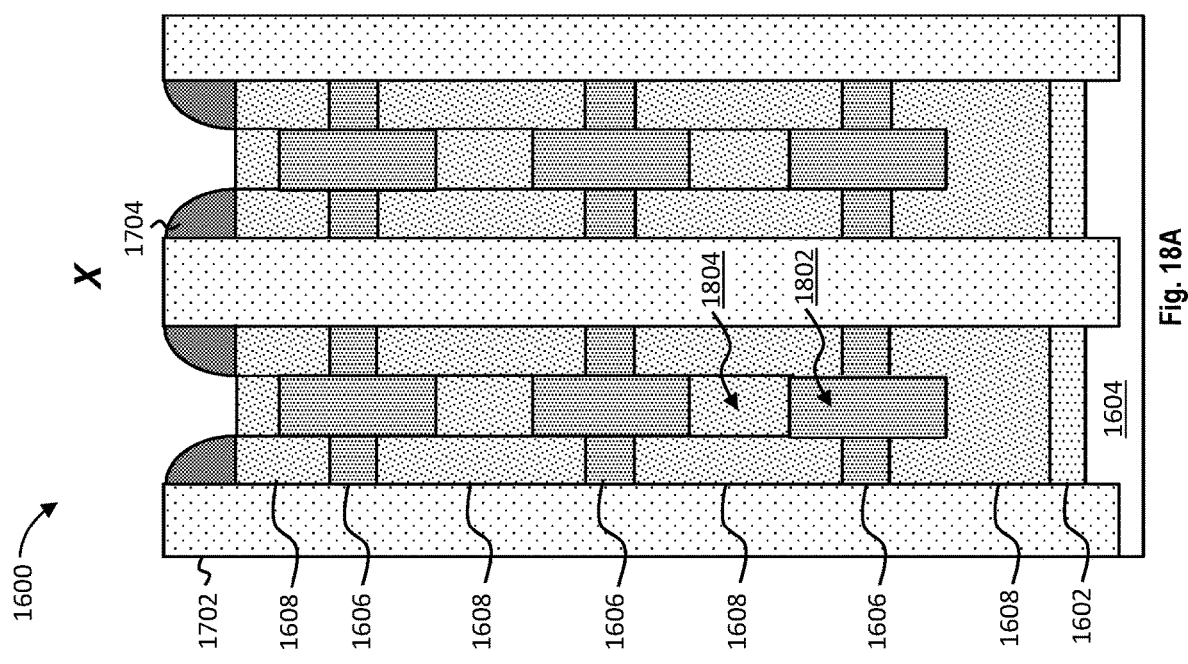

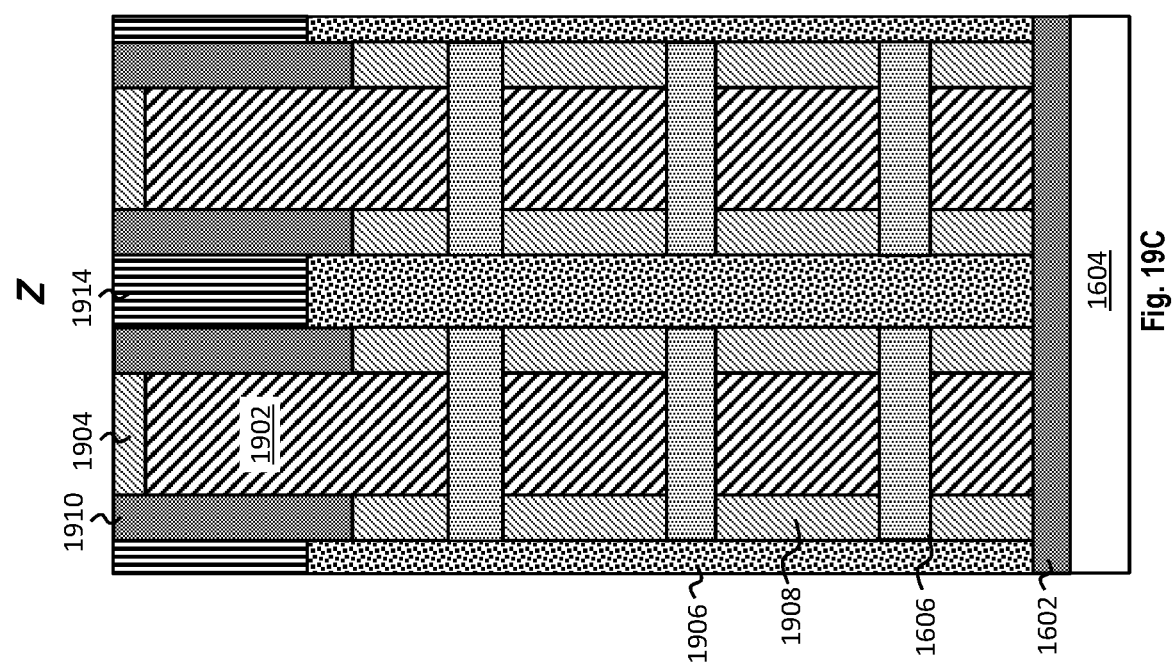

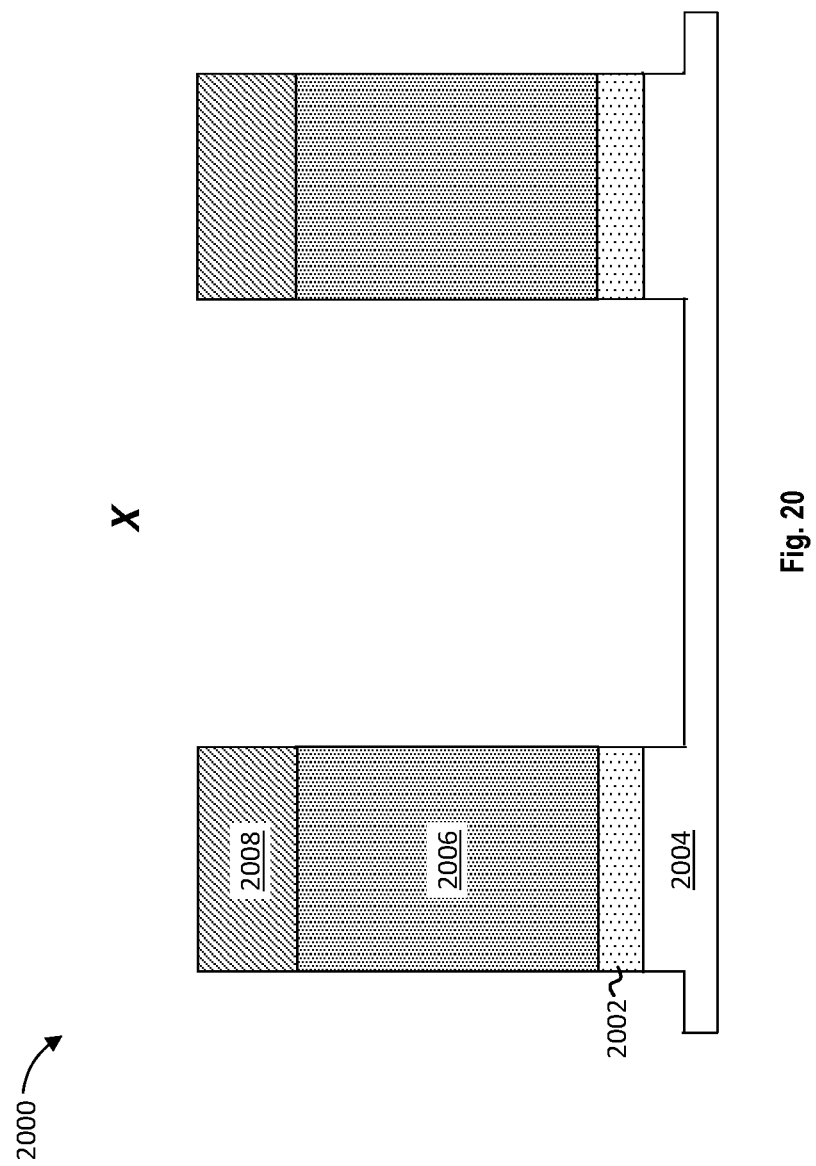

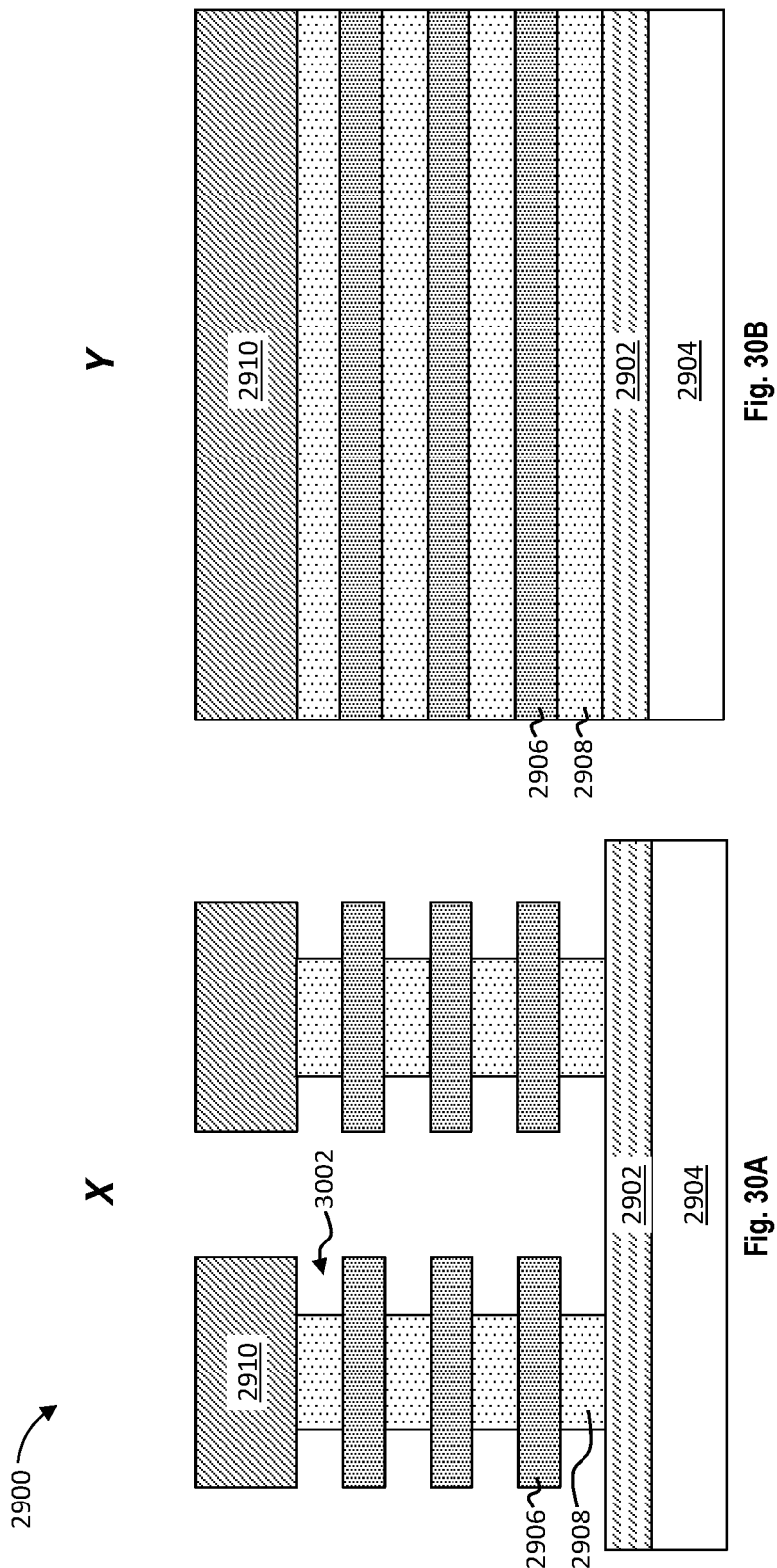

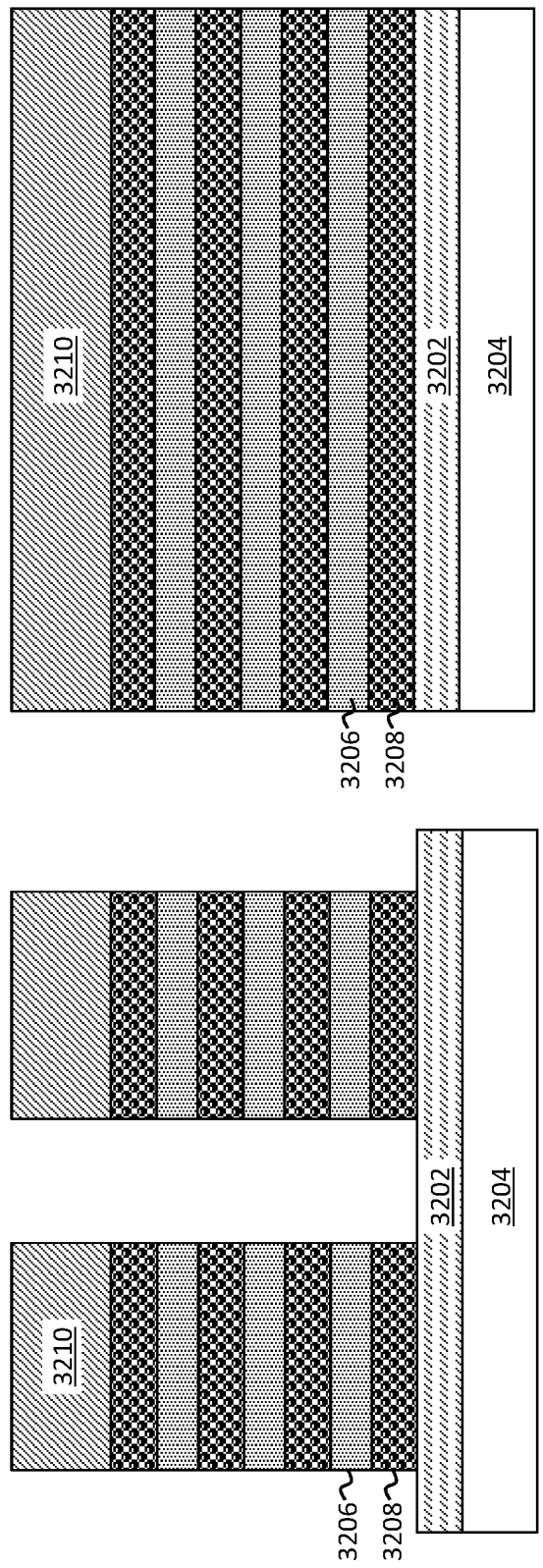

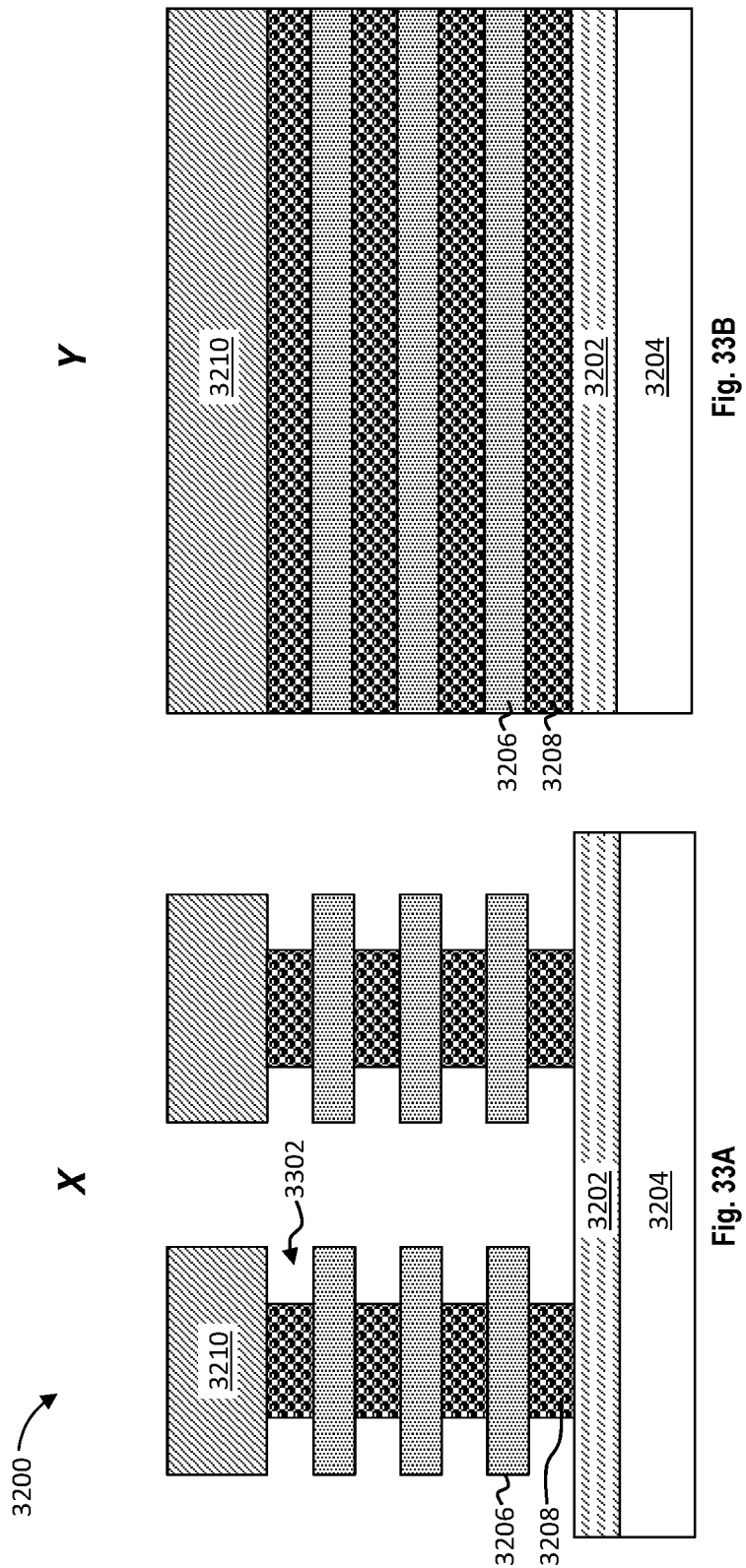

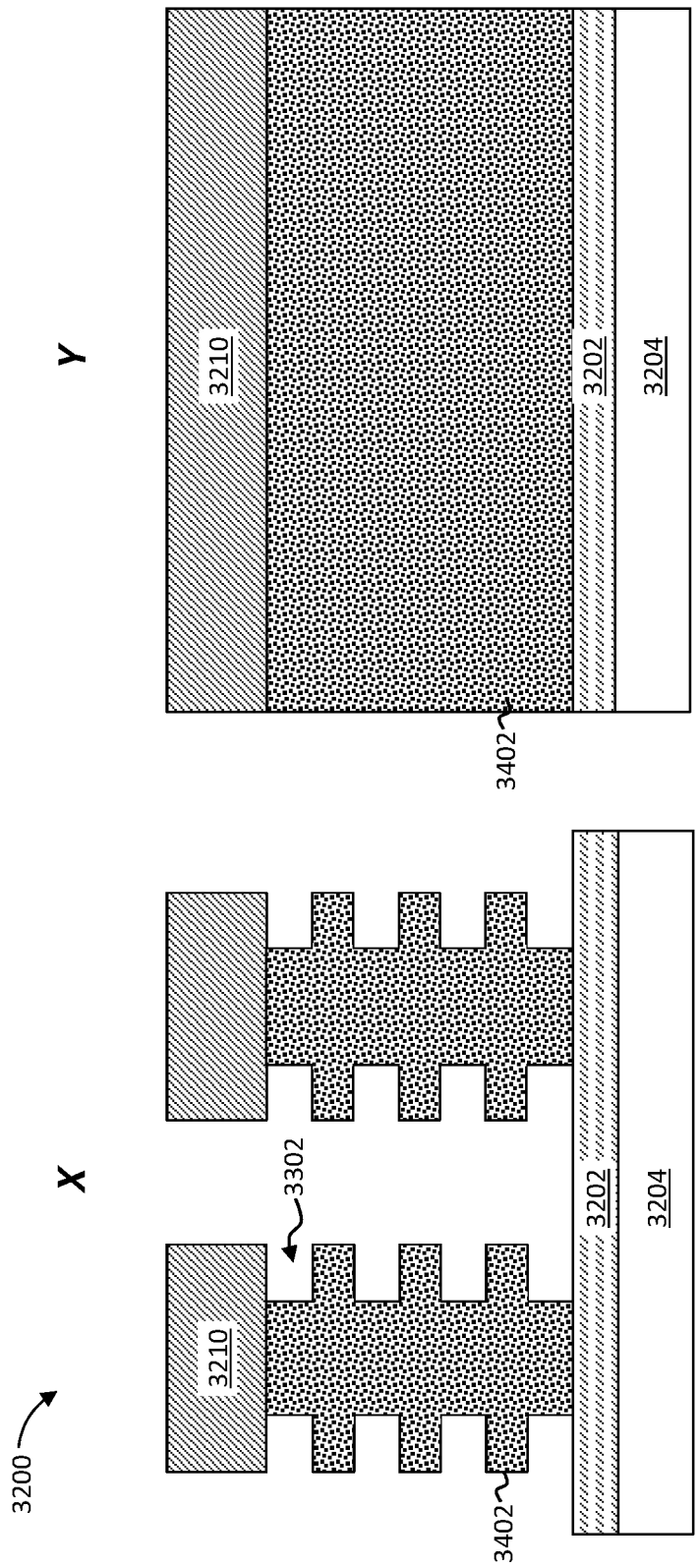

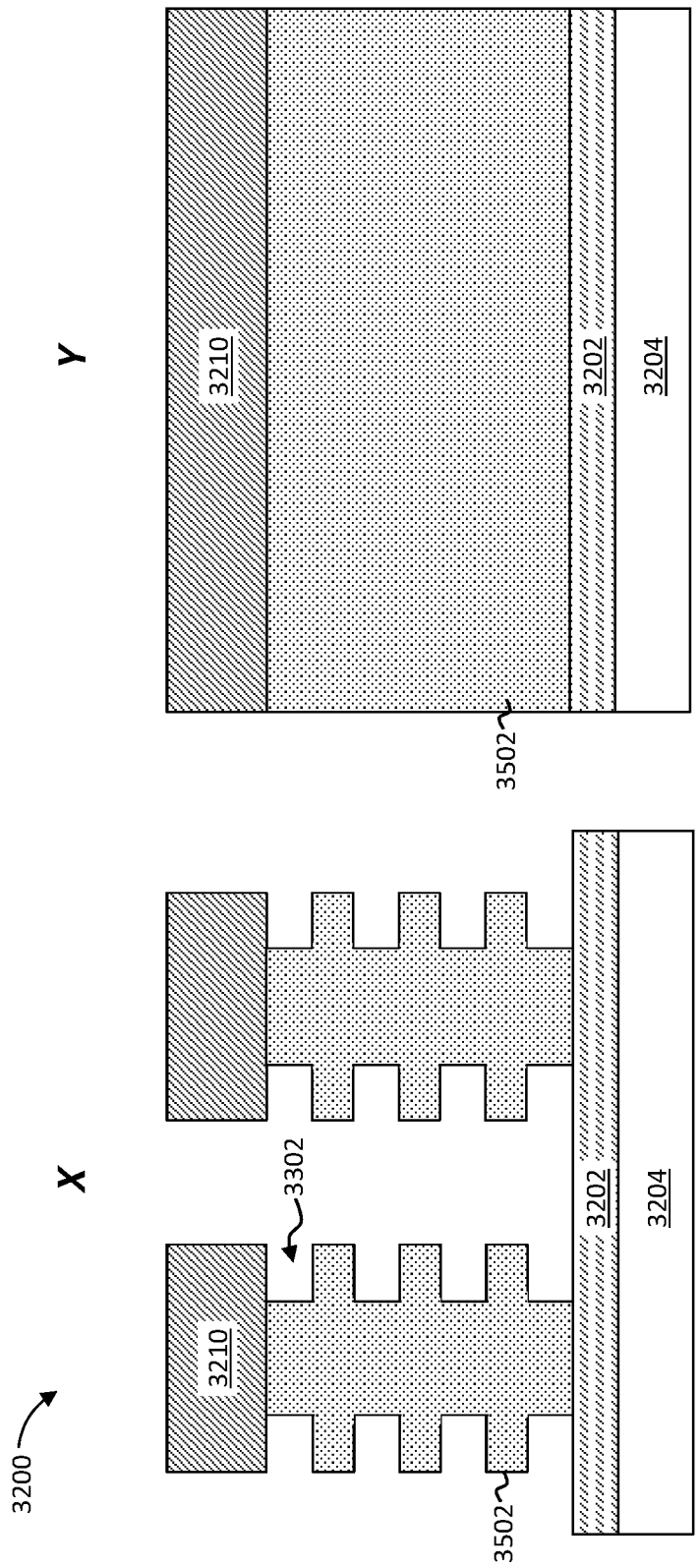

TRANSISTOR CHANNEL HAVING VERTICALLY STACKED NANOSHEETS COUPLED BY FIN-SHAPED BRIDGE REGIONS

BACKGROUND

The present invention generally relates to fabrication methods and resulting structures for semiconductor devices, and more specifically, to fabrication methods and resulting structures for a novel field effect transistor (FET) architecture configured to include a non-planar channel having vertically stacked nanosheets coupled to one another by fin-shaped bridge regions. This novel FET and non-planar channel architecture are identified herein as an X-FET device/architecture.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures to achieve increased device density, greater power efficiency, and some increased performance over lateral devices. For example, in a non-planar transistor architecture known as a nanosheet-type field effect transistor (NSFET), the gate stack wraps around the full perimeter of each nanosheet. These nonplanar architectures can provide for a fuller depletion in the channel region when compared to some planar devices and can reduce short-channel effects due to a steeper subthreshold swing (SS) and smaller drain induced barrier lowering (DIBL). The wrap-around gate structures and the source/drain contacts used in an NSFET (sometimes referred to as gate-all-around (GAA) transistor) can also enable greater management of leakage current and parasitic capacitance in the active regions, even as drive currents increase.

SUMMARY

Embodiments of the invention are directed to a method of forming a semiconductor device. A non-limiting example of the method includes forming a non-planar channel region having a first semiconductor layer, a second semiconductor layer, and a fin-shaped bridge layer between the first semiconductor layer and the second semiconductor layer. Forming the non-planar channel region can include forming a nanosheet stack over a substrate, forming a trench by removing a portion of the nanosheet stack, and forming a third semiconductor layer in the trench. Outer surfaces of the first semiconductor layer, the second semiconductor layer, and the fin-shaped bridge region define an effective channel width of the non-planar channel region.

Embodiments of the invention are directed to a method of forming a semiconductor device. A non-limiting example of the method includes forming a semiconductor layer on a substrate. A stack of alternating oxide layers and nitride layers are formed adjacent to the semiconductor layer and the oxide layers are removed to expose a sidewall of the semiconductor layer. The method further includes recessing the exposed sidewall of the semiconductor layer to define a vertical portion and one or more horizontal portions of the semiconductor layer.

Embodiments of the invention are directed to a method of forming a semiconductor device. A non-limiting example of the method includes forming a nanosheet stack over a substrate. The nanosheet stack includes a first semiconductor layer and a second semiconductor layer. The second semiconductor layer includes a first material. The method further includes recessing a sidewall of the second semiconductor layer and annealing at a temperature operable to uniformly diffuse the first material through the first semiconductor layer and the second semiconductor layer.

Embodiments of the invention are directed to a method of forming a semiconductor device. A non-limiting example of the method includes forming a stack of alternating semiconductor layers and doped semiconductor layers over a substrate. The doped semiconductor layers includes a dopant. The method further includes recessing a sidewall of the doped semiconductor layers and annealing at a temperature operable to uniformly diffuse the dopant through the semiconductor layers and the doped semiconductor layers.

Embodiments of the invention are directed to a semiconductor structure. A non-limiting example of the structure includes a channel region over a substrate. The channel region includes a vertical fin and one or more vertically stacked nanosheets. Each of the one or more vertically stacked nanosheets extend from a sidewall of the vertical fin. A gate is formed over the channel region. The gate is in contact with a sidewall of the vertical fin and a top and bottom surface of each of the one or more vertically stacked nanosheets.

Embodiments of the invention are directed to a method of forming a semiconductor device. A non-limiting example of the method includes forming a nanosheet stack over a substrate. The nanosheet stack includes one or more first semiconductor layers and one or more first sacrificial layers. A trench is formed by removing a portion of the one or more first semiconductor layers and the one or more first sacrificial layers. The trench exposes a surface of a bottommost sacrificial layer of the one or more first sacrificial layers. The method further includes filling the trench with one or more second semiconductor layers and one or more second sacrificial layers such that each of the one or more second semiconductor layers is in contact with a sidewall of one of the one or more first semiconductor layers.

Embodiments of the invention are directed to a method of forming a semiconductor device. A non-limiting example of the method includes forming a first channel region over a substrate. The first channel region includes a first vertical fin and a first nanosheet extending from a sidewall of the first vertical fin. A second channel region is formed over the first channel region. The second channel region includes a second vertical fin and a second nanosheet extending from a sidewall of the second vertical fin. A gate is formed over the first channel region and the second channel region. The gate is in contact with a topmost surface of the first channel region and a bottommost surface of the second channel region.

Embodiments of the invention are directed to a semiconductor structure. A non-limiting example of the structure includes a first channel region over a substrate. The first channel region includes a first vertical fin and a first nanosheet extending from a sidewall of the first vertical fin. The structure further includes a second channel region over the first channel region. The second channel region includes a second vertical fin and a second nanosheet extending from a sidewall of the second vertical fin. A gate wraps around the first channel region and the second channel region. The gate is in contact with a topmost surface of the first channel region and a bottommost surface of the second channel region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2A-15B depict cross-sectional views of an X-FET semiconductor structure after processing operations according to one or more embodiments of the invention;

FIG. 2A depicts a top-down view of the X-FET semiconductor structure after processing operations according to one or more embodiments of the invention;

FIG. 3A depicts a cross-sectional view of the X-FET semiconductor structure after processing operations according to one or more embodiments of the invention;

FIG. 3B depicts a cross-sectional view of the X-FET semiconductor structure after processing operations according to one or more embodiments of the invention;

FIG. 4A depicts a cross-sectional view of the X-FET semiconductor structure after processing operations according to one or more embodiments of the invention;

FIG. 4B depicts a cross-sectional view of the X-FET semiconductor structure after processing operations according to one or more embodiments of the invention;

FIG. 6A depicts a cross-sectional view of the X-FET semiconductor structure after processing operations according to one or more embodiments of the invention;

FIG. 6B depicts a cross-sectional view of the X-FET semiconductor structure after processing operations according to one or more embodiments of the invention;

FIG. 7A depicts a cross-sectional view of the X-FET semiconductor structure after processing operations according to one or more embodiments of the invention;

FIG. 7B depicts a cross-sectional view of the X-FET semiconductor structure after processing operations according to one or more embodiments of the invention;

FIG. 10A depicts a cross-sectional view of the X-FET semiconductor structure after processing operations according to one or more embodiments of the invention;

FIG. 10B depicts a cross-sectional view of the X-FET semiconductor structure after processing operations according to one or more embodiments of the invention;

FIG. 11A depicts a cross-sectional view of the X-FET semiconductor structure after processing operations according to one or more embodiments of the invention;

FIG. 11B depicts a cross-sectional view of the X-FET semiconductor structure after processing operations according to one or more embodiments of the invention;

FIG. 12A depicts a cross-sectional view of the X-FET semiconductor structure after processing operations according to one or more embodiments of the invention;

FIG. 12B depicts a cross-sectional view of the X-FET semiconductor structure after processing operations according to one or more embodiments of the invention;

FIG. 13A depicts a cross-sectional view of the X-FET semiconductor structure after processing operations according to one or more embodiments of the invention;

FIG. 13B depicts a cross-sectional view of the X-FET semiconductor structure after processing operations according to one or more embodiments of the invention;

FIG. 15B depicts a cross-sectional view of the X-FET semiconductor structure after processing operations according to one or more embodiments of the invention;

FIGS. 16A-19C depict cross-sectional views of a GAA X-FET semiconductor structure after processing operations according to one or more embodiments of the invention;

FIG. 16A depicts a cross-sectional view of the GAA X-FET semiconductor structure after processing operations according to one or more embodiments of the invention;

FIG. 16B depicts a cross-sectional view of the GAA X-FET semiconductor structure after processing operations according to one or more embodiments of the invention;

FIG. 18A depicts a cross-sectional view of the GAA X-FET semiconductor structure after processing operations according to one or more embodiments of the invention;

FIG. 18B depicts a cross-sectional view of the GAA X-FET semiconductor structure after processing operations according to one or more embodiments of the invention;

FIG. 19C depicts a cross-sectional view of the GAA X-FET semiconductor structure after processing operations according to one or more embodiments of the invention;

FIGS. 20-28 depict cross-sectional views of an X-FET semiconductor structure after processing operations according to one or more embodiments of the invention;

FIG. 20 depicts a cross-sectional view of the X-FET semiconductor structure after processing operations according to one or more embodiments of the invention;

FIG. 21 depicts a cross-sectional view of the X-FET semiconductor structure after processing operations according to one or more embodiments of the invention;

FIG. 22 depicts a cross-sectional view of the X-FET semiconductor structure after processing operations according to one or more embodiments of the invention;

FIG. 23 depicts a cross-sectional view of the X-FET semiconductor structure after processing operations according to one or more embodiments of the invention;

FIG. 24 depicts a cross-sectional view of the X-FET semiconductor structure after processing operations according to one or more embodiments of the invention;

FIG. 25 depicts a cross-sectional view of the X-FET semiconductor structure after processing operations according to one or more embodiments of the invention;

FIG. 26 depicts a cross-sectional view of the X-FET semiconductor structure after processing operations according to one or more embodiments of the invention;

FIG. 27 depicts a cross-sectional view of the X-FET semiconductor structure after processing operations according to one or more embodiments of the invention;

FIG. 28 depicts a cross-sectional view of the X-FET semiconductor structure after processing operations according to one or more embodiments of the invention;

FIGS. 29A-31B depict cross-sectional views of an X-FET semiconductor structure after processing operations according to one or more embodiments of the invention;

FIG. 29A depicts a cross-sectional view of the X-FET semiconductor structure after processing operations according to one or more embodiments of the invention;

FIG. 30A depicts a cross-sectional view of the X-FET semiconductor structure after processing operations according to one or more embodiments of the invention;

FIG. 30B depicts a cross-sectional view of the X-FET semiconductor structure after processing operations according to one or more embodiments of the invention;

FIG. 31B depicts a cross-sectional view of the X-FET semiconductor structure after processing operations according to one or more embodiments of the invention;

FIGS. 32A-35B depict cross-sectional views of an X-FET semiconductor structure after processing operations according to one or more embodiments of the invention;

FIG. 32A depicts a cross-sectional view of the X-FET semiconductor structure after processing operations according to one or more embodiments of the invention;

FIG. 32B depicts a cross-sectional view of the X-FET semiconductor structure after processing operations according to one or more embodiments of the invention;

FIG. 33A depicts a cross-sectional view of the X-FET semiconductor structure after processing operations according to one or more embodiments of the invention;

FIG. 33B depicts a cross-sectional view of the X-FET semiconductor structure after processing operations according to one or more embodiments of the invention;

FIG. 34A depicts a cross-sectional view of the X-FET semiconductor structure after processing operations according to one or more embodiments of the invention;

FIG. 34B depicts a cross-sectional view of the X-FET semiconductor structure after processing operations according to one or more embodiments of the invention;

FIG. 35A depicts a cross-sectional view of the X-FET semiconductor structure after processing operations according to one or more embodiments of the invention;

FIG. 35B depicts a cross-sectional view of the X-FET semiconductor structure after processing operations according to one or more embodiments of the invention;

Figure 1B:
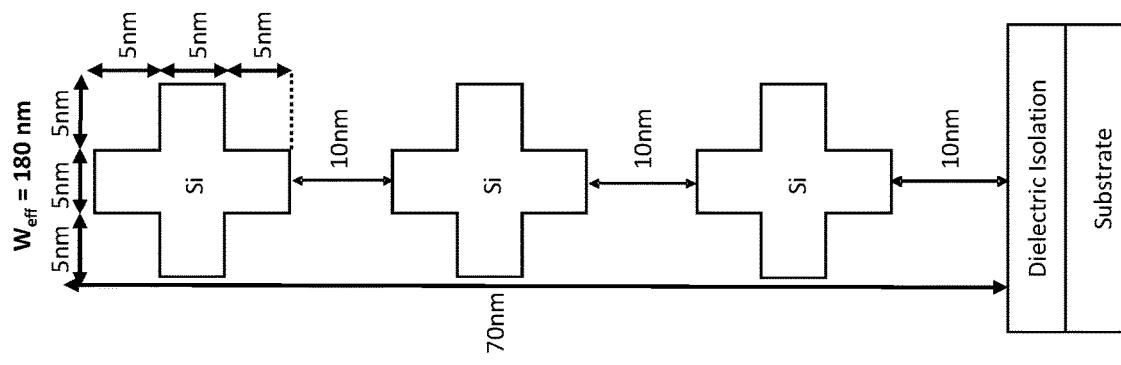
FIG. 1B illustrates an effective channel width for a gate-all-around (GAA) X-FET architecture according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, a metal-oxide-semiconductor field-effect transistor (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by the oxide portion of the metal oxide gate electrode. The oxide portion of the gate electrode can be implemented as a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

As previously noted herein, traditional MOSFET fabrication techniques include process flows for constructing planar transistor architectures and nonplanar transistor architectures. One goal for designing nonplanar transistor architectures is to increase the effective channel width ($W_{eff}$) for a given device footprint within the constraints of the current processing node (e.g., the width of the device processing window, sometimes denoted RX). The effective channel width of a transistor can be defined as the total width of the transistor's channel in contact with the transistor's gate. Hence the larger the effective channel width, the more drive current the transistor will be able to deliver. For comparison, the effective channel width for a 50 nm wide planar transistor is simply the width of the gate (e.g., 50 nm). NSFETs were developed to increase the effective channel width for a given footprint while improving the electrostatic control of the channel as well. Continuing the above example, a 50 nm high three-nanosheet stack having a nanosheet width of 15 nm and a nanosheet thickness of 5 nm provides an effective channel width of 120 nm. By increasing the effective channel width, a larger effective depletion region in the channel is achieved enabling the device to provide higher drive current at a given gate voltage. This in turn can increase device performance and can enable further device scaling. Consequently, there is significant interest in further improving the effective channel width for a given device footprint.

There are challenges, however, associated with increasing the effective channel width of a transistor beyond the 20 nm node. For example, nanosheet-based SRAM devices require narrow sheet devices (in the 10-15 nm range) due to cell scaling requirements. At these dimensions the effective channel width of a NSFET is significantly reduced and the device architecture loses some performance benefits in terms of drive current capabilities.

In theory, the effective channel width of a NSFET device could be increased by increasing the sheet width or increasing the number of sheets. Each of these approaches has its disadvantages. For example, process limitations put practical limits on how wide the nanosheet device can be, preventing arbitrarily large increases in sheet width. Conventional processes are currently constrained by an upper limit of about 100 nm for the sheet width. Moreover, increasing the sheet width directly means increasing the foot print of the device. In other words, each transistor takes more room on the wafer, which is not ideal for scaling.

Increasing the number of sheets significantly increases the effective channel width for a given device foot print. Based on simulations, however, the optimal number of sheets for a NSFET is 3 (this follows from a co-optimization of the drive current and parasitic capacitance). Adding a fourth sheet on top of the stack is possible, but the integration scheme complicates the fabrication process, due in part to aspect ratio considerations. Moreover, the device might actually perform worse than a 3-sheet device due to the corresponding increase in parasitic capacitance.

Figure 1A:
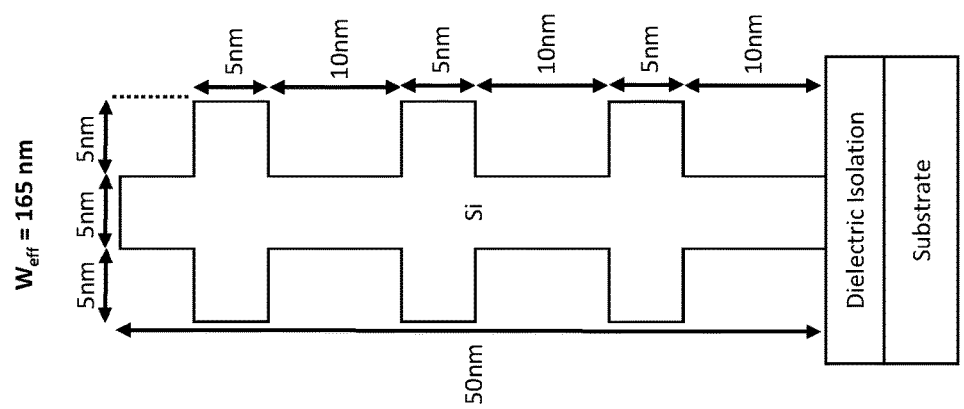
FIG. 1A illustrates an effective channel width for an X-FET architecture according to one or more embodiments of the invention.

Turning now to an overview of aspects of the present invention, embodiments of the invention address the above-described shortcomings of the prior art by providing fabrication methods and resulting structures for a new transistor architecture described herein as an X-type field effect transistor (X-FET). Described broadly, the X-FET architecture herein includes a non-planar channel having a set of vertically stacked nanosheets coupled to one another by fin-shaped bridge regions. In some embodiments of the invention, the X-FET is combined with a gate all around (GAA) process to further increase the effective channel width and improve the device electrostatics. The resulting hybrid architectures show a significant effective channel width ($W_{eff}$) boost over 3-sheet NSFETs for any given RX width (at the same device footprint and without needing to add additional nanosheets to the stack). The X-FET and GAA X-FET architectures also outperform 4-sheet NSFETs when RX is less than 15 nm and 25 nm, respectively, while avoiding the increased fabrication complexities associated with nanosheet stacks having four or more nanosheets. Advantageously, the gate length is maintained similar to NSFETs. Consequently, X-FETs and GAA X-FETs provide the same electrostatic benefits as NSFETs, allowing very short gate lengths, while the increased effective channel widths provide higher drive currents (ON currents). FIGS. 1A and 1B illustrate the increases in $W_{eff}$ available when using the X-FET (FIG. 1A) and the GAA X-FET (FIG. 1B) architectures described herein.

Turning now to a more detailed description of aspects of the present invention, FIGS. 2A-15B depict various views of an "X-FET" semiconductor structure 200 that result from performing fabrication operations according to one or more embodiments of the invention.

Figure 2A:
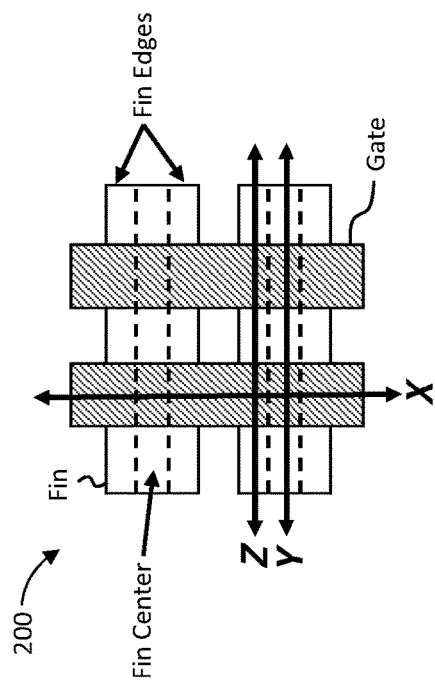

For ease of illustration, FIG. 2A depicts a top-down view of the "X-FET" semiconductor structure 200 that illustrates the three cross-sectional views used in the following discussion. The "X-FET" type semiconductor structure 200 includes a fin having a fin center and fin edges. The "X-FET" semiconductor structure 200 further includes a gate formed over a channel region of the fin. As depicted in FIG. 2A, the cross-fin view "X" is taken along a centerline of the gate. The cross-gate view "Y" is taken along the fin center. The cross-gate view "Z" is taken along the fin edge.

Figure 2C:
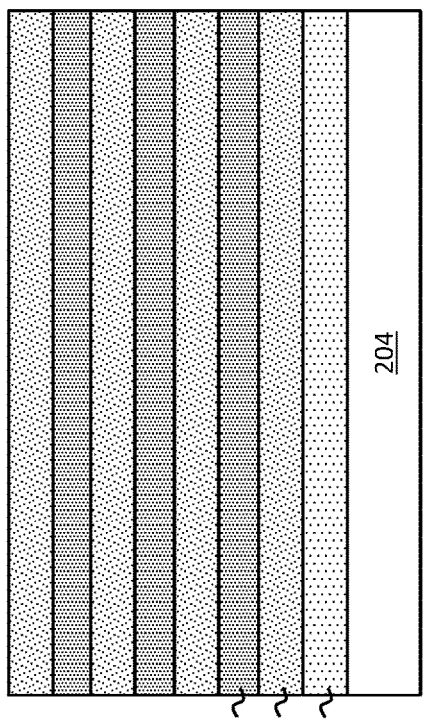
FIG. 2C depicts a cross-sectional view of the X-FET semiconductor structure of FIG. 2A after processing operations according to one or more embodiments of the invention.
Figure 2B:
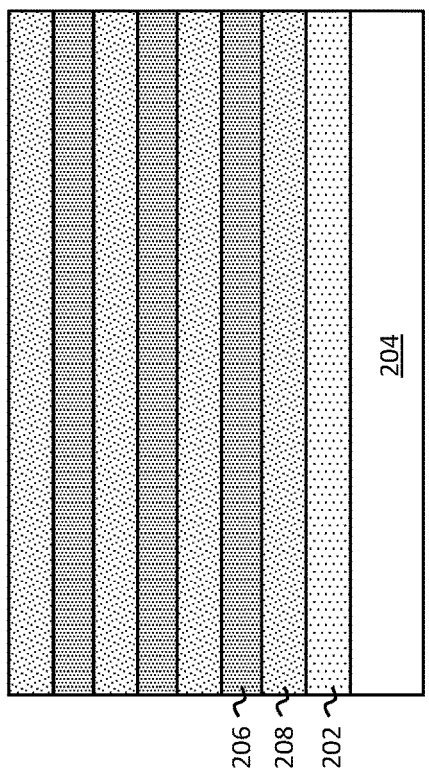
FIG. 2B depicts a cross-sectional view of the X-FET semiconductor structure after processing operations according to one or more embodiments of the invention.

As depicted in FIGS. 2B and 2C, a partially fabricated semiconductor device can include a first sacrificial layer 202 formed over a substrate 204. The first sacrificial layer 202 can be made of any suitable sacrificial material, such as, for example, silicon germanium. In some embodiments of the invention, the germanium concentration in the first sacrificial layer 202 is selected to ensure etch selectivity against any silicon, silicon germanium or germanium layers in the subsequently formed gate stack. In other words, the first sacrificial layer 202 can be etched selective to any silicon, silicon germanium or germanium in the subsequently formed gate stack. In some embodiments of the invention, the germanium concentration in the first sacrificial layer 202 is at least 30 percent higher than the germanium concentration than any other silicon germanium layers in the stack. In some embodiments of the invention, the first sacrificial layer 202 can include a germanium concentration of 45 to 70 percent, for example 50 percent, although other germanium concentrations are within the contemplated scope of the invention.

The first sacrificial layer 202 can have a wide range of thickness such as, for example, from 5 nm to 25 nm or more. In some embodiments of the invention, the first sacrificial layer 202 is formed to a height of about 10 nm, although other thicknesses are within the contemplated scope of the invention. The first sacrificial layer 202 can be formed by a variety of methods, such as, for example, chemical vapor deposition (CVD), plasma-enhanced CVD (PECVD), ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and molecular beam epitaxy (MBE). In some embodiments of the invention, the first sacrificial layer 202 can be epitaxially grown from gaseous or liquid precursors. Epitaxial semiconductor materials can be grown using vapor-phase epitaxy (VPE), MBE, liquid-phase epitaxy (LPE), or other suitable processes.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on other exposed surfaces, such as silicon dioxide or silicon nitride surfaces.

The substrate 204 can be made of any suitable substrate material, such as, for example, monocrystalline Si, silicon germanium (Silicon germanium), III-V compound semiconductor, II-VI compound semiconductor, or semiconductor-on-insulator (SOI). In some embodiments of the invention, the substrate 204 can be a silicon substrate. In some embodiments of the invention, the substrate 204 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. The semiconductor structure 200 can be electrically isolated from other regions of the substrate 204 by a shallow trench isolation region (see FIG. 7A).

In some embodiments of the invention, a stack of one or more semiconductor layers 206 alternating with one or more sacrificial layers 208 is formed over the first sacrificial layer 202. The stack can be formed such that the topmost and bottommost layers of the stack are the sacrificial layers 208. While depicted as a stack having three semiconductor layers 206 alternating with four sacrificial layers 208 for ease of illustration, it is understood that the stack can include any number of semiconductor layers 206 alternating with a corresponding number of sacrificial layers 208. For example, the stack can include two semiconductor layers 206 alternating with three sacrificial layers 208. In the final transistor structure, the semiconductor layers 206 will function as the channel regions, and the sacrificial layers 208 will be replaced with a portion of the transistor gate structure that wraps around the semiconductor/channel layers 206.

Each of the semiconductor layers 206 can have a height ranging from 4 nm to 20 nm, for example, from 7 nm to 10 nm. In some embodiments of the invention, the semiconductor layers 206 have a height of about 9 nm. The semiconductor layers 206 can be made of any suitable semiconductor channel material, such as, for example, monocrystalline Si, III-V compound semiconductor, or II-VI compound semiconductor. In some embodiments of the invention, the semiconductor layers 206 are made of silicon.

Each of the sacrificial layers 208 can have a height ranging from 4 nm to 20 nm, for example, from 8 nm to 15 nm. In some embodiments of the invention, the sacrificial layers 208 have a height of about 8 nm. In some embodiments of the invention, the sacrificial layers 208 are made of silicon germanium. In some embodiments of the invention, the sacrificial layers 208 include a germanium concentration of 15 to 35 percent, for example 25 percent, although other germanium concentrations are within the contemplated scope of the invention.

The semiconductor layers 206 and the sacrificial layers 208 can be formed by a variety of methods, such as, for example, UHVCVD, RTCVD, MOCVD, LPCVD, LRPCVD, and MBE. In some embodiments of the invention, the semiconductor layers 206 and the sacrificial layers 208 are epitaxially grown from gaseous or liquid precursors. Epitaxial semiconductor materials can be grown using VPE, MBE, LPE, or other suitable processes. Epitaxial silicon and silicon germanium can be doped during deposition (in-situ doped) by adding n-type dopants (e.g., P or As) or p-type dopants (e.g., Ga, B, $BF_2$, or Al). The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the doped regions include silicon. In some embodiments of the invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

FIGS. 3A and 3B depict cross-sectional views of the "X-FET" type semiconductor structure 200 during an intermediate operation of a method of fabricating a semiconductor device according to one or more embodiments of the invention. As illustrated in FIGS. 3A and 3B, a hard mask 302 can be formed on the topmost layer of the sacrificial layers 208. In some embodiments of the invention, the hard mask 302 includes a nitride, such as silicon nitride. In some embodiments of the invention, the hard mask 302 is formed to a thickness of 40 nm, although other thicknesses are within the contemplated scope of the invention. In some embodiments of the invention, a second hard mask (not depicted) can be formed on the hard mask 302, to form a bilayer hard mask. In some embodiments of the invention, the second hard mask includes an oxide, such as, for example, silicon dioxide.

In some embodiments of the invention, portions of the hard mask 302 are removed (e.g., patterned) and the stack of semiconductor layers 206 and sacrificial layers 208 are patterned selective to the hard mask 302. As illustrated in FIG. 3A, portions of the semiconductor layers 206 and sacrificial layers 208 that are not covered by the patterned hard mask 302 can be removed using a wet etch, a dry etch, or a combination of sequential wet and/or dry etches. In this manner, the semiconductor layers 206 and sacrificial layers 208 can be patterned to expose one or more surfaces of the substrate 204. In some embodiments of the invention, the patterning process can result in a recessing of the substrate 104. In some embodiments of the invention, the stack is patterned into one or more fins having a width ranging from 10 to 50 nm, although other widths are within the contemplated scope of the invention. For ease of illustration, the stack is depicted as being patterned to form two fins. It is understood, however, that the stack be patterned into any number of parallel fins.

In some embodiments of the invention, a shallow trench isolation (STI) 304 is formed over the substrate 204 to electrically isolate the one or more semiconductor fins. The STI 304 can be any suitable dielectric material, such as, for example, a silicon oxide, and can be formed using any suitable process. The STI 304 can be formed using, for example, CVD, flowable CVD (FCVD) plasma-enhanced CVD (PECVD), UHVCVD, RTCVD, MOCVD, LPCVD, LRPCVD, ALD, physical vapor deposition (PVD), high-density plasma (HDP), chemical solution deposition, spin-on dielectrics, or other like processes. In some embodiments of the present invention, the STI 304 is overfilled and then recessed using, for example, a chemical-mechanical planarization (CMP) process.

FIGS. 4A and 4B depict cross-sectional views of the "X-FET" type semiconductor structure 200 during an intermediate operation of a method of fabricating a semiconductor device according to one or more embodiments of the invention. As illustrated in FIGS. 4A and 4B, the hard mask 302 can be stripped using, for example, a wet etch, a dry etch, or a combination of sequential wet and/or dry etches. In this manner, sidewalls of the STI 304 can be exposed.

In some embodiments of the invention, fin spacers 402 are formed over the topmost sacrificial layer of the sacrificial layers 208 and between the exposed sidewalls of the STI 304. In some embodiments of the invention, the fin spacers 402 are formed using conformal deposition process such as CVD, PECVD, UHVCVD, RTCVD, MOCVD, LPCVD, LRPCVD, ALD, PVD, chemical solution deposition, or other like processes in combination with a wet or dry etch process. For example, spacer material can be conformally deposited over the semiconductor structure 200 and selectively removed using a RIE to form the fin spacers 402. The fin spacers 402 can be made of any suitable material, such as, for example, a low-k dielectric, a nitride, silicon nitride, silicon oxide, SiON, SiC, SiOCN, or SiBCN. In some embodiments of the invention, the fin spacers 402 include silicon nitride. The fin spacers 402 can be formed to a thickness of about 5 to 10 nm, for example 5 nm, although other thicknesses are within the contemplated scope of the invention.

Figure 5A:
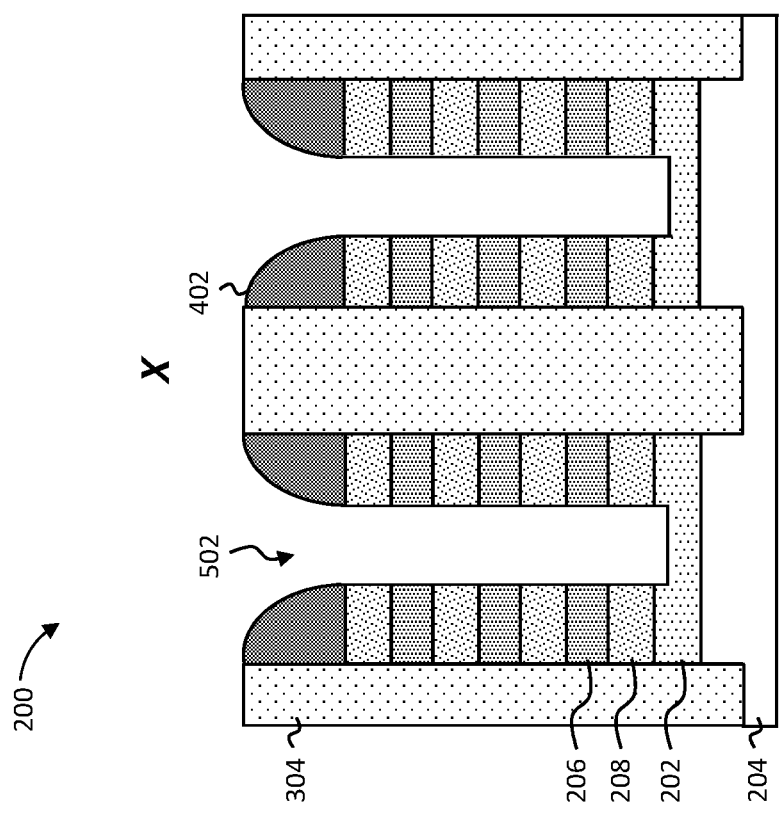
FIG. 5A depicts a cross-sectional view of the X-FET semiconductor structure after processing operations according to one or more embodiments of the invention.
Figure 5B:
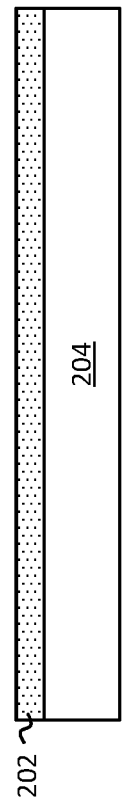
FIG. 5B depicts a cross-sectional view of the X-FET semiconductor structure after processing operations according to one or more embodiments of the invention.

FIGS. 5A and 5B depict cross-sectional views of the "X-FET" type semiconductor structure 200 during an intermediate operation of a method of fabricating a semiconductor device according to one or more embodiments of the invention. As illustrated in FIGS. 5A and 5B, portions of the semiconductor layers 206 and sacrificial layers 208 that are not covered by the fin spacers 402 can be removed using a wet etch, a dry etch, or a combination of sequential wet and/or dry etches.

In some embodiments of the invention, these portions are removed using a reactive ion etch (ME). In this manner, the semiconductor layers 206 and sacrificial layers 208 can be patterned to form a trench 502 exposing one or more surfaces of the first sacrificial layer 202. In some embodiments of the invention, the patterning process can result in a recessing of the first sacrificial layer 202. In some embodiments of the invention, the semiconductor layers 206 and sacrificial layers 208 are patterned into nanosheets having a width of 5 nm, although other widths are within the contemplated scope of the invention.

FIGS. 6A and 6B depict cross-sectional views of the "X-FET" type semiconductor structure 200 during an intermediate operation of a method of fabricating a semiconductor device according to one or more embodiments of the invention. As illustrated in FIGS. 6A and 6B, a semiconductor layer 602 is formed within the trench 502. In some embodiments of the invention, the semiconductor layer 602 is a bottom-up trench epitaxy.

The semiconductor layer 602 can be formed by a variety of methods. In some embodiments of the invention, epitaxial semiconductor materials can be grown in the trench 502 using VPE, MBE, LPE, or other suitable processes. The semiconductor layer 602 can be made of any suitable semiconductor channel material, such as, for example, monocrystalline Si, III-V compound semiconductor, or II-VI compound semiconductor. In some embodiments of the invention, the semiconductor layer 602 is made of a same material as the semiconductor layers 206, such as, for example, silicon.

FIGS. 7A and 7B depict cross-sectional views of the "X-FET" type semiconductor structure 200 during an intermediate operation of a method of fabricating a semiconductor device according to one or more embodiments of the invention. As illustrated in FIGS. 7A and 7B, the fin spacers 402 can be filled in with additional material to form, or replaced by, a hard mask 702.

The hard mask 702 can be formed using a CVD, PECVD, UHVCVD, RTCVD, MOCVD, LPCVD, LRPCVD, ALD, PVD, chemical solution deposition, or other like process. For example, dielectric material can be conformally deposited over the semiconductor structure 200. The hard mask 702 can be made of any suitable material, such as, for example, a low-k dielectric, a nitride, silicon nitride, silicon oxide, SiON, SiC, SiOCN, or SiBCN. In some embodiments of the invention, the hard mask 702 includes silicon nitride. The hard mask 702 can be formed to a thickness of about 5 to 50 nm, for example 10 nm, although other thicknesses are within the contemplated scope of the invention.

In some embodiments of the invention, the STI 304 is recessed below a surface of the first sacrificial layer 202. In this manner, the STI 304 electrically isolates one or more nanosheets stacks. The STI 304 can be recessed using, for example, chemical oxide removal (COR) or a hydrofluoric acid (HF) wet etch. In some embodiments of the invention, the STI 304 is recessed selective to the hard mask 702.

Figure 8A:
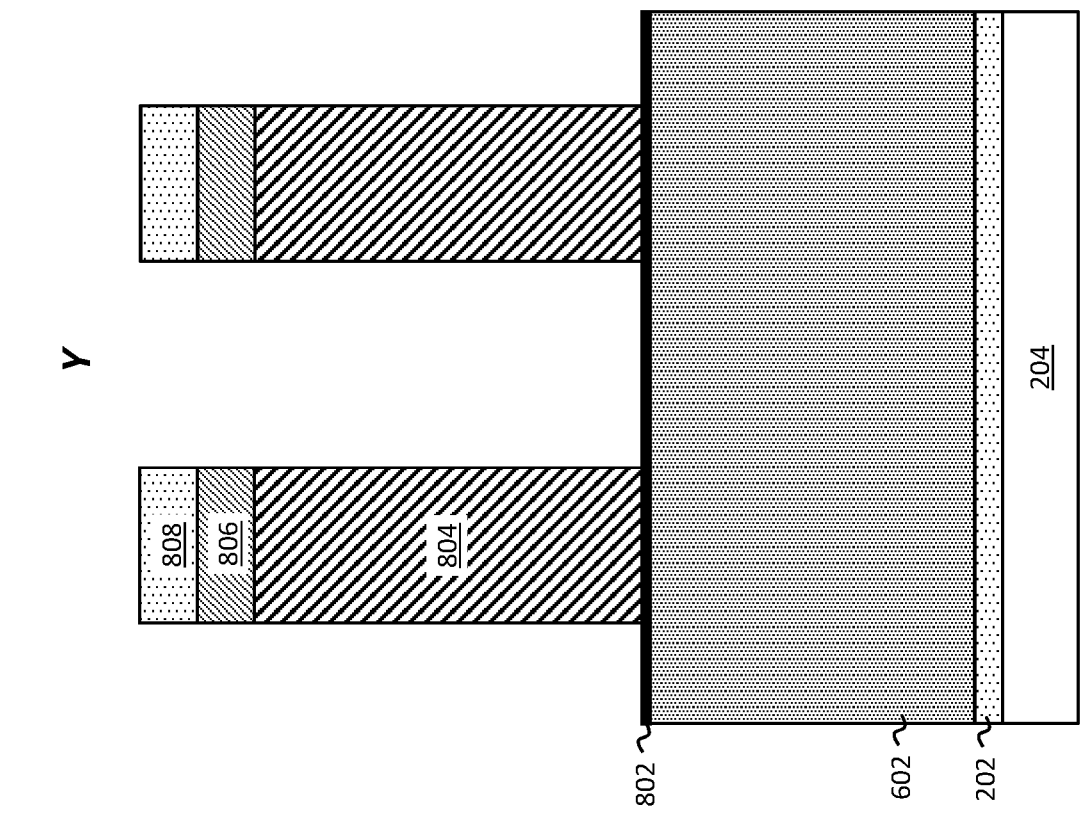
FIG. 8A depicts a cross-sectional view of the X-FET semiconductor structure after processing operations according to one or more embodiments of the invention.
Figure 8B:
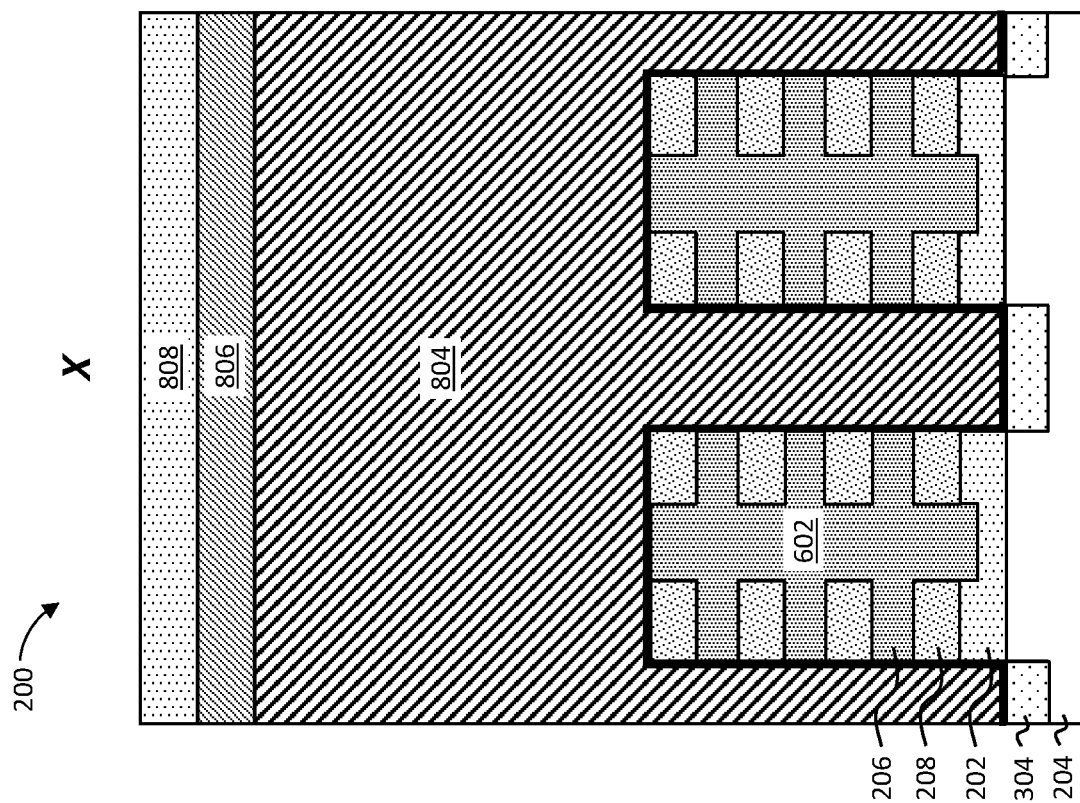
FIG. 8B depicts a cross-sectional view of the X-FET semiconductor structure after processing operations according to one or more embodiments of the invention.

FIGS. 8A and 8B depict cross-sectional views of the "X-FET" type semiconductor structure 200 during an intermediate operation of a method of fabricating a semiconductor device according to one or more embodiments of the invention. As illustrated in FIGS. 8A and 8B, the hard mask 702 can be removed using, for example, a wet etch, a dry etch, or a combination of sequential wet and/or dry etches.

In some embodiments of the invention, a dielectric liner 802 is formed over the semiconductor structure 200. In some embodiments of the invention, the dielectric liner 802 is formed using a conformal deposition process such CVD, PECVD, UHVCVD, RTCVD, MOCVD, LPCVD, LRPCVD, ALD, PVD, chemical solution deposition, or other like process. For example, dielectric material can be conformally deposited over the semiconductor structure 200. The dielectric liner 802 can be made of any suitable material, such as, for example, a low-k dielectric, a nitride, silicon nitride, silicon oxide, SiON, SiC, SiOCN, or SiBCN. In some embodiments of the invention, the dielectric liner 802 is a silicon oxide. The dielectric liner 802 can be formed to a thickness of about 0.2 to 10 nm, for example 3 nm, although other thicknesses are within the contemplated scope of the invention.

In some embodiments of the invention, a sacrificial gate 804 is formed over the dielectric liner 802. The sacrificial gate 804 can be made of any suitable material, such as, for example, amorphous silicon or polysilicon. The sacrificial gate 804 can be formed using any known method for patterning a sacrificial gate, such as, for example, a polysilicon fill and a wet etch, a dry etch, or a combination of sequential wet and/or dry etches.

In some embodiments of the invention, a hard mask 806 (also known as a gate hard mask) is formed on the sacrificial gate 804. The hard mask 806 can be made of any suitable material, such as, for example, a silicon nitride. In some embodiments of the invention, a second hard mask 808 is formed on the hard mask 806, to form a bilayer hard mask. The second hard mask 808 can include an oxide, such as, for example, a silicon oxide. In some embodiments of the invention, the sacrificial gate 804 is formed by patterning the hard masks 806 and 808 and removing uncovered portions of the sacrificial gate 808 with a RIE.

Figures 9A, 9B:
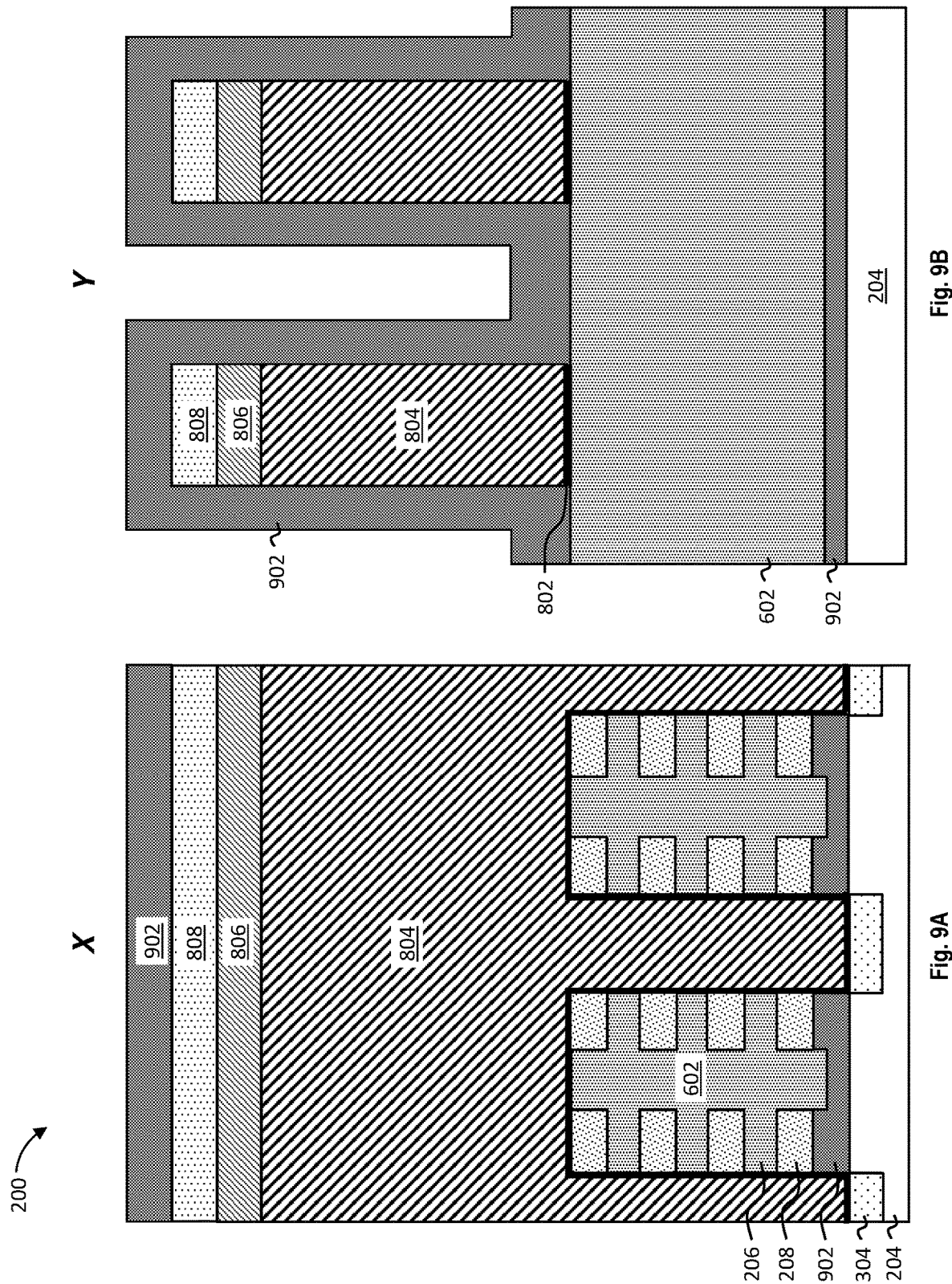
FIG. 9A depicts a cross-sectional view of the X-FET semiconductor structure after processing operations according to one or more embodiments of the invention.
FIG. 9B depicts a cross-sectional view of the X-FET semiconductor structure after processing operations according to one or more embodiments of the invention.

FIGS. 9A and 9B depict cross-sectional views of the "X-FET" type semiconductor structure 200 during an intermediate operation of a method of fabricating a semiconductor device according to one or more embodiments of the invention. As illustrated in FIG. 9B, portions of the dielectric liner 802 can be removed to expose a surface of the nanosheet stack(s) (e.g., the semiconductor layer 602). The dielectric liner 802 can be removed using a wet or dry etch. In some embodiments of the invention, the dielectric liner 802 is removed using an oxide stripping process.

As illustrated in FIGS. 9A and 9B, the first sacrificial layer 202 can be removed selective to the sacrificial layers 208. The first sacrificial layer 202 can be removed using any suitable process capable of removing a germanium layer selective to a lower concentration germanium layer. Example processes known to provide this etch selectivity include HCl vapor phase chemistries and chlorine trifluoride ($ClF_3$) etches.

In some embodiments of the invention, spacer material 902 is formed over the semiconductor structure 200. In some embodiments of the invention, for example, those having a first sacrificial layer 202 that is subsequently removed, the spacer material 902 is also formed within the cavity left by the removal of the first sacrificial layer 202. In this manner, the spacer material 902 can replace the first sacrificial layer 202 (if present). Replacing the first sacrificial layer 202 in this way provides for a bottom isolation between the nanosheet stacks and the substrate 204.

In some embodiments of the invention, the spacer material 902 is formed using a conformal deposition process such as CVD, PECVD, UHVCVD, RTCVD, MOCVD, LPCVD, LRPCVD, ALD, PVD, chemical solution deposition, or other like process. For example, spacer material 902 can be conformally deposited over the semiconductor structure 200. The spacer material 902 can be made of any suitable material, such as, for example, a low-k dielectric, a nitride, silicon nitride, silicon oxide, SiON, SiC, SiOCN, or SiBCN. In some embodiments of the invention, the spacer material 902 includes SiBCN. The spacer material 902 can be formed or deposited to a thickness of about 5 to 15 nm, although other thicknesses are within the contemplated scope of the invention.

FIGS. 10A and 10B depict cross-sectional views of the "X-FET" type semiconductor structure 200 during an intermediate operation of a method of fabricating a semiconductor device according to one or more embodiments of the invention. As illustrated in FIGS. 10A and 10B, portions of the spacer material 902 can be etched or otherwise patterned to form spacers 1002 (also known as sidewall spacers or gate spacers) on sidewalls of the sacrificial gate 804. The spacer material 902 can be patterned using, for example, a wet etch or a dry etch. In some embodiments of the invention, the spacer material is selectively removed using a RIE to form the side walls spacers 1002. In this manner, a surface of the nanosheet stack is exposed. In some embodiments of the invention, exposed portions of the nanosheet stack (e.g., the semiconductor layer 602 and the sacrificial layers 208) are removed selective to the spacer material 902 and/or the first sacrificial layer 202.

FIGS. 11A and 11B depict cross-sectional views of the "X-FET" type semiconductor structure 200 during an intermediate operation of a method of fabricating a semiconductor device according to one or more embodiments of the invention. As illustrated in FIGS. 11A and 11B, the sacrificial layers 208 are recessed and replaced with inner spacers 1102. The sacrificial layers 208 can be recessed using a wet etch or a dry etch. In some embodiments of the invention, the sacrificial layers 208 are recessed selective to the semiconductor layers 206. For example, sacrificial layers 208 made of silicon germanium can be etched selective to semiconductor layers 206 made of silicon using a wet hydrophosphoric acid-based etchant or dry HCl or $ClF_3$ gas etchant. In some embodiments of the invention, the sacrificial layers 208 are recessed to a depth selected such that the thickness of the inner spacers 1102 is the same as the thickness of the spacers 1002.

In some embodiments of the invention, the inner spacers 1102 are formed by a conformal deposition (e.g., CVD or ALD) to plug the recesses formed in the sacrificial layers 208, followed by an etch back process to remove any excessive material. The inner spacers 1102 can be made of any suitable material, such as, for example, a low-k dielectric, a nitride, silicon nitride, silicon oxide, SiON, SiC, SiOCN, or SiBCN.

FIGS. 12A and 12B depict cross-sectional views of the "X-FET" type semiconductor structure 200 during an intermediate operation of a method of fabricating a semiconductor device according to one or more embodiments of the invention. As illustrated in FIGS. 12A and 12B, source/drain (S/D) regions 1202 can be formed on a surface of the bottom isolation layer 902 and on opposite ends of each nanosheet stack. In some embodiments of the invention, the S/D regions 1202 are epitaxially grown from the exposed ends of the fin/nanosheet stack (i.e., the semiconductor layers 206).

The S/D regions 1202 can be epitaxially formed by a variety of methods, such as, for example, in-situ doped epitaxy, doped following the epitaxy, or by implantation and plasma doping. In some embodiments of the invention, epitaxial regions are epitaxially grown over a surface of the substrate 204. The S/D regions 1202 can be epitaxial semiconductor materials grown from gaseous or liquid precursors, as described previously herein. The S/D regions 1202 can be doped with n-type dopants (e.g., phosphorus or arsenic) or p-type dopants (e.g., boron or gallium). The dopant concentration in the S/D regions 1202 can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

FIGS. 13A and 13B depict cross-sectional views of the "X-FET" type semiconductor structure 200 during an intermediate operation of a method of fabricating a semiconductor device according to one or more embodiments of the invention. As illustrated in FIGS. 13A and 13B, a dielectric layer 1302 is formed over the S/D regions 1202 and between the spacers 1002. The dielectric layer 1302 can be formed using, for example, a CVD, FCVD, PECVD, UHVCVD, RTCVD, MOCVD, LPCVD, LRPCVD, ALD, PVD, chemical solution deposition, or other like process. The dielectric layer 1302 can be made of any suitable material, such as, for example, a low-k dielectric, a nitride, silicon nitride, silicon oxide, SiON, SiC, SiOCN, or SiBCN. In some embodiments of the invention, the dielectric layer 1302 is an oxide, such as silicon oxide.

In some embodiments of the present invention, the dielectric layer 1302 is overfilled and then planarized to a top surface of the sacrificial gate 804 using, for example, a CMP process. In some embodiments of the invention, the hard mask 806 and the second hard mask 808 are removed during the CMP process.

Figure 14B:
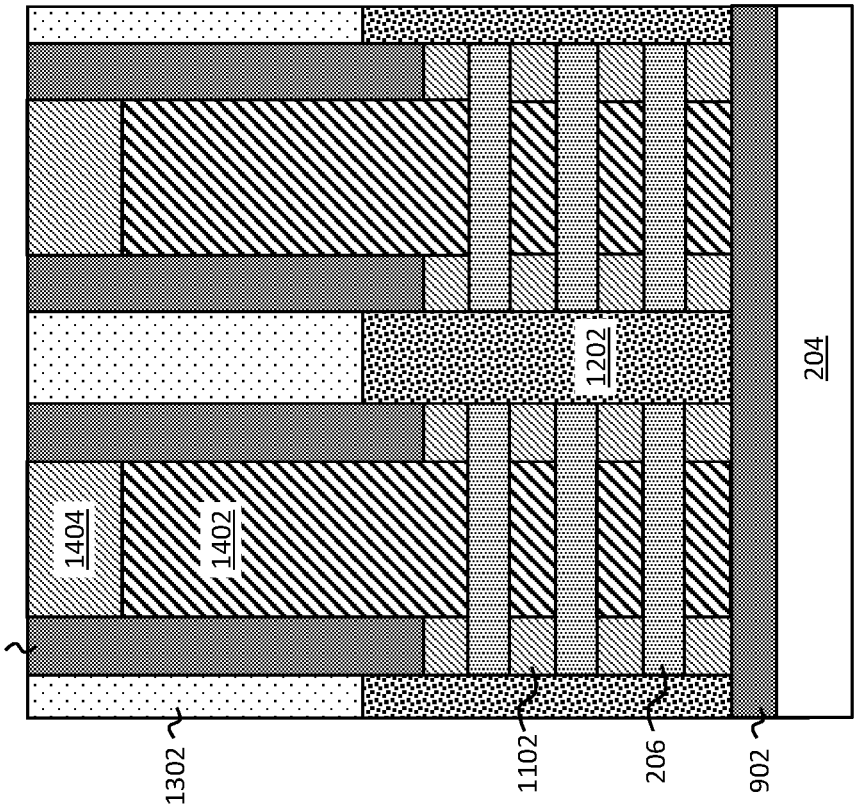
FIG. 14B depicts a cross-sectional view of the X-FET semiconductor structure after processing operations according to one or more embodiments of the invention.
Figure 14A:
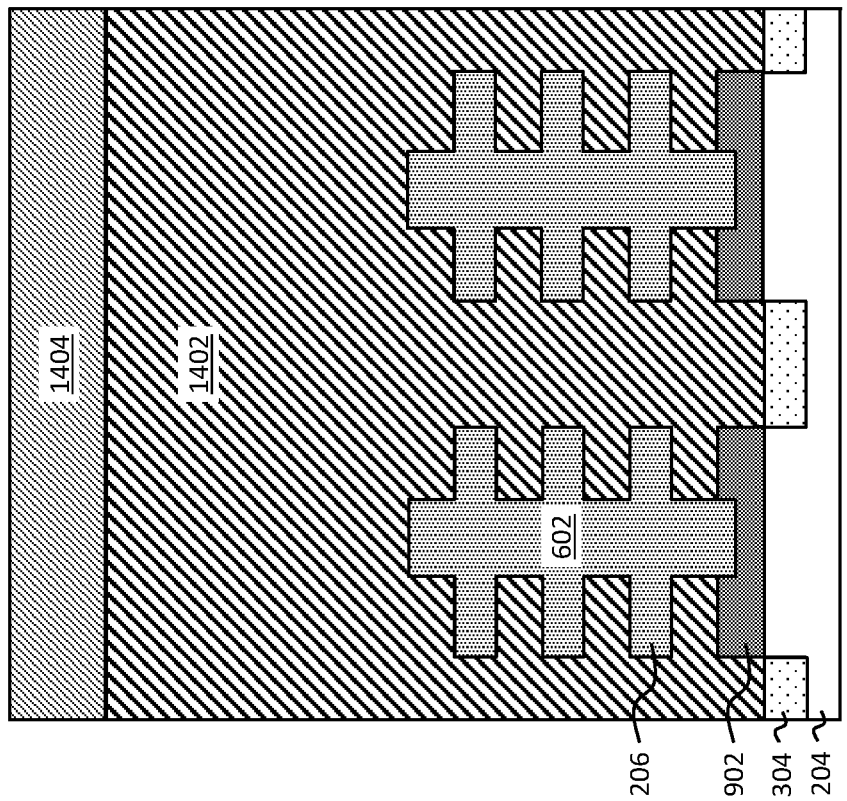
FIG. 14A depicts a cross-sectional view of the X-FET semiconductor structure after processing operations according to one or more embodiments of the invention.

FIGS. 14A and 14B depict cross-sectional views of the "X-FET" type semiconductor structure 200 during an intermediate operation of a method of fabricating a semiconductor device according to one or more embodiments of the invention. As illustrated in FIGS. 14A and 14B, the sacrificial gate 804, the dielectric liner 802, and the sacrificial layers 208 can be removed and replaced by a conductive gate 1402 during a replacement metal gate (RMG) process. The sacrificial gate 804, the dielectric liner 802, and the sacrificial layers 208 can be removed using known RMG processes. In some embodiments of the invention, the sacrificial gate 804 is removed using an amorphous silicon or polysilicon pull. In some embodiments of the invention, the dielectric liner 802 is removed using an oxide etch.

In some embodiments of the invention, the sacrificial layers 208 are removed selective to the semiconductor layers 206 and/or the semiconductor layer 602. The sacrificial layers 208 can be removed using a wet etch or a dry etch. In some embodiments of the invention, sacrificial layers 208 made of silicon germanium can be removed selective to semiconductor layers 206 and 602 made of silicon using a wet hydrophosphoric acid-based etchant or dry HCl or ClF$_3$ gas etchant. In some embodiments of the invention, the sacrificial layers 208 are removed prior to forming the conductive gate 1402.

The conductive gate 1402 can be a high-k metal gate (HKMG) formed using, for example, known RMG processes. In some embodiments of the invention, the conductive gate 1402 is a replacement metal gate stack formed between the spacers 1002. The replacement metal gate stack can include a high-k dielectric material, a work function metal stack, and a bulk gate material.

In some embodiments of the invention, the high-k dielectric film (not depicted) is formed over an exposed surface of the nanosheet stack. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, one or more work function layers (not depicted), sometimes referred to as a work function metal stack) are formed between the high-k dielectric film and the bulk gate material. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to further modify the work function of the conductive gate 1402 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments of the invention, a bulk gate material is deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination), conductive carbon, graphene, or any suitable combination of these materials. The conductive material can further include dopants that are incorporated during or after deposition.

In some embodiments of the invention, a gate hard mask 1404 (sometimes referred to as a Self-Aligned Contact cap, or SAC cap), is formed over a surface of the conductive gate 1402. The gate SAC cap 1404 can be made of any suitable material, such as, for example, a nitride, silicon nitride, silicon oxide, SiON, SiC, SiOCN, or SiBCN. In some embodiments of the invention, the gate SAC cap 1404 includes silicon nitride. In some embodiments of the invention, the gate SAC cap 1404 is formed to a thickness of 30 nm, although other thicknesses are within the contemplated scope of the invention.

As depicted in FIG. 14A, the conductive gate 1402 can contact exposed surfaces of the semiconductor layers 206 and the semiconductor layer 602. In this manner, the semiconductor layers 206 and the semiconductor layer 602 together define a "X-FET" type channel region between the S/D regions 1202. The channel region includes a vertical fin (e.g., the semiconductor layer 602) and one or more vertically stacked nanosheets (e.g., the semiconductor layers 206). In some embodiments of the invention, the conductive gate 1402 is in direct contact (notwithstanding any intervening high-k or work function layers) with a sidewall of the vertical fin and a top and bottom surface of each of the one or more nanosheets.

Figure 15A:
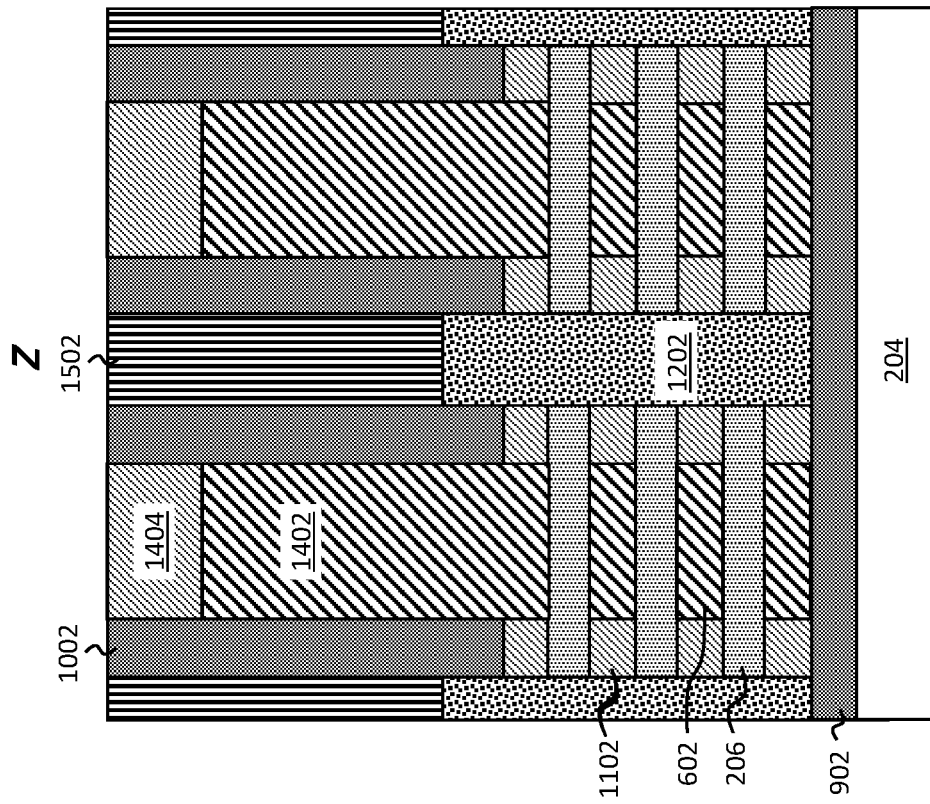
FIG. 15A depicts a cross-sectional view of the X-FET semiconductor structure after processing operations according to one or more embodiments of the invention.
Figure 15B:
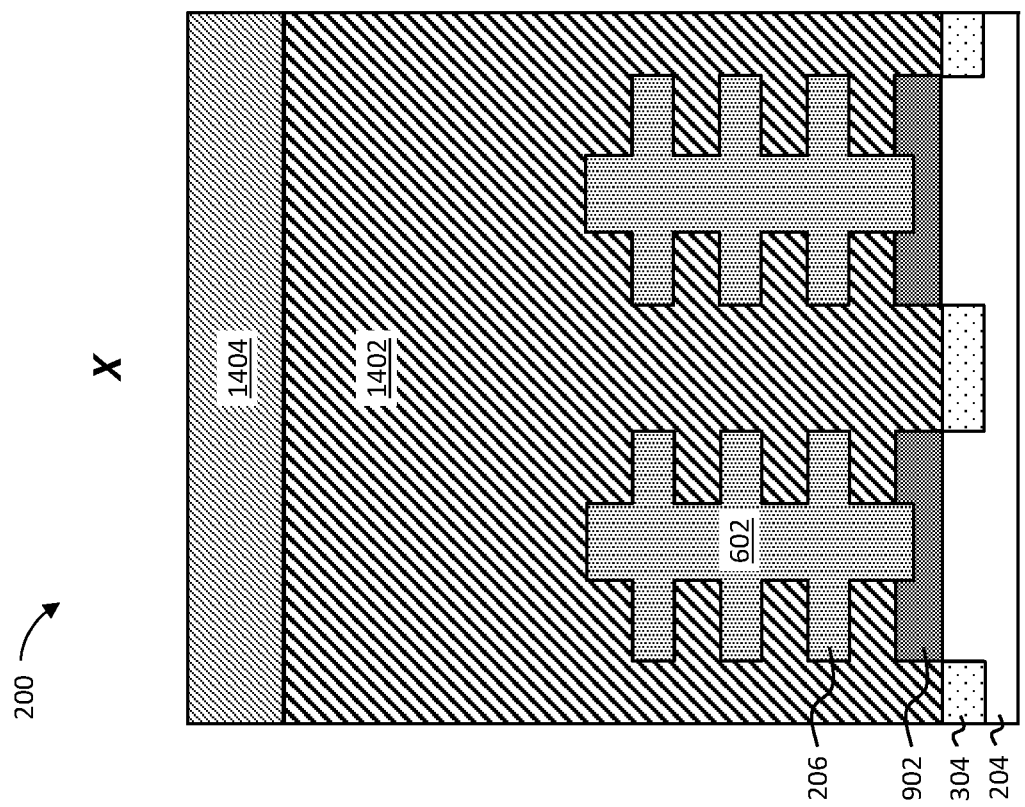

FIGS. 15A and 15B depict cross-sectional views of the "X-FET" type semiconductor structure 200 during an intermediate operation of a method of fabricating a semiconductor device according to one or more embodiments of the invention. As illustrated in FIGS. 15A and 15B, trench contacts 1502 can be formed after removing the dielectric layer 1302. The trench contacts 1502 can be formed over the S/D regions 1202 using known metallization techniques. In some embodiments of the invention, the trench contacts 1502 are formed using a self-aligned anisotropic RIE etch whereby the dielectric layer 1302 is etched selective to the gate SAC Cap 1404 and the spacers 1002. It is understood that contacts can be formed over each of the source or drain regions (sometimes referred to as S/D contacts) and over a surface of the conductive gate 1402 (sometimes referred to as a gate contact).

The trench contacts 1502 can be of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. The conductive material can further include dopants that are incorporated during or after deposition. In some embodiments of the invention, the contacts can be copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

FIGS. 16A-19B depict cross-sectional views of a "GAA X-FET" type semiconductor structure 1600 during an intermediate operation of a method of fabricating a semiconductor device according to one or more embodiments of the invention. As depicted in FIGS. 16A and 16B, a partially fabricated semiconductor device can include a first sacrificial layer 1602 formed over a substrate 1604.

The first sacrificial layer 1602 and the substrate 1604 can be made of a same material and in a similar manner as the first sacrificial layer 202 and the substrate 204, respectively, as depicted in FIG. 2B. In some embodiments of the invention, the germanium concentration in the first sacrificial layer 1602 is selected to ensure etch selectivity against any silicon, silicon germanium or germanium layers in the subsequently formed gate stack. In some embodiments of the invention, the germanium concentration in the first sacrificial layer 1602 is at least 30 percent higher than any other silicon germanium layers in the stack. In some embodiments of the invention, the first sacrificial layer 1602 can include a germanium concentration of 45 to 70 percent, for example 50 percent, although other germanium concentrations are within the contemplated scope of the invention.

In some embodiments of the invention, a stack of one or more semiconductor layers 1606 alternating with one or more sacrificial layers 1608 is formed over the first sacrificial layer 1602. The stack can be formed such that the topmost layer and bottommost layer of the stack are sacrificial layers. While depicted as a stack having three semiconductor layers alternating with four sacrificial layers for ease of illustration, it is understood that the stack can include any number of semiconductor layers alternating with a corresponding number of sacrificial layers. For example, the stack can include two semiconductor layers alternating with three sacrificial layers. The semiconductor layers 1606 and the sacrificial layers 1608 can be made of a same material and in a similar manner as the semiconductor layers 206 and the sacrificial layers 208, respectively, as depicted in FIG. 2B.

Each of the semiconductor layers 1606 can have a height ranging from 4 nm to 20 nm, for example, from 7 nm to 10 nm. In some embodiments of the invention, the semiconductor layers 1606 have a height of about 9 nm. The semiconductor layers 1606 can be made of any suitable semiconductor channel material, such as, for example, monocrystalline Si, III-V compound semiconductor, or II-VI compound semiconductor. In some embodiments of the invention, the semiconductor layers 1606 are made of silicon.

Each of the sacrificial layers 1608 can have a height ranging from 6 nm to 40 nm, for example, from 8 nm to 20 nm. In some embodiments of the invention, each of the sacrificial layers 1608 has a same height. In some embodiments of the invention, some of the sacrificial layers 1608 have a different height. For example, in some embodiments of the invention, the bottommost sacrificial layer has a height of about 10 nm, the topmost sacrificial layer has a height of about 10 nm, and the remaining (e.g., center) sacrificial layers have a height of about 20 nm. In some embodiments of the invention, the sacrificial layers 1608 are made of silicon germanium. In some embodiments of the invention, the sacrificial layers 1608 include a germanium concentration of 15 to 35 percent, for example 25 percent, although other germanium concentrations are within the contemplated scope of the invention.

Figure 17B:
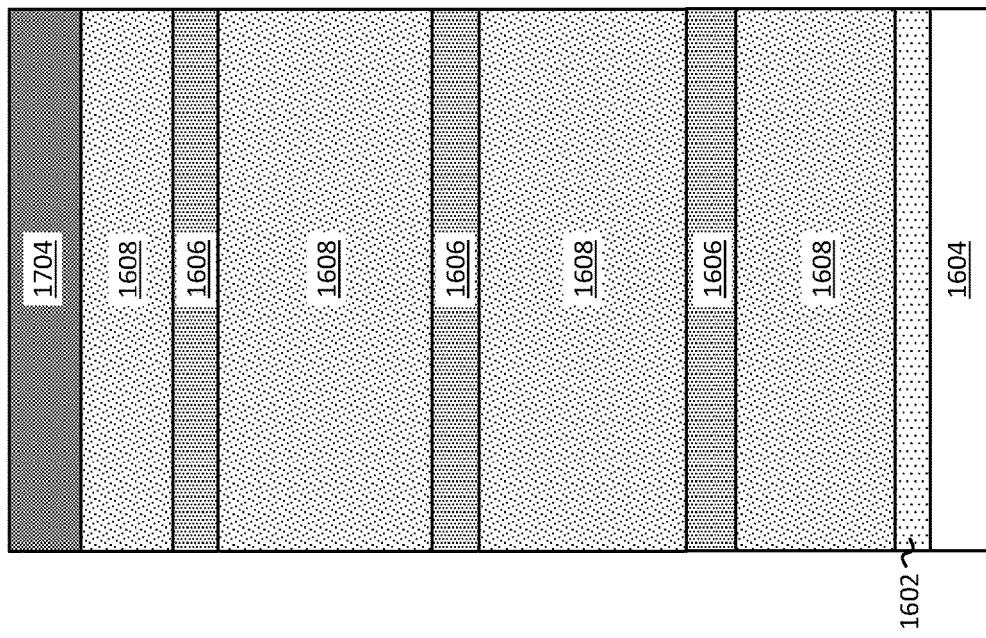
FIG. 17B depicts a cross-sectional view of the GAA X-FET semiconductor structure after processing operations according to one or more embodiments of the invention.
Figure 17A:
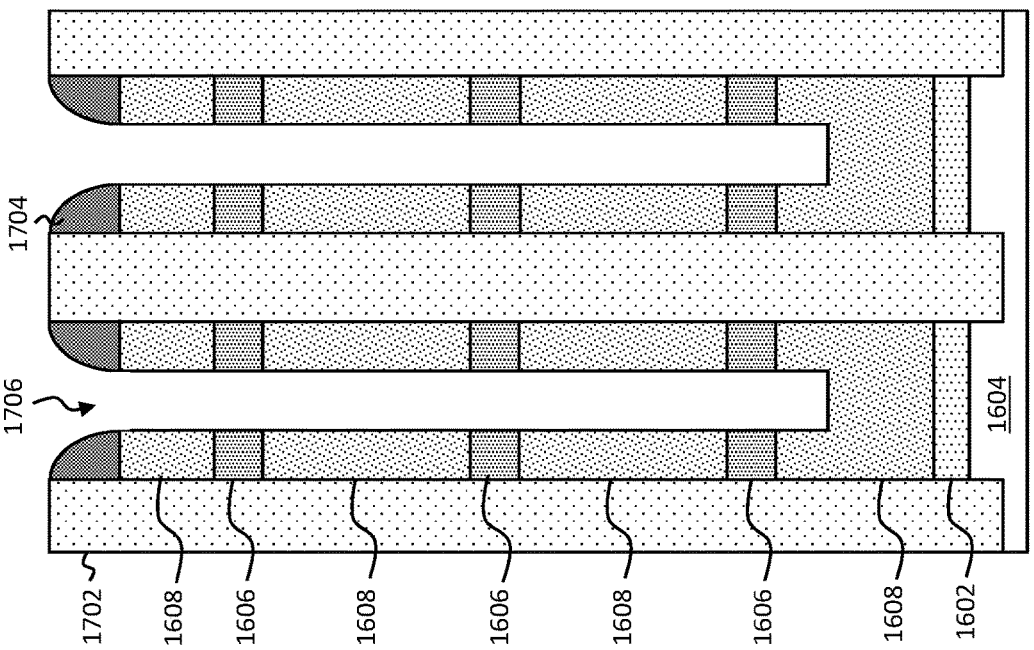
FIG. 17A depicts a cross-sectional view of the GAA X-FET semiconductor structure after processing operations according to one or more embodiments of the invention.

FIGS. 17A and 17B depict cross-sectional views of the "GAA X-FET" type semiconductor structure 1600 during an intermediate operation of a method of fabricating a semiconductor device according to one or more embodiments of the invention. As depicted in FIGS. 17A and 17B, a STI 1702 is formed over the substrate 1604 to electrically isolate one or more semiconductor fins. The STI 1702 can be made of a similar material and formed using a similar process as the STI 304 depicted in FIG. 3A.

In some embodiments of the invention, fin spacers 1704 are formed over the topmost sacrificial layer of the sacrificial layers 1608 and between the exposed sidewalls of the STI 1702. The fin spacers 1704 can be made of a similar material and formed using a similar process as the fin spacers 402 depicted in FIG. 4A. The fin spacers 1704 can be formed to a thickness of about 5 to 10 nm, for example 5 nm, although other thicknesses are within the contemplated scope of the invention.

In some embodiments of the invention, portions of the semiconductor layers 1606 and sacrificial layers 1606 that are not covered by the fin spacers 1704 are removed to form a trench 1706. In some embodiments of the invention, the trench 1706 exposes one or more surfaces of the bottommost sacrificial layer of the sacrificial layers 1608. In some embodiments of the invention, the patterning process can result in a recessing of the bottommost sacrificial layer of the sacrificial layers 1608. In some embodiments of the invention, the semiconductor layers 1606 and sacrificial layers 1608 are patterned into nanosheets having a width of 5 nm, although other widths are within the contemplated scope of the invention.

FIGS. 18A and 18B depict cross-sectional views of the "GAA X-FET" type semiconductor structure 1600 during an intermediate operation of a method of fabricating a semiconductor device according to one or more embodiments of the invention. As depicted in FIGS. 18A and 18B, alternating semiconductor layers 1802 and sacrificial layers 1804 are formed within the trench 1706. In some embodiments of the invention, the semiconductor layers 1802 and sacrificial layers 1804 are formed using a bottom-up trench epitaxy process whereby each layer is successively epitaxially grown on the preceding layer within the trench.

The semiconductor layers 1802 and sacrificial layers 1804 can be formed by a variety of methods. In some embodiments of the invention, epitaxial semiconductor materials can be grown in the trench 1706 using VPE, MBE, LPE, or other suitable processes. The semiconductor layers 1802 can be made of a similar material as the semiconductor layers 1606. The sacrificial layers 1804 can be made of a similar material as the sacrificial layers 1608.

In some embodiments of the invention, the height of each of the semiconductor layers 1802 is the same as the width of each of the corresponding semiconductor layers 1606. In other words, if the semiconductor layers 1606 are epitaxially grown to a width of 15 nm, the semiconductor layers 1802 can be epitaxially grown to a height of 15 nm, although other widths and corresponding thicknesses are within the contemplated scope of the invention.

Figure 19B:
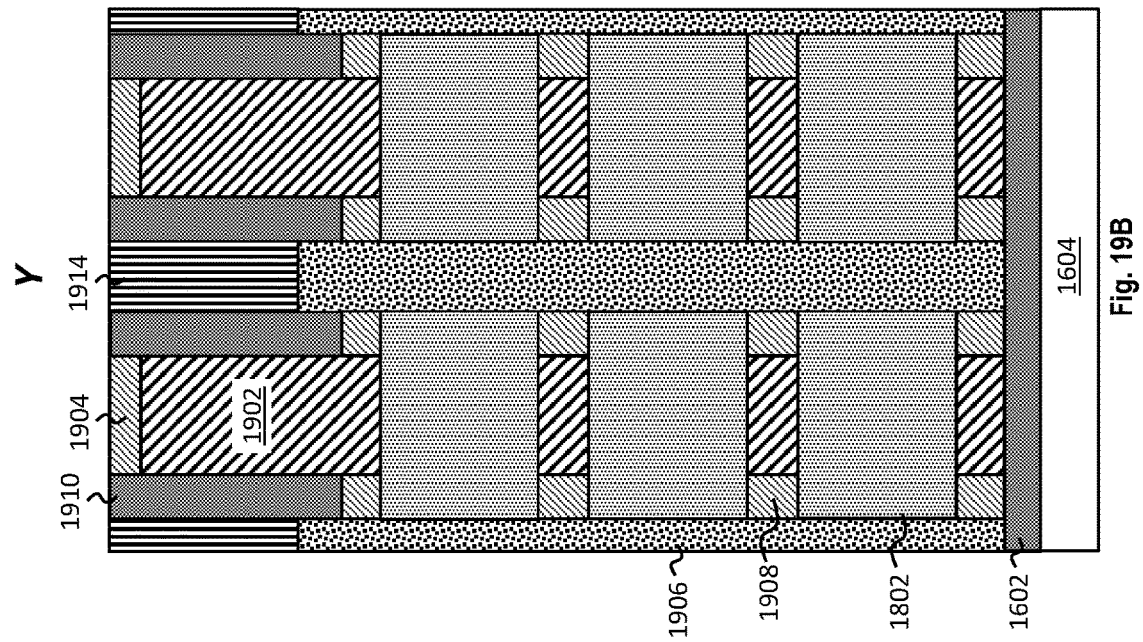
FIG. 19B depicts a cross-sectional view of the GAA X-FET semiconductor structure after processing operations according to one or more embodiments of the invention.
Figure 19A:
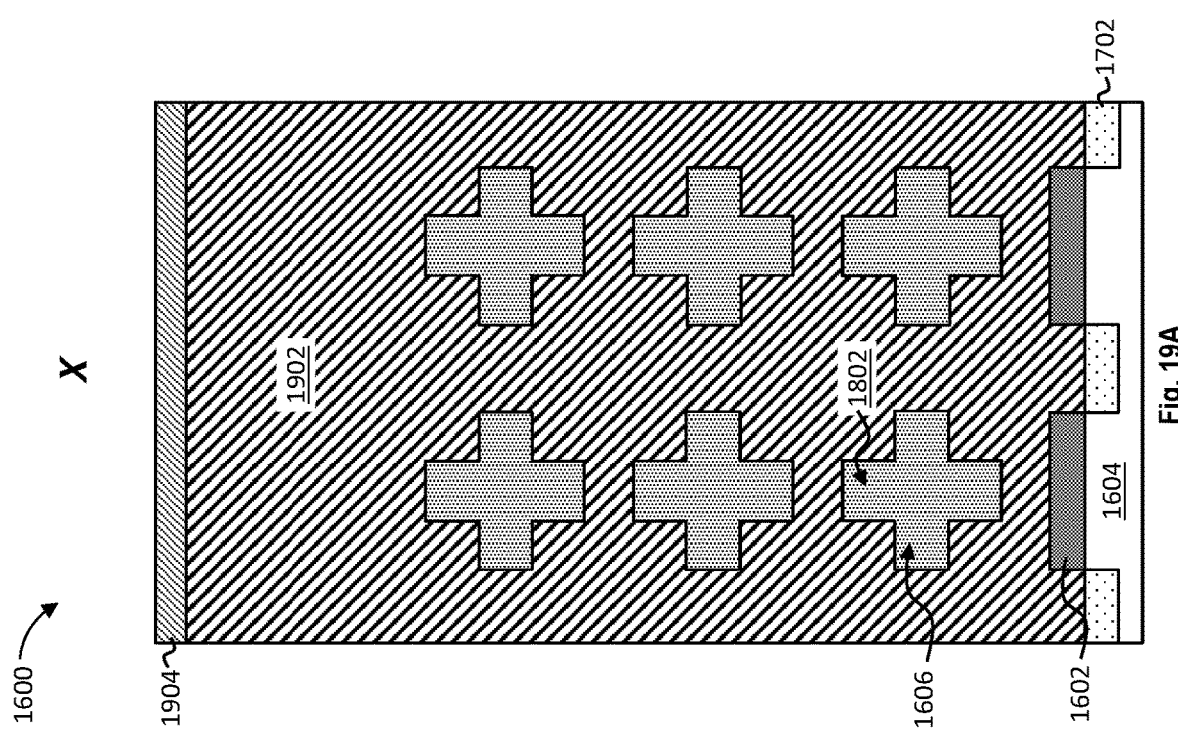
FIG. 19A depicts a cross-sectional view of the GAA X-FET semiconductor structure after processing operations according to one or more embodiments of the invention.

FIGS. 19A-19C depict cross-sectional views of the "GAA X-FET" type semiconductor structure 1600 during an intermediate operation of a method of fabricating a semiconductor device according to one or more embodiments of the invention. The "GAA X-FET" type semiconductor structure 1600 can be substantially completed in a similar manner as the "X-FET" type semiconductor structure 200 depicted in FIGS. 2A-15B.

As depicted in FIGS. 19A-19C, the "GAA X-FET" type semiconductor structure 1600 includes a conductive gate 1902, a SAC cap 1904, S/D regions 1906, inner spacers 1908, gate spacers 1910, a dielectric layer 1912, and contacts 1914. Each of these features can be made of a similar material and by a substantially similar method as the corresponding feature in the "X-FET" type semiconductor structure 200 depicted in FIGS. 2A-15B.

As depicted in FIG. 19A, the conductive gate 1902 is deposited on the exposed surfaces of the semiconductor layers 1606 and the semiconductor layers 1802. In this manner, the semiconductor layers 1606 and the semiconductor layers 1802 together define a "GAA X-FET" type channel region between the S/D regions 1906. The channel region includes one or more vertical fins (e.g., the semiconductor layers 1802) and one or more vertically stacked nanosheets (e.g., the semiconductor layers 1606). In some embodiments of the invention, a high-k dielectric (not depicted) of the conductive gate 1902 is in direct contact with a sidewall of the vertical fin and a top and bottom surface of each of the one or more nanosheets.

FIGS. 20-28 depict cross-sectional views of an "X-FET" type semiconductor structure 2000 during an intermediate operation of a method of fabricating a semiconductor device according to one or more embodiments of the invention. As depicted in FIG. 20, a partially fabricated semiconductor device can include a first sacrificial layer 2002 formed over a substrate 2004.

Figure 29A:
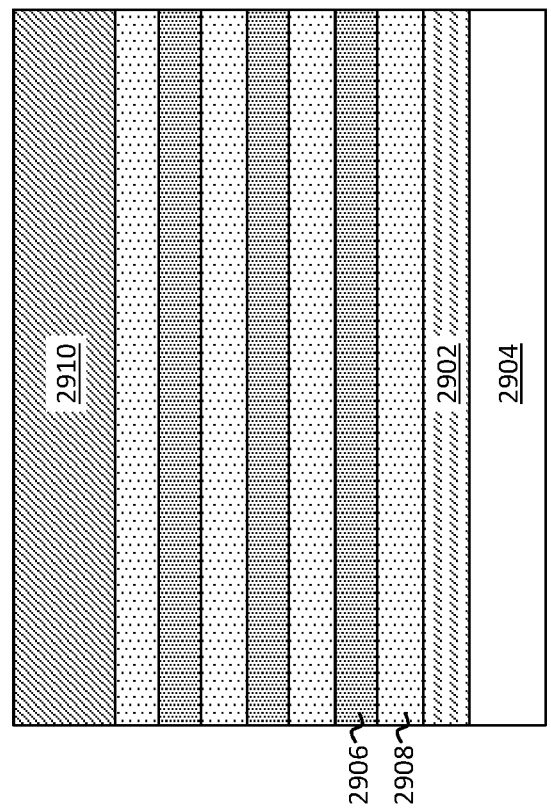
Figure 29B:
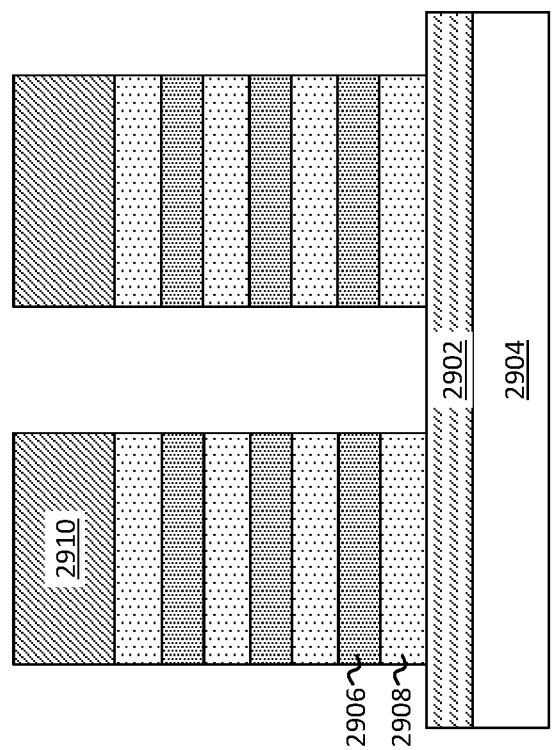
FIG. 29B depicts a cross-sectional view of the X-FET semiconductor structure after processing operations according to one or more embodiments of the invention.

The first sacrificial layer 2002 and the substrate 2004 can be made of a same material and in a similar manner as the first sacrificial layer 202 and the substrate 204, respectively, as depicted in FIG. 2B. In some embodiments of the invention, a semiconductor layer 2006 is formed over the first sacrificial layer 2002. The semiconductor layer 2006 can be made of a same material and in a similar manner as the semiconductor layer 206 depicted in FIG. 2B. In some embodiments of the invention, the thickness of the semiconductor layer 2006 is greater than the thickness of the semiconductor layer 206, because the semiconductor layer 2006 defines the final thickness (vertical height) of the channel region (as depicted in FIGS. 29A and 29B). In some embodiments of the invention, the thickness of the semiconductor layer 2006 is about 60 nm, although other thicknesses are within the contemplated scope of the invention.

In some embodiments of the invention, a hard mask 2008 can be formed on the semiconductor layer 2006. In some embodiments of the invention, the hard mask 2008 includes a nitride, such as silicon nitride. In some embodiments of the invention, the hard mask 2008 is formed to a thickness of 40 nm, although other thicknesses are within the contemplated scope of the invention. In some embodiments of the invention, a second hard mask (not depicted) can be formed on the hard mask 302, to form a bilayer hard mask. In some embodiments of the invention, the second hard mask includes an oxide, such as, for example, silicon dioxide.

In some embodiments of the invention, portions of the hard mask 2008 are removed (e.g., patterned) and the semiconductor layer 2006 and first sacrificial layer 2002 are patterned selective to the hard mask 2008. As illustrated in FIG. 20, portions of the semiconductor layer 2006 and first sacrificial layer 2002 that are not covered by the patterned hard mask 2008 can be removed using a wet etch, a dry etch, or a combination of sequential wet and/or dry etches.

In some embodiments of the invention, the semiconductor layer 2006 and first sacrificial layer 2002 are patterned into one or more fins having a width ranging from 10 to 50 nm, although other widths are within the contemplated scope of the invention. For ease of illustration, the stack is depicted as being patterned to form two fins. It is understood, however, that the stack be patterned into any number of parallel fins. In some embodiments of the invention, the pitch, or edge-to-edge spacing, between the fins is about 40 nm, although other spacings are within the contemplated scope of the invention.

Figure 21:
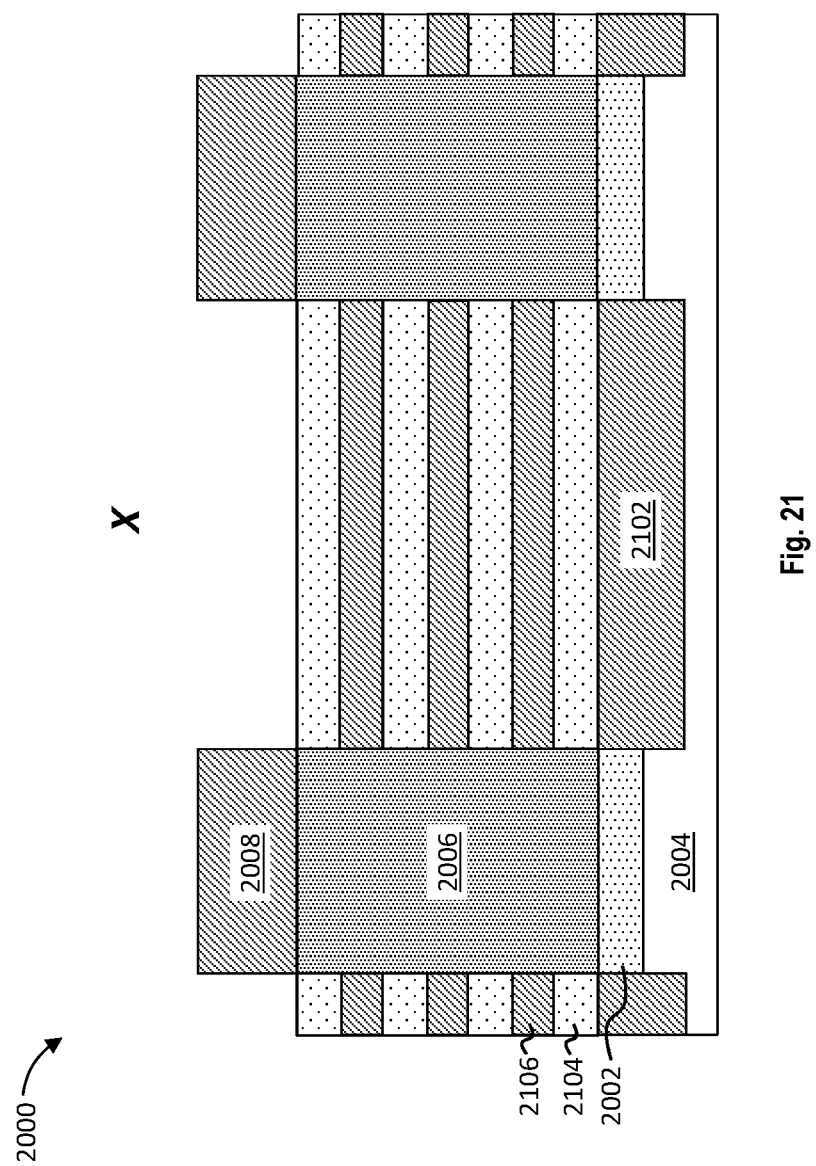

FIG. 21 depicts a cross-sectional view of the "X-FET" type semiconductor structure 2000 during an intermediate operation of a method of fabricating a semiconductor device according to one or more embodiments of the invention. As depicted in FIG. 21, a hard mask 2102 can be formed over a surface of the substrate 2004. The hard mask 2102 can be made of any suitable material, such as, for example, a low-k dielectric, a nitride, silicon nitride, silicon oxide, SiON, SiC, SiOCN, or SiBCN. In some embodiments of the invention, the hard mask 2102 includes silicon nitride. The hard mask 2102 can be formed to a thickness of about 20 to 100 nm, for example 70 nm, although other thicknesses are within the contemplated scope of the invention. In some embodiments of the invention, the hard mask 2102 is formed to a thickness sufficient to cover sidewalls of the first sacrificial layer 2002.

Figure 25:
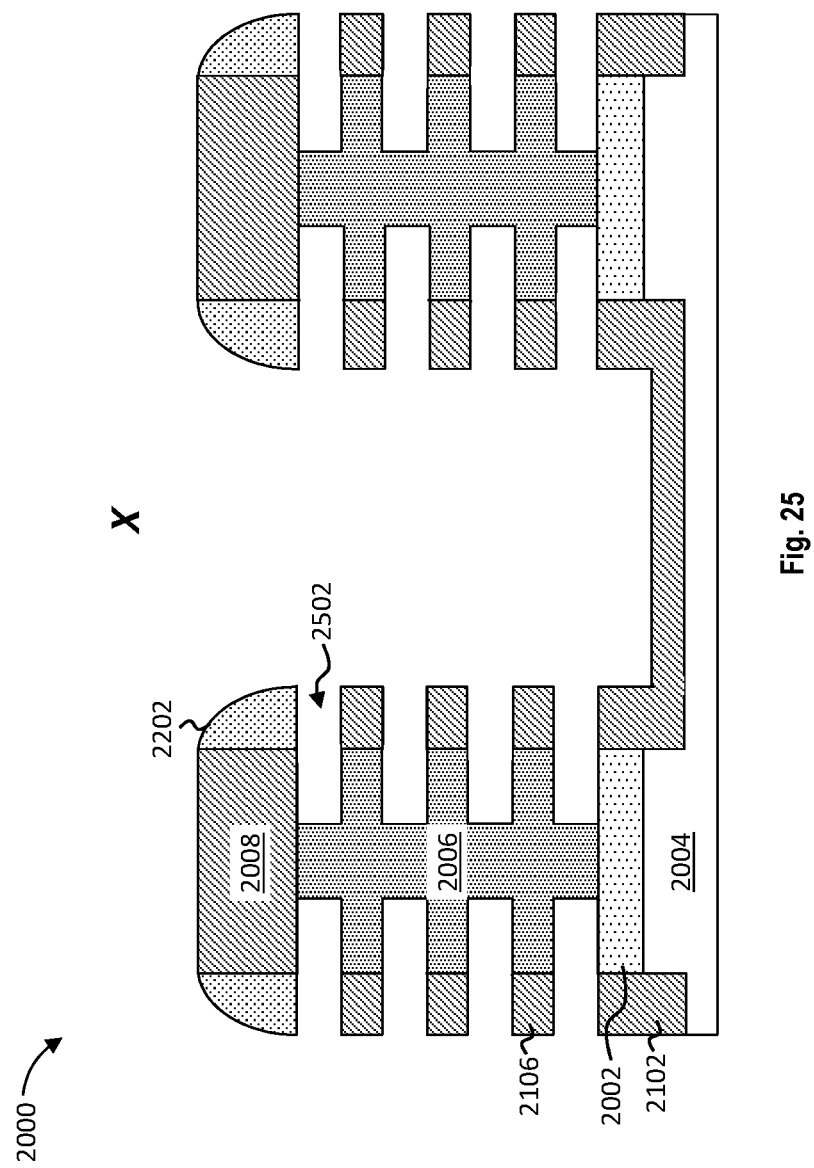

In some embodiments of the invention, a stack of one or more oxide layers 2104 alternating with one or more nitride layers 2106 is formed over the hard mask 2102. The stack can be formed such that the topmost and bottommost layer of the stack are oxide layers. While depicted as a stack having four oxide layers alternating with three nitride layers for ease of illustration, it is understood that the stack can include any number of oxide layers alternating with a corresponding number of nitride layers. For example, the stack can include two oxide layers alternating with a single nitride layer. The number of nitride layers 2106 defines the number of fins in the channel region (as depicted in FIG. 25).

Each of the oxide layers 2104 can have a height ranging from 6 nm to 20 nm, for example, from 8 nm to 15 nm. In some embodiments of the invention, the oxide layers 2104 have a height of about 8 nm. The oxide layers 2104 can be made of any suitable material, such as, for example, silicon oxide.

Each of the nitride layers 2106 can have a height ranging from 4 nm to 12 nm, for example, from 7 nm to 10 nm. In some embodiments of the invention, the nitride layers 2106 have a height of about 9 nm. The nitride layers 2106 can be made of any suitable material, such as, for example, silicon nitride.

The oxide layers 2104 and the nitride layers 2106 can be formed by anisotropic deposition. For example, each of the alternating oxide and nitride dielectric materials can be deposited over the hard mask 2102 using an HDP deposition plus isotropic etch back process that is cycled (i.e., repeated) "n" times.

Figure 22:
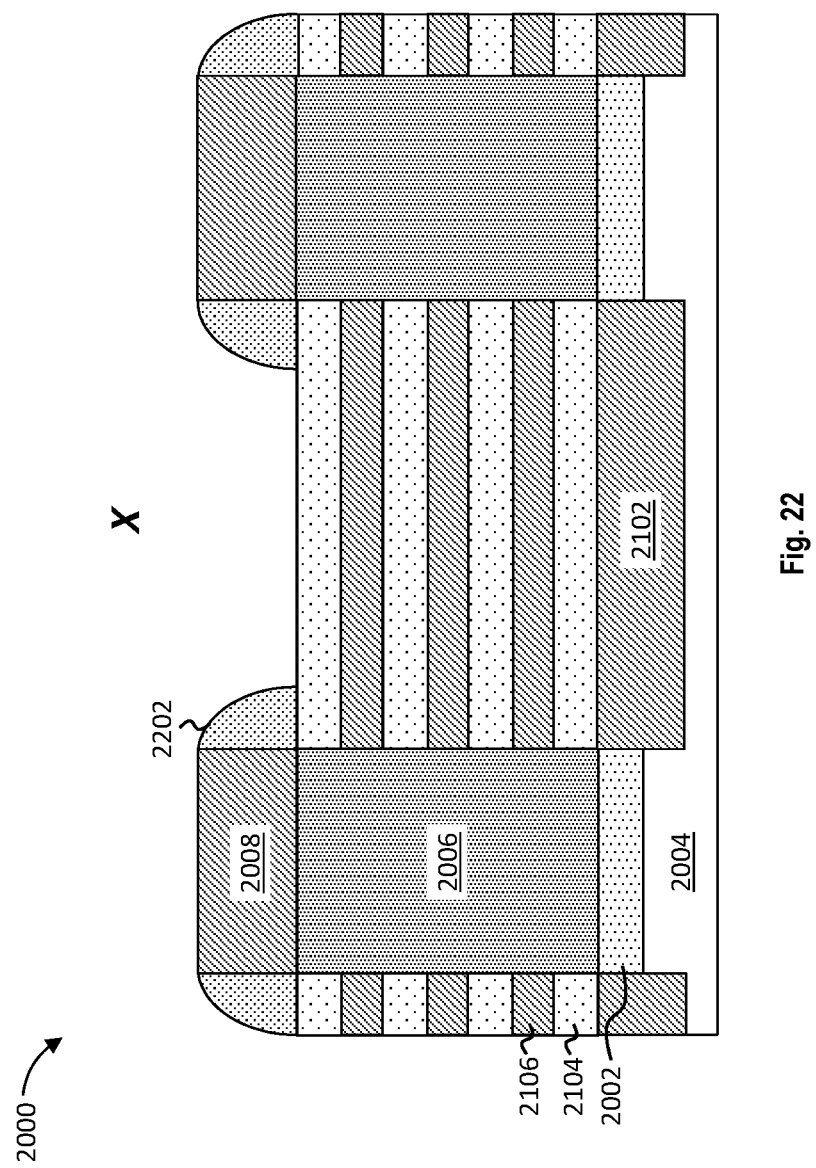

FIG. 22 depicts a cross-sectional view of the "X-FET" type semiconductor structure 2000 during an intermediate operation of a method of fabricating a semiconductor device according to one or more embodiments of the invention. As depicted in FIG. 22, spacers 2202 are formed over the topmost oxide layer of the oxide layers 2104 and on exposed sidewalls of the hard mask 2008. In some embodiments of the invention, the spacers 2202 are formed using a conformal deposition process such as CVD, PECVD, UHVCVD, RTCVD, MOCVD, LPCVD, LRPCVD, ALD, PVD, chemical solution deposition, or other like processes in combination with a wet or dry etch process. For example, spacer material can be conformally deposited over the semiconductor structure 2000 and selectively removed using a RIE to form the side walls spacers 2202. The spacers 2202 can be made of any suitable material, such as, for example, a low-k dielectric, a nitride, silicon nitride, silicon oxide, SiON, SiC, SiOCN, or SiBCN. In some embodiments of the invention, the spacers 2202 include SiC. The spacers 2202 can be formed to a thickness of about 5 to 10 nm, for example 5 nm, although other thicknesses are within the contemplated scope of the invention.

Figure 23:
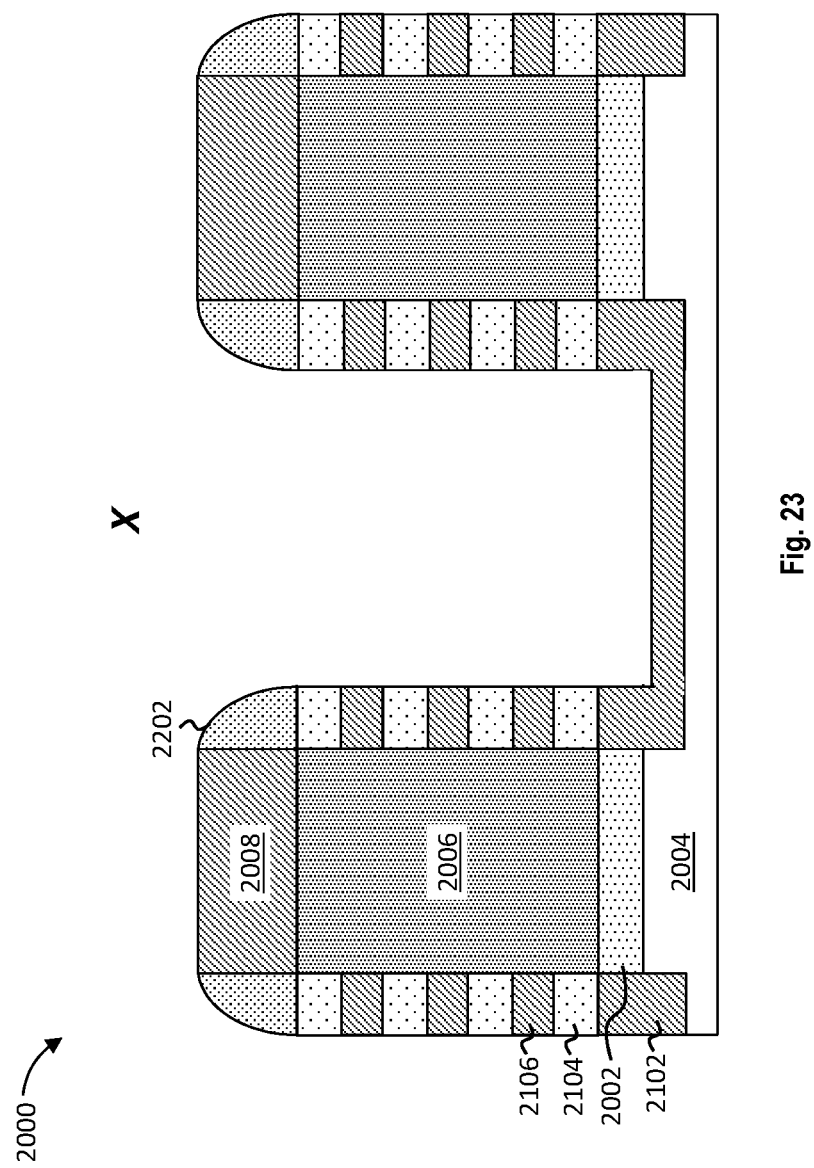

FIG. 23 depicts a cross-sectional view of the "X-FET" type semiconductor structure 2000 during an intermediate operation of a method of fabricating a semiconductor device according to one or more embodiments of the invention. As depicted in FIG. 23, portions of the oxide layers 2104, the nitride layers 2106, and the hard mask 2102 can be removed. The oxide layers 2104, the nitride layers 2106, and the hard mask 2102 can be removed using a wet etch, a dry etch, or a combination of sequential wet and/or dry etches. In some embodiments of the invention, the oxide layers 2104, the nitride layers 2106, and the hard mask 2102 can be removed using a RIE that stops in the hard mask 2102. In other words, the hard mask 2102 can be recessed. In this manner, remaining portions of the hard mask 2102 protect the substrate 2004 during downstream processing.

Figure 24:
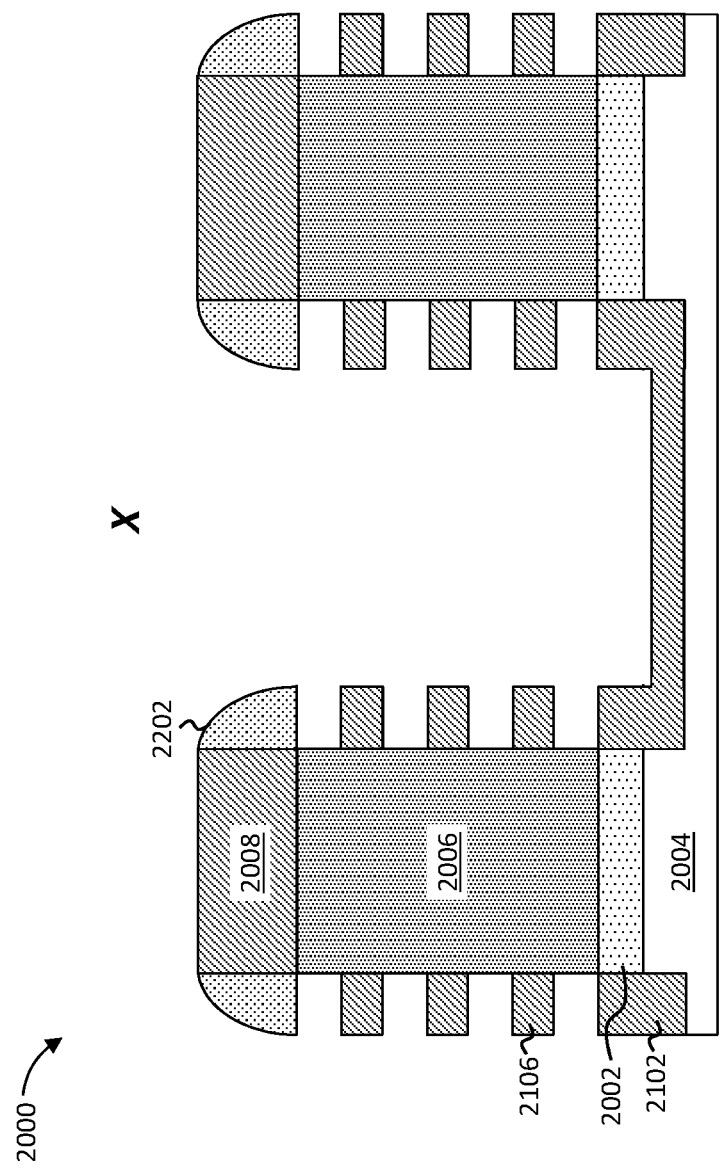

FIG. 24 depicts a cross-sectional view of the "X-FET" type semiconductor structure 2000 during an intermediate operation of a method of fabricating a semiconductor device according to one or more embodiments of the invention. As depicted in FIG. 24, the oxide layers 2104 can be removed to expose a sidewall of the semiconductor layer 2006. The oxide layers 2104 can be removed using a wet etch or a dry etch. In some embodiments of the invention, the oxide layers 2104 can be removed selective to the nitride layers 2106, the semiconductor layer 2006, and/or the spacers 2202.

FIG. 25 depicts a cross-sectional view of the "X-FET" type semiconductor structure 2000 during an intermediate operation of a method of fabricating a semiconductor device according to one or more embodiments of the invention. As depicted in FIG. 25, the semiconductor layer 2006 can be recessed laterally to form a recess 2502 exposing a surface of the first sacrificial layer 2002 and a surface of the hard mask 2008. In this manner, the semiconductor layer 2006 can be recessed to define a vertical portion (e.g., a vertical fin) and one or more horizontal portions (e.g., nanosheets). The semiconductor layer 2006 can be recessed using a wet etch or a dry etch. In some embodiments of the invention, the semiconductor layer 2006 can be recessed selective to the nitride layers 2106 and/or the spacers 2202. In some embodiments of the invention, remaining portions of the hard mask 2102 protect the substrate 2004 from etch back during this process.

Figure 26:
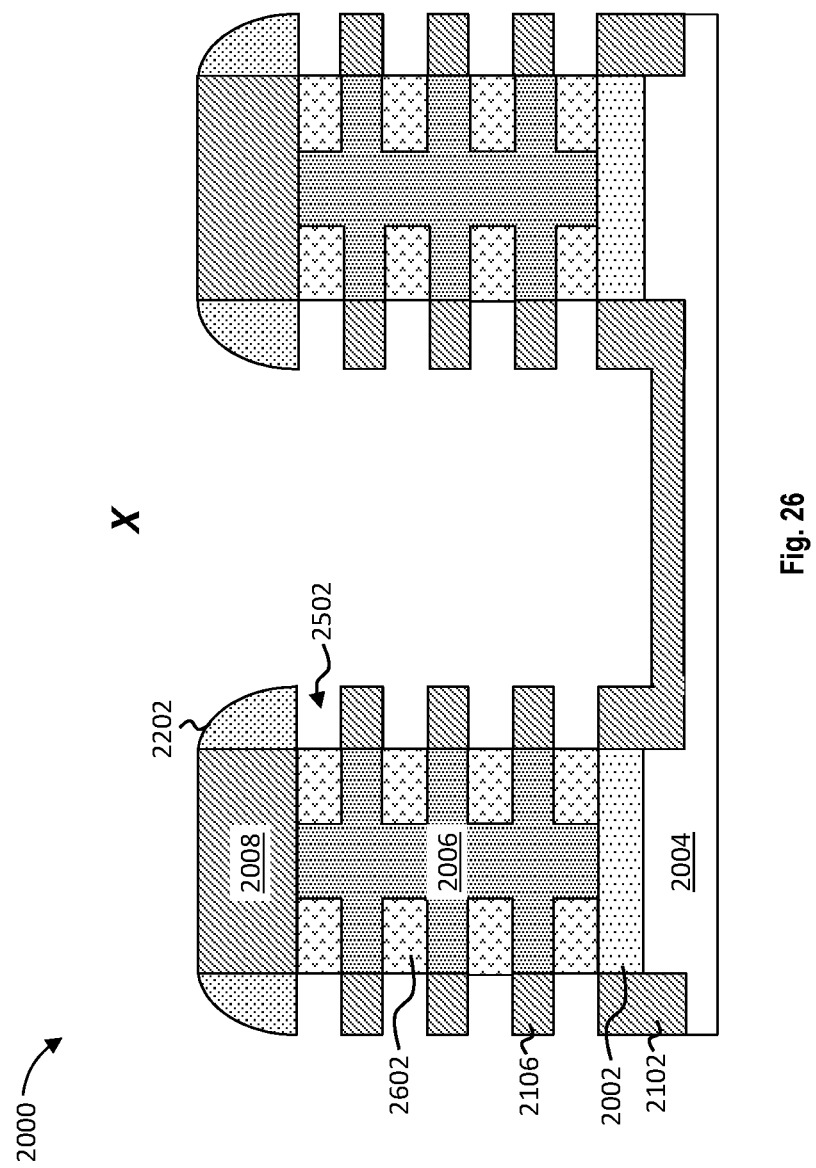

FIG. 26 depicts a cross-sectional view of the "X-FET" type semiconductor structure 2000 during an intermediate operation of a method of fabricating a semiconductor device according to one or more embodiments of the invention. As depicted in FIG. 26, sacrificial regions 2602 can be formed in the recess 2502. In some embodiments of the invention, the sacrificial regions 2602 partially fill the recess 2502. In some embodiments of the invention, a sidewall of the sacrificial regions 2602 is coplanar to a sidewall of the hard mask 2008.

In some embodiments of the invention, the sacrificial regions 2602 are made of silicon germanium. In some embodiments of the invention, the sacrificial regions 2602 include a germanium concentration of 15 to 45 percent, for example 25 percent, although other germanium concentrations are within the contemplated scope of the invention. In some embodiments of the invention, the sacrificial regions 2602 are epitaxially grown on expose surfaces of the semiconductor layer 2006. In some embodiments of the invention, remaining portions of the hard mask 2102 protect the substrate 2004 parasitic epitaxial growth during this process.

Figure 27:
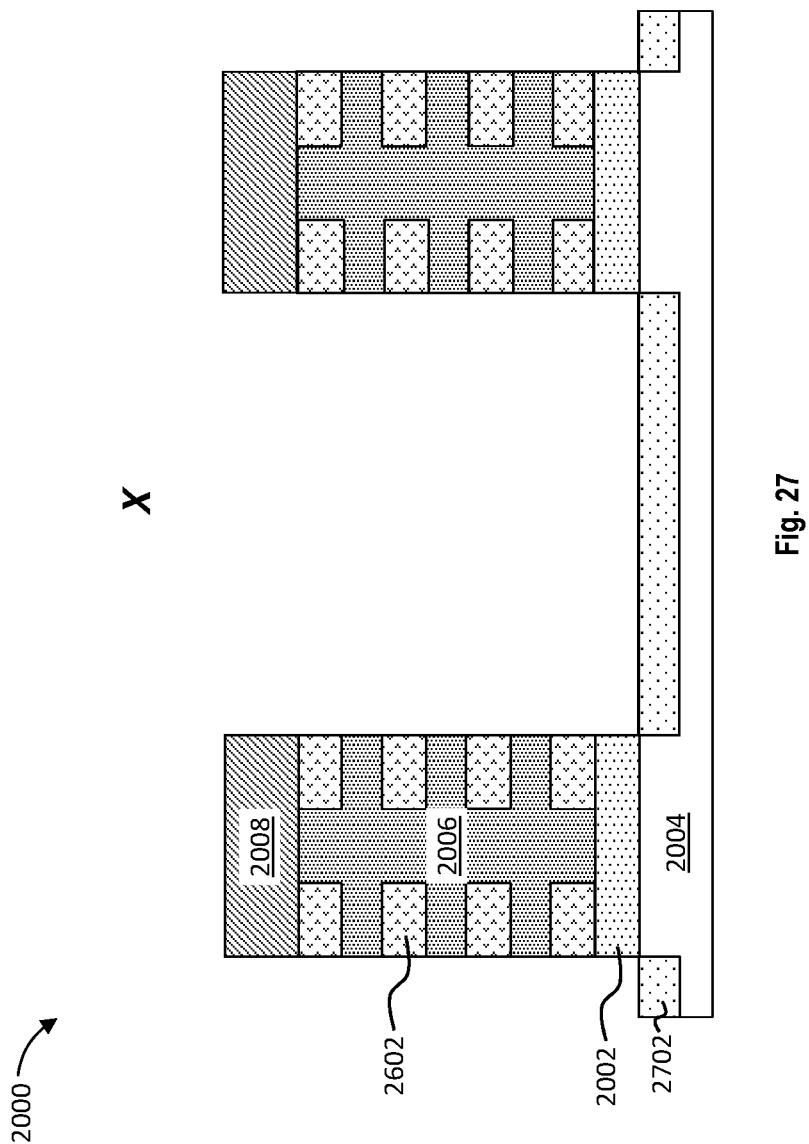

FIG. 27 depicts a cross-sectional view of the "X-FET" type semiconductor structure 2000 during an intermediate operation of a method of fabricating a semiconductor device according to one or more embodiments of the invention. As depicted in FIG. 27, the spacers 2202, the nitride layers 2106, and the hard mask 2102 can be removed. The spacers 2202, the nitride layers 2106, and the hard mask 2102 can be removed using a wet etch, a dry etch, or a combination of sequential wet and/or dry etches. In some embodiments of the invention, the spacers 2202, the nitride layers 2106, and the hard mask 2102 can be removed using a RIE or a nitride stripping process.

In some embodiments of the invention, a STI 2702 is formed over the substrate 2004 to electrically isolate one or more semiconductor fins. The STI 2702 can be any suitable dielectric material, such as, for example, a silicon oxide, and can be formed using any suitable process. The STI 2702 can be formed using, for example, CVD, FVCD, PECVD, UHVCVD, RTCVD, MOCVD, LPCVD, LRPCVD, ALD, PVD, HDP, chemical solution deposition, spin-on dielectrics, or other like processes. In some embodiments of the present invention, the STI 2702 is overfilled and then recessed using, for example, a chemical-mechanical planarization (CMP) process.

In some embodiments of the invention, the STI 2702 is recessed below a surface of the first sacrificial layer 2002. In this manner, the STI 2702 electrically isolates one or more nanosheets stacks. The STI 2702 can be recessed using, for example, chemical oxide removal (COR) or hydrofluoric acid (HF) wet etch. In some embodiments of the invention, the STI 2702 is recessed selective to the hard mask 2008.

Figure 28:
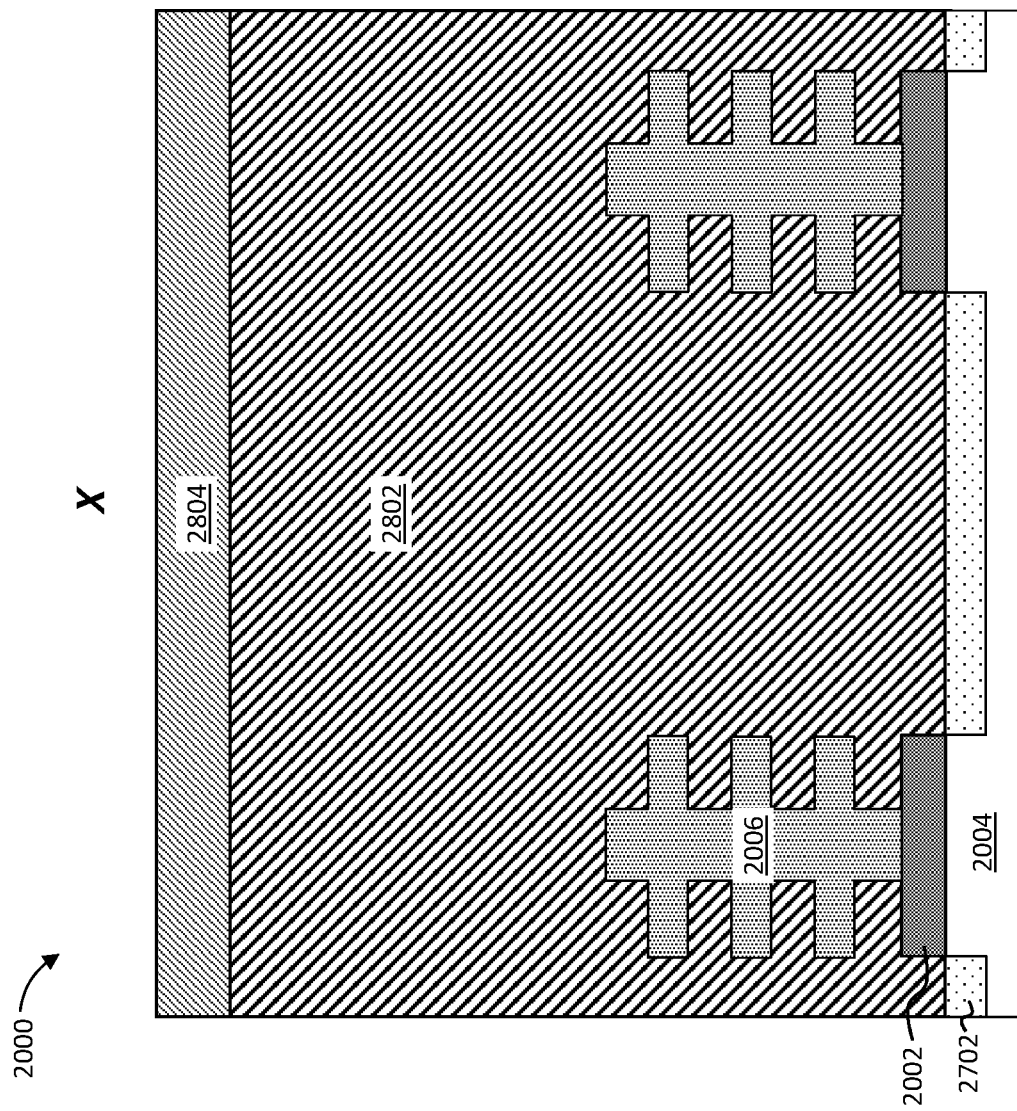

FIG. 28 depicts a cross-sectional view of the "X-FET" type semiconductor structure 2000 during an intermediate operation of a method of fabricating a semiconductor device according to one or more embodiments of the invention. The "X-FET" type semiconductor structure 2000 can be substantially completed in a similar manner as the "X-FET" type semiconductor structure 200 depicted in FIGS. 2A-15B.

As depicted in FIG. 28, the "X-FET" type semiconductor structure 2000 includes a conductive gate 2802 and a gate hard mask 2804. In some embodiments of the invention, the semiconductor structure 2000 further includes S/D regions, inner spacers, gate spacers, a dielectric layer, and contacts (not depicted). Each of these features can be made of a similar material and by a substantially similar method as the corresponding feature in the "X-FET" type semiconductor structure 200 depicted in FIGS. 2A-15B.

As depicted in FIG. 28, the conductive gate 2802 can be deposited over exposed surfaces of the semiconductor layer 2006. In this manner, the vertical portion (e.g., vertical fin) and horizontal portions (e.g., nanosheets) of the semiconductor layer 2006 define a "X-FET" type channel region between the S/D regions. In some embodiments of the invention, high-k dielectric layers of the conductive gate 2802 are in direct contact with a sidewall of the vertical fin and a top and bottom surface of each of the one or more nanosheets.

FIGS. 29A-31B depict cross-sectional views of a "X-FET" type semiconductor structure 2900 during an intermediate operation of a method of fabricating a semiconductor device according to one or more embodiments of the invention. As depicted in FIGS. 29A and 29B, a partially fabricated semiconductor device can include a buried oxide (BOX) layer 2902 formed over a substrate 2904. The BOX layer 2902 can be formed using known silicon-on-insulator (SOI) processes, and can include, for example, silicon dioxide or sapphire. The substrate 1604 can be made of a same material and in a similar manner as the substrate 204, as depicted in FIG. 2B.

In some embodiments of the invention, a stack of one or more first semiconductor layers 2906 alternating with one or more second semiconductor layers 2908 is formed over the BOX layer 2902. While depicted as a stack having three first semiconductor layers 2906 alternating with four second semiconductor layers 2908 for ease of illustration, it is understood that the stack can include any number of first semiconductor layers alternating with a corresponding number of second semiconductor layers. The first semiconductor layers 2906 and the second semiconductor layers 2908 can be formed in a similar manner as the semiconductor layers 206 and the sacrificial layers 208, respectively, as depicted in FIG. 2B. In some embodiments of the invention, the first semiconductor layers 2906 are made of silicon while the second semiconductor layers 2908 are made of silicon germanium.

Each of the first semiconductor layers 2906 can have a height ranging from 4 nm to 12 nm, for example, from 7 nm to 10 nm. In some embodiments of the invention, the first semiconductor layers 2906 have a height of about 8 nm. Each of the second semiconductor layers 2908 can have a height ranging from 6 nm to 40 nm, for example, from 8 nm to 20 nm. In some embodiments of the invention, each of the second semiconductor layers 2908 has a same height as the first semiconductor layers 2906. In some embodiments of the invention, the second semiconductor layers 2908 include a germanium concentration of 15 to 35 percent, for example 25 percent, although other germanium concentrations are within the contemplated scope of the invention.

In some embodiments of the invention, a hard mask 2910 can be formed on the topmost layer of the second semiconductor layers 2908. In some embodiments of the invention, the hard mask 2910 includes a nitride, such as silicon nitride. In some embodiments of the invention, the hard mask 2910 is formed to a thickness of 40 nm, although other thicknesses are within the contemplated scope of the invention. In some embodiments of the invention, a second hard mask (not depicted) can be formed on the hard mask 2910, to form a bilayer hard mask. In some embodiments of the invention, the second hard mask includes an oxide, such as, for example, silicon dioxide.

In some embodiments of the invention, portions of the hard mask 2910 are removed (e.g., patterned) and the stack of first semiconductor layers 2906 and second semiconductor layers 2908 is patterned selective to the hard mask 2910. Portions of the first semiconductor layers 2906 and the second semiconductor layers 2908 that are not covered by the patterned hard mask 2910 can be removed using a wet etch, a dry etch, or a combination of sequential wet and/or dry etches.

FIGS. 30A and 30B depict cross-sectional views of the "X-FET" type semiconductor structure 2900 during an intermediate operation of a method of fabricating a semiconductor device according to one or more embodiments of the invention. As depicted in FIGS. 30A and 30B, the second semiconductor layers 2908 are recessed to form one or more recesses 3002.

In some embodiments of the invention, the second semiconductor layers 2908 are recessed selective to the first semiconductor layers 2906. The second semiconductor layers 2908 can be recessed using any suitable process capable of removing a silicon germanium layer selective to a silicon layer or a silicon germanium layer having a lower germanium concentration. Example processes known to provide this etch selectivity include hydrophosphoric acid, HCl vapor phase chemistries and chlorine trifluoride ($ClF_3$) etches.

Figure 31B:
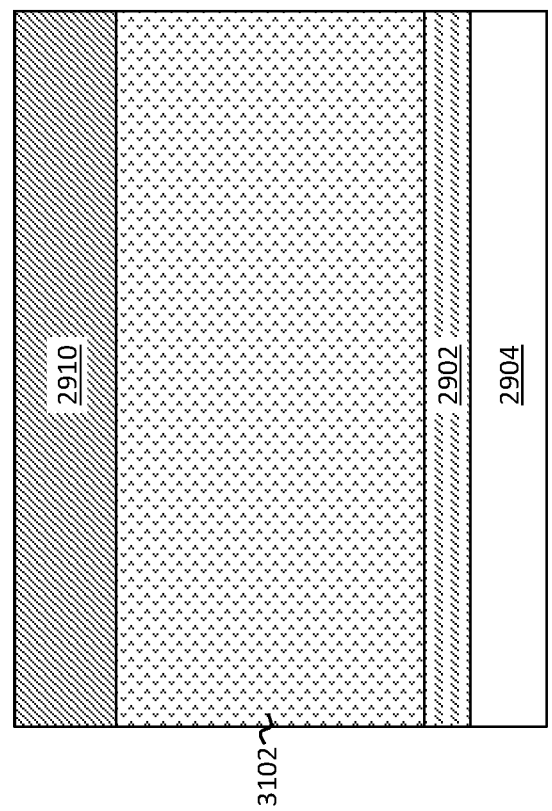
Figure 31A:
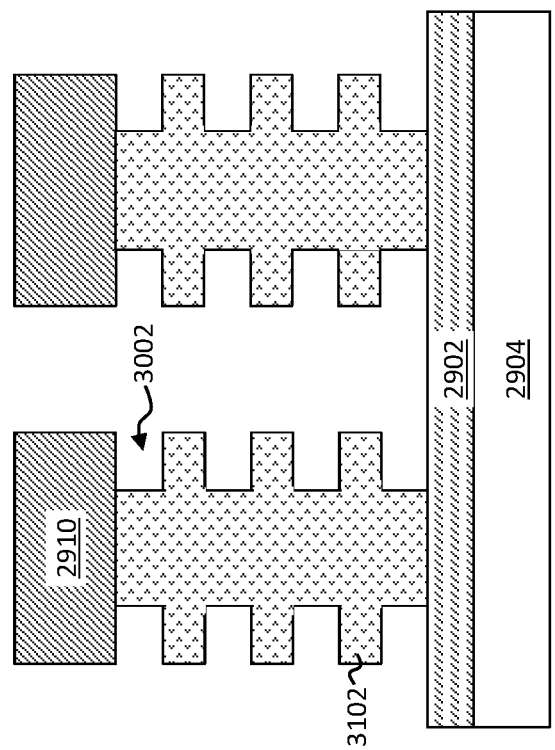
FIG. 31A depicts a cross-sectional view of the X-FET semiconductor structure after processing operations according to one or more embodiments of the invention.

FIGS. 31A and 31B depict cross-sectional views of the "X-FET" type semiconductor structure 2900 during an intermediate operation of a method of fabricating a semiconductor device according to one or more embodiments of the invention. As depicted in FIGS. 31A and 31B, the semiconductor structure 2900 is subjected to an annealing process whereby the germanium in the second semiconductor layers 2908 diffuses uniformly throughout the first semiconductor layers 2906 and the second semiconductor layers 2908.

The resulting semiconductor layers 3102 include silicon germanium having a germanium concentration that is between 0 and the pre-anneal germanium concentration of the second semiconductor layers 2908. For example, if the second semiconductor layers 2908 was SiGe20% (e.g., 20% Ge), the final germanium concentration in the semiconductor layers 3102 will be less than 20%. In some embodiments of the invention, the semiconductor structure 2900 can be annealed at a temperature of about 950 to 1150 degrees Celsius.

In some embodiments of the invention, the "X-FET" type semiconductor structure 2900 can be substantially completed in a similar manner as the "X-FET" type semiconductor structure 200 depicted in FIGS. 2A-15B. The "X-FET" type semiconductor structure 2900 can include a conductive gate, a gate SAC Cap, S/D regions, inner spacers, gate spacers, a dielectric layer, and contacts (not depicted). Each of these features can be made of a similar material and by a substantially similar method as the corresponding feature in the "X-FET" type semiconductor structure 200 depicted in FIGS. 2A-15B.

FIGS. 32A-35B depict cross-sectional views of a "junction-less X-FET" type semiconductor structure 3200 during an intermediate operation of a method of fabricating a semiconductor device according to one or more embodiments of the invention. As depicted in FIGS. 32A and 32B, a partially fabricated semiconductor device can include a BOX layer 3202 formed over a substrate 3204. The BOX layer 3202 and the substrate 3204 can be made of a same material and in a similar manner as the BOX layer 2902 and the substrate 2904, respectively, as depicted in FIG. 29A.

In some embodiments of the invention, a stack of one or more first semiconductor layers 3206 alternating with one or more second semiconductor layers 3208 is formed over the BOX layer 3202. While depicted as a stack having three first semiconductor layers 3206 alternating with four second semiconductor layers 3208 for ease of illustration, it is understood that the stack can include any number of first semiconductor layers alternating with a corresponding number of second semiconductor layers. In some embodiments of the invention, the first semiconductor layers 3206 are made of silicon while the second semiconductor layers 3208 are made of doped silicon, such as, for example, boron-doped silicon.

The second semiconductor layers 3208 can be doped using in-situ doped epitaxy, doped following the epitaxy, or by implantation and plasma doping. In some embodiments of the invention, the first semiconductor layers 3206 and the second semiconductor layers 3208 are formed using an epitaxy process whereby each layer is successively epitaxially grown on the preceding layer.

Each of the first semiconductor layers 3206 can have a height ranging from 4 nm to 12 nm, for example, from 7 nm to 10 nm. In some embodiments of the invention, the first semiconductor layers 3206 have a height of about 8 nm. Each of the second semiconductor layers 3208 can have a height ranging from 6 nm to 40 nm, for example, from 8 nm to 20 nm. In some embodiments of the invention, each of the second semiconductor layers 3208 has a same height as the first semiconductor layers 3206. In some embodiments of the invention, the second semiconductor layers 3208 include a boron dopant concentration ranging from $10^{13}$ cm$^{-3}$ to $10^{18}$ cm$^{-3}$, although other boron dopant concentrations are within the contemplated scope of the invention.

In some embodiments of the invention, a hard mask 3210 can be formed on the topmost layer of the second semiconductor layers 3208. In some embodiments of the invention, the hard mask 3210 includes a nitride, such as silicon nitride. In some embodiments of the invention, the hard mask 3210 is formed to a thickness of 40 nm, although other thicknesses are within the contemplated scope of the invention. In some embodiments of the invention, a second hard mask (not depicted) can be formed on the hard mask 3210, to form a bilayer hard mask. In some embodiments of the invention, the second hard mask includes an oxide, such as, for example, silicon dioxide.

In some embodiments of the invention, portions of the hard mask 3210 are removed (e.g., patterned) and the stack of first semiconductor layers 3206 and second semiconductor layers 3208 is patterned selective to the hard mask 3210. Portions of the first semiconductor layers 3206 and the second semiconductor layers 3208 that are not covered by the patterned hard mask 3210 can be removed using a wet etch, a dry etch, or a combination of sequential wet and/or dry etches.

FIGS. 33A and 33B depict cross-sectional views of the "junction-less X-FET" type semiconductor structure 3200 during an intermediate operation of a method of fabricating a semiconductor device according to one or more embodiments of the invention. As depicted in FIGS. 33A and 33B, the second semiconductor layers 3208 are recessed to form one or more recesses 3302.

In some embodiments of the invention, the second semiconductor layers 3208 are recessed selective to the first semiconductor layers 3206. The second semiconductor layers 3208 can be recessed using any suitable process capable of removing a doped silicon layer (e.g., a boron-doped silicon) selective to a silicon layer. Example processes known to provide this etch selectivity include ammonia-based chemistries and tetramethylammonium hydroxide (TMAH or TMAOH) etches.

FIGS. 34A and 34B depict cross-sectional views of the "junction-less X-FET" type semiconductor structure 3200 during an intermediate operation of a method of fabricating a semiconductor device according to one or more embodiments of the invention. As depicted in FIGS. 34A and 34B, the semiconductor structure 3200 is subjected to an annealing process whereby the dopants (e.g., boron) in the second semiconductor layers 3208 diffuse uniformly throughout the first semiconductor layers 3206 and the second semiconductor layers 3208.

The resulting semiconductor layers 3402 include doped silicon having a dopant concentration that is between 0 and the pre-anneal dopant concentration of the second semiconductor layers 3208. For example, if the second semiconductor layers 2908 was boron doped silicon having a boron concentration of $10^{15}$ cm$^{-3}$, the final boron dopant concentration in the semiconductor layers 3402 will be less than $10^{15}$ cm$^{-3}$. In some embodiments of the invention, the semiconductor structure 3200 can be annealed at a temperature of about 950 to 1150 degrees Celsius. At this point, the semiconductor structure 3200 is a junction-less device (sometimes referred to as a junction-free device).

FIGS. 35A and 35B depict cross-sectional views of the "junction-less X-FET" type semiconductor structure 3200 during an intermediate operation of a method of fabricating a semiconductor device according to one or more embodiments of the invention. As depicted in FIGS. 35A and 35B, the intrinsic silicon channels in the semiconductor structure 3200 can be recovered if a junction-less device is not desired. In some embodiments of the invention, the semiconductor structure 3200 is subjected to a hydrogen treatment to pump out the dopants (e.g., boron) within the semiconductor layers 3402.

In some embodiments of the invention, several "junction-less X-FET" type semiconductor structure are formed, and only a subset of those structures are subjected to the hydrogen treatment (using, e.g., masking or other isolation techniques). In this manner, some "junction-less X-FET" type semiconductor structures can be formed along side conventional semiconductor structures having active junctions.

In some embodiments of the invention, the "junction-less X-FET" type semiconductor structure 3200 (or conventional structure following a hydrogen treatment) can be substantially completed in a similar manner as the "X-FET" type semiconductor structure 200 depicted in FIGS. 2A-15B. The "junction-less X-FET" type semiconductor structure 3200 can include a conductive gate, a SAC cap, S/D regions, inner spacers, gate spacers, a dielectric layer, and contacts (not depicted). Each of these features can be made of a similar material and by a substantially similar method as the corresponding feature in the "X-FET" type semiconductor structure 200 depicted in FIGS. 2A-15B.

Figure 36:
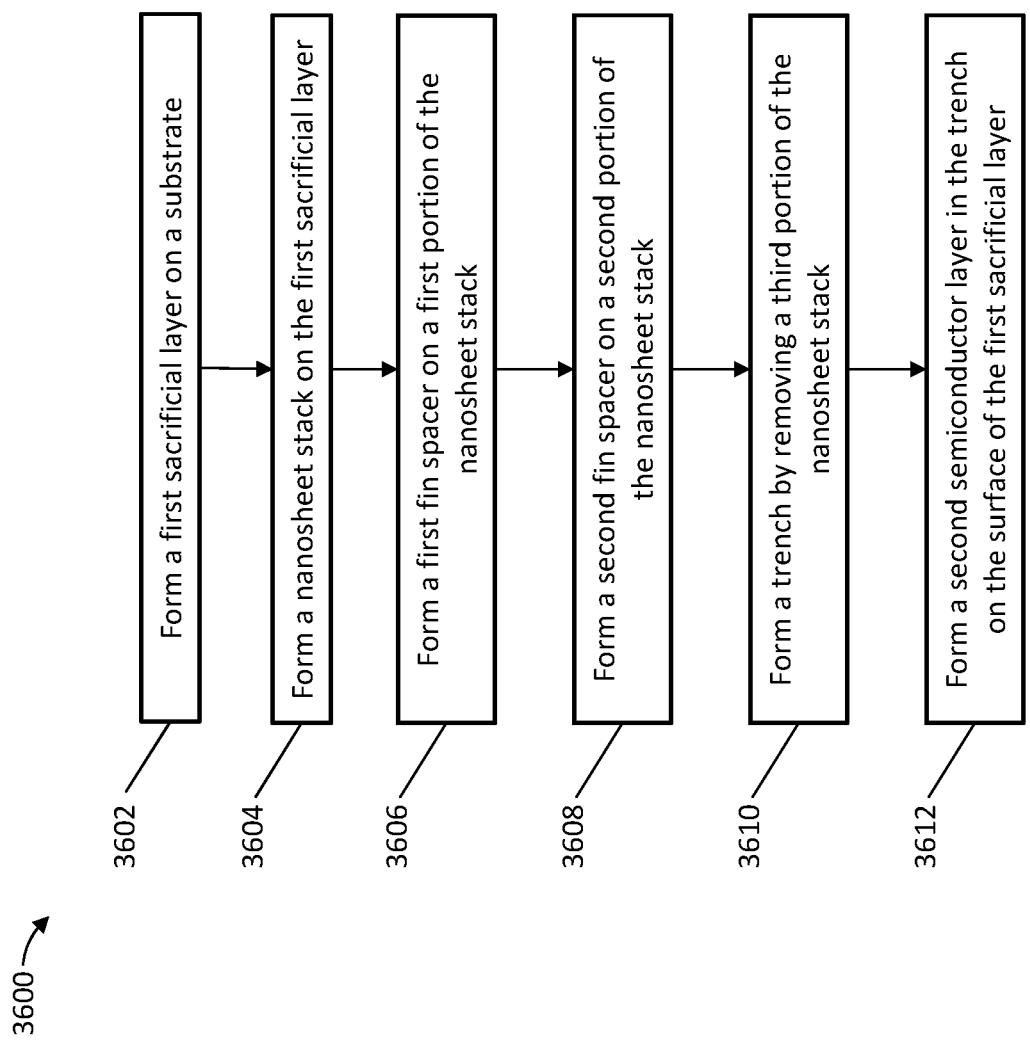
FIG. 36 depicts a flow diagram illustrating a method according to one or more embodiments of the invention.

FIG. 36 depicts a flow diagram 3600 illustrating a method for forming a semiconductor device according to one or more embodiments of the invention. The semiconductor device can include a non-planar channel region having a first semiconductor layer, a second semiconductor layer, and a fin-shaped bridge layer between the first semiconductor layer and the second semiconductor layer (e.g., as depicted in FIGS. 15A and 15B). Outer surfaces of the first semiconductor layer, the second semiconductor layer, and the fin-shaped bridge region define an effective channel width of the non-planar channel region. In some embodiments of the invention, a width of the first semiconductor layer is greater than a width of the fin-shaped bridge region. In some embodiments of the invention, a width of the second semiconductor layer is greater than a width of the fin-shaped bridge region. In some embodiments of the invention, a width of the first semiconductor layer is the same as a width of the second semiconductor layer.

As shown at block 3602, a first sacrificial layer is formed on a substrate. As shown at block 3604, a nanosheet stack is formed on the first sacrificial layer. The nanosheet stack includes a first semiconductor layer and a second sacrificial layer.

At block 3606 a first fin spacer is formed on a first portion of the nanosheet stack. At block 3608 a second fin spacer is formed on a second portion of the nanosheet stack. As shown at block 3610, a trench is formed by removing a third portion of the nanosheet stack. The trench exposes a surface of the first sacrificial layer. At block 3612 a second semiconductor layer is formed in the trench on the surface of the first sacrificial layer.

Figure 37:
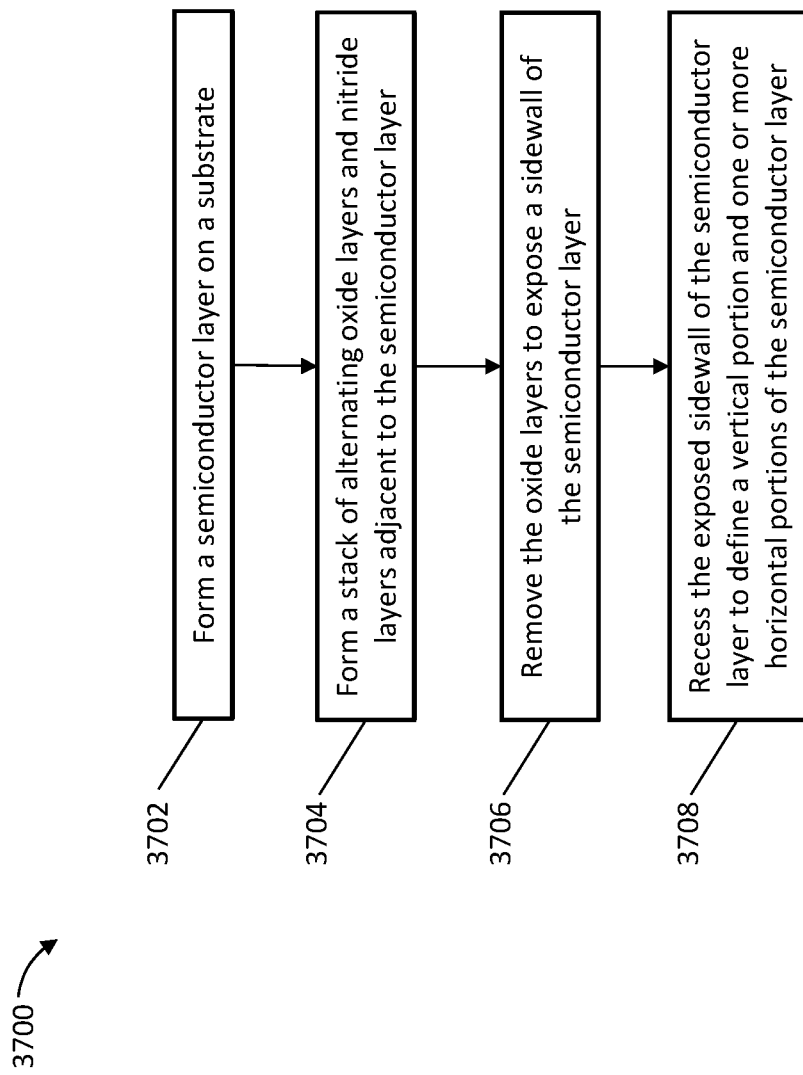
FIG. 37 depicts a flow diagram illustrating a method according to one or more embodiments of the invention.

FIG. 37 depicts a flow diagram 3700 illustrating a method for forming a semiconductor device according to one or more embodiments of the invention. As shown at block 3702, a semiconductor layer is formed on a substrate. At block 3704 a stack of alternating oxide layers and nitride layers are formed adjacent to the semiconductor layer.

As shown at block 3706, the oxide layers are removed to expose a sidewall of the semiconductor layer. At block 3708 the exposed sidewall of the semiconductor layer is recessed to define a vertical portion and one or more horizontal portions of the semiconductor layer.

Figure 38:
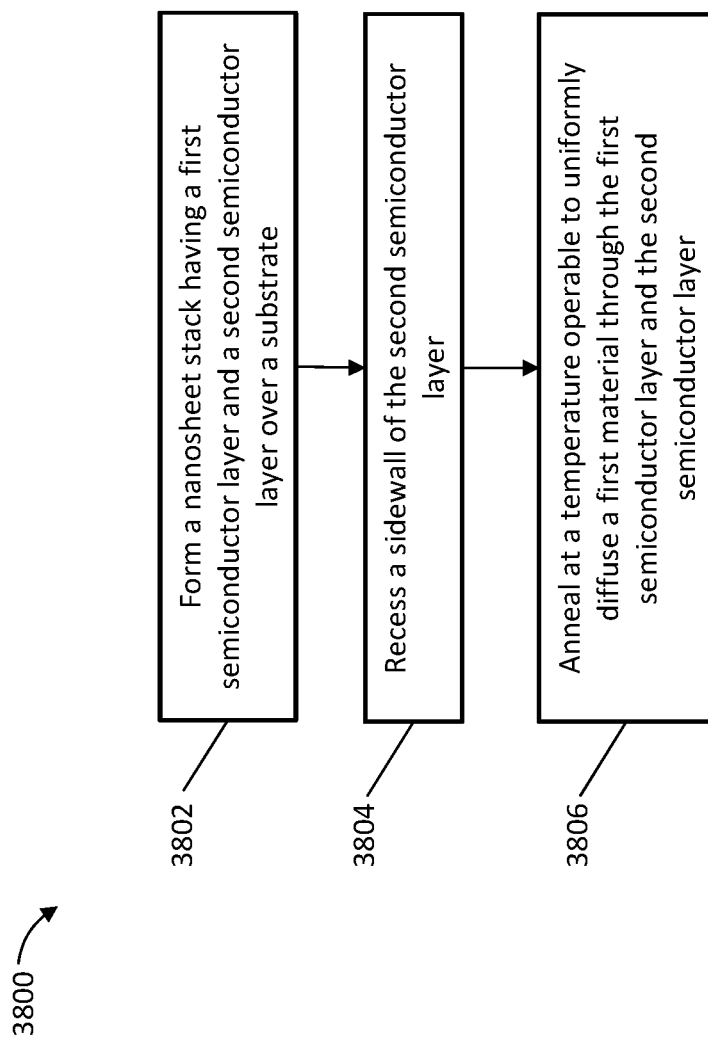
FIG. 38 depicts a flow diagram illustrating a method according to one or more embodiments of the invention.

FIG. 38 depicts a flow diagram 3800 illustrating a method for forming a semiconductor device according to one or more embodiments of the invention. As shown at block 3802, a nanosheet stack is formed over a substrate. The nanosheet stack includes a first semiconductor layer and a second semiconductor layer. The second semiconductor layer includes a first material.

At block 3804 a sidewall of the second semiconductor layer is recessed. At block 3806 the structure is annealed at a temperature operable to uniformly diffuse the first material through the first semiconductor layer and the second semiconductor layer.

Figure 39:
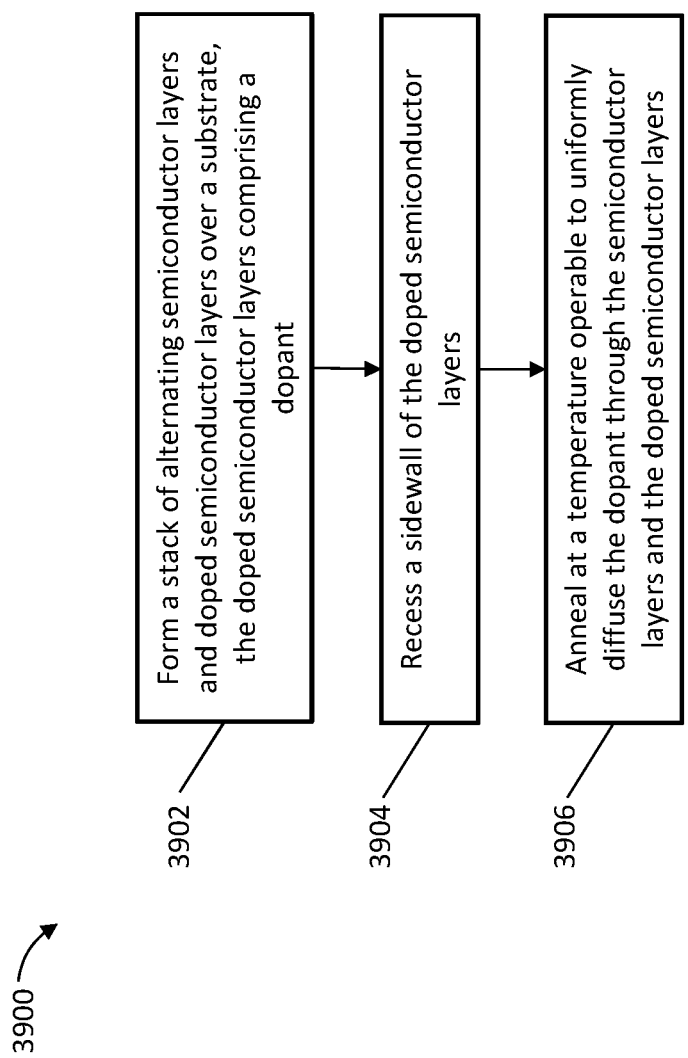
FIG. 39 depicts a flow diagram illustrating a method according to one or more embodiments of the invention.

FIG. 39 depicts a flow diagram 3900 illustrating a method for forming a semiconductor device according to one or more embodiments of the invention. As shown at block 3902, a stack of alternating semiconductor layers and doped semiconductor layers is formed over a substrate. The doped semiconductor layers include a dopant.

As shown in block 3904, a sidewall of the doped semiconductor layers is recessed. At block 3906 the structure is annealed at a temperature operable to uniformly diffuse the dopant through the semiconductor layers and the doped semiconductor layers.

Figure 40:
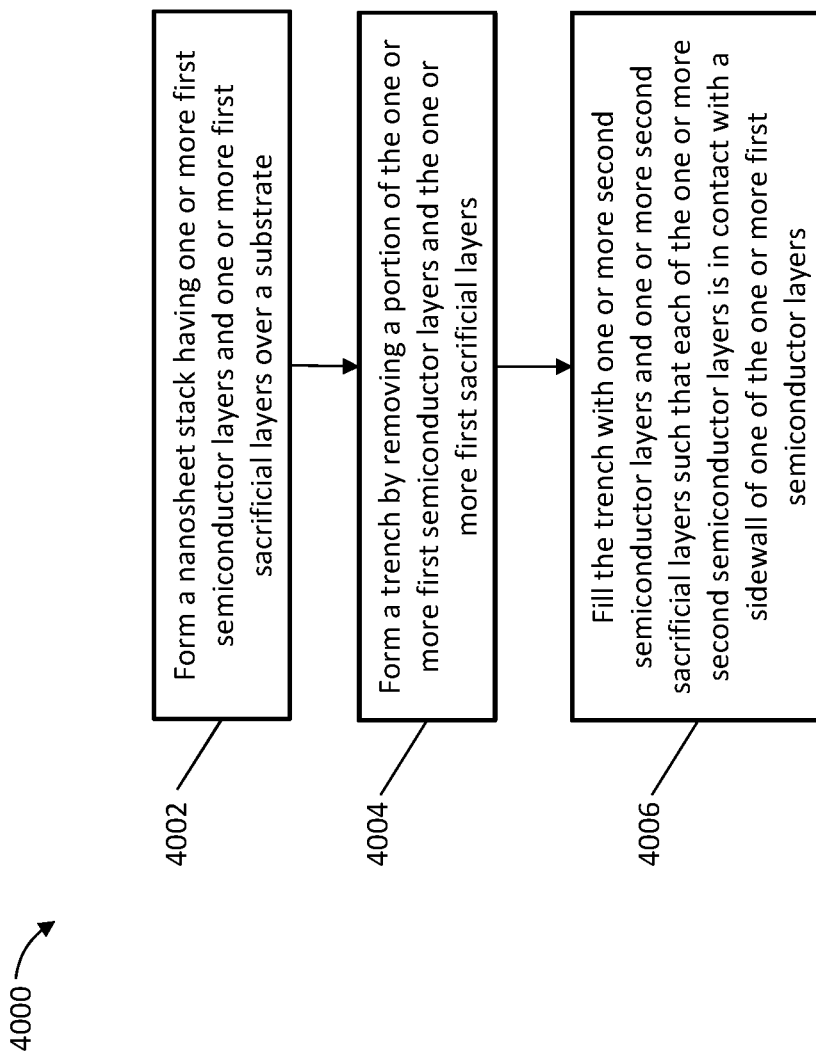
FIG. 40 depicts a flow diagram illustrating a method according to one or more embodiments of the invention.

FIG. 40 depicts a flow diagram 4000 illustrating a method for forming a semiconductor device according to one or more embodiments of the invention. As shown at block 4002, a nanosheet stack is formed over a substrate. The nanosheet stack includes one or more first semiconductor layers and one or more first sacrificial layers.

As shown in block 4004, a trench is formed by removing a portion of the one or more first semiconductor layers and the one or more first sacrificial layers. The trench exposes a surface of a bottommost sacrificial layer of the one or more first sacrificial layers. At block 4006 the trench is filled with one or more second semiconductor layers and one or more second sacrificial layers such that each of the one or more second semiconductor layers is in contact with a sidewall of one of the one or more first semiconductor layers.

Figure 41:
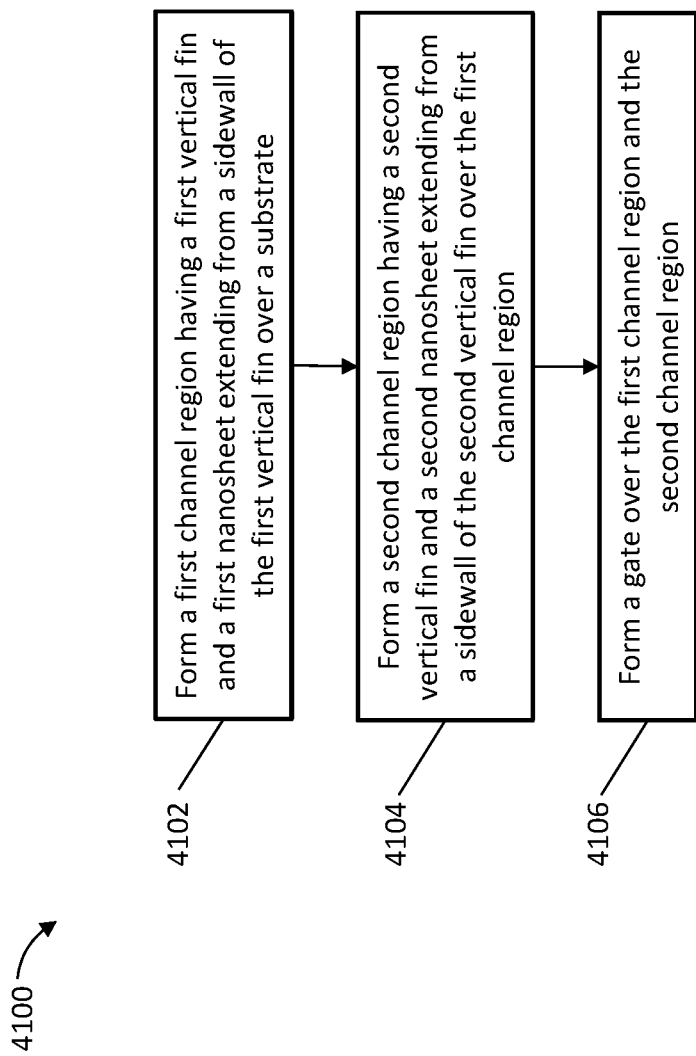
FIG. 41 depicts a flow diagram illustrating a method according to one or more embodiments of the invention.

FIG. 41 depicts a flow diagram 4100 illustrating a method for forming a semiconductor device according to one or more embodiments of the invention. As shown at block 4102, a first channel region is formed over a substrate. The first channel region includes a first vertical fin and a first nanosheet extending from a sidewall of the first vertical fin.

As shown in block 4104, a second channel region is formed over the first channel region. The second channel region includes a second vertical fin and a second nanosheet extending from a sidewall of the second vertical fin. At block 4106 a gate is formed over the first channel region and the second channel region. The gate in contact with a topmost surface of the first channel region and a bottommost surface of the second channel region.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention have been provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a stack of alternating semiconductor layers and doped semiconductor layers over a substrate, the doped semiconductor layers comprising a dopant;
    recessing a sidewall of the doped semiconductor layers;
    annealing at a temperature operable to uniformly diffuse the dopant through the semiconductor layers and the doped semiconductor layers; and
    removing the dopant from the semiconductor layers and the doped semiconductor layers.

2. The method of claim 1, wherein removing the dopant comprises a hydrogen treatment.

3. The method of claim 1, wherein the dopant comprises boron.

4. The method of claim 1 further comprising forming a gate over the semiconductor layers and the doped semiconductor layers.

* * * * *